(12) United States Patent
Akiyama et al.

(10) Patent No.: US 7,683,419 B2
(45) Date of Patent: Mar. 23, 2010

(54) SEMICONDUCTOR DEVICE HAVING PLURAL DRAM MEMORY CELLS AND A LOGIC CIRCUIT AND METHOD FOR MANUFACTURING THE SAME

(75) Inventors: Satoru Akiyama, Kokubunji (JP); Takao Watanabe, Fuchu (JP); Yuichi Matsui, Koganei (JP); Masahiko Hiratani, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 34 days.

(21) Appl. No.: 12/213,920

(22) Filed: Jun. 26, 2008

(65) Prior Publication Data
US 2008/0265300 A1    Oct. 30, 2008

Related U.S. Application Data

(62) Division of application No. 10/488,401, filed on Jun. 24, 2004, now Pat. No. 7,408,218.

(51) Int. Cl.
*H01L 29/78* (2006.01)
(52) U.S. Cl. ............................ 257/311; 257/E21.662
(58) Field of Classification Search ................. 257/295, 257/296, 300, 310–311, 758, E21.662
See application file for complete search history.

(56) References Cited

U.S. PATENT DOCUMENTS

| | | | |
|---|---|---|---|
| 4,103,342 A | 7/1978 | Miersch et al. | |
| 4,888,733 A | 12/1989 | Mobley | |
| 5,184,324 A | 2/1993 | Ohta | |
| 5,219,779 A | 6/1993 | Suzuki | |
| 5,293,563 A | 3/1994 | Ohta | |
| 5,329,479 A | 7/1994 | Ota et al. | |
| 5,357,460 A | 10/1994 | Yusuki et al. | |
| 5,571,743 A | 11/1996 | Henkels et al. | |
| 5,751,628 A | 5/1998 | Hirano et al. | |

(Continued)

FOREIGN PATENT DOCUMENTS

JP        5294784      8/1977

(Continued)

OTHER PUBLICATIONS

IEEE Spectrum, Apr. 1999.

(Continued)

*Primary Examiner*—Nathan W Ha
(74) *Attorney, Agent, or Firm*—Mattingly & Malur, P.C.

(57) ABSTRACT

A memory cell capacitor (C3) of a DRAM is formed by use of a MIM capacitor which uses as its electrode a metal wiring line of the same layer (M3) as metal wiring lines within a logic circuit (LOGIC), thereby enabling reduction of process costs. Higher integration is achievable by forming the capacitor using a high dielectric constant material and disposing it above a wiring layer in which bit lines (BL) are formed. In addition, using 2T cells makes it possible to provide a sufficient signal amount even when letting them operate with a low voltage. By commonizing the processes for fabricating capacitors in analog (ANALOG) and memory (MEM), it is possible to realize a semiconductor integrated circuit with the logic, analog and memory mounted together on one chip at low costs.

7 Claims, 41 Drawing Sheets

U.S. PATENT DOCUMENTS

| | | | |
|---|---|---|---|
| 6,075,720 | A | 6/2000 | Leung et al. |
| 6,150,689 | A | 11/2000 | Narui et al. |
| 6,154,387 | A | 11/2000 | Takata |
| 6,353,269 | B1 | 3/2002 | Huang |
| 6,483,737 | B2 | 11/2002 | Takeuchi et al. |
| 6,529,397 | B2 | 3/2003 | Takeda et al. |
| 6,603,203 | B2 | 8/2003 | Amanuma |
| 6,674,633 | B2 | 1/2004 | Sun et al. |
| 6,759,720 | B2 | 7/2004 | Shinkawata |
| 6,794,694 | B2 | 9/2004 | Diodato et al. |
| 6,982,444 | B2 * | 1/2006 | Kanaya et al. ............... 257/295 |
| 7,187,027 | B2 * | 3/2007 | Kohyama et al. ........... 257/306 |
| 2001/0003665 | A1 | 6/2001 | Kim |
| 2001/0032993 | A1 | 10/2001 | Tsugane et al. |
| 2002/0079522 | A1 * | 6/2002 | Diodato et al. ............... 257/296 |
| 2002/0149049 | A1 * | 10/2002 | Okuda ........................ 257/306 |
| 2003/0155621 | A1 * | 8/2003 | Moriwaki et al. ........... 257/412 |
| 2004/0232497 | A1 | 11/2004 | Akiyama et al. |

FOREIGN PATENT DOCUMENTS

| | | |
|---|---|---|
| JP | 5291534 | 11/1993 |
| JP | 11251547 | 9/1999 |
| JP | 2001338990 | 12/2001 |
| JP | 2003264236 | 9/2003 |
| WO | 9715950 | 5/1997 |

OTHER PUBLICATIONS

IEEE VLSI Technology Short Course, 1999.
JSSC, 1989, pp. 1206-1212.
IBM Technical Disclosure, 1977, vol. 20, No. 7.

* cited by examiner

| | | |
|---|---|---|
| ☐ LN | ▨ M1 | ⊠ V2 |
| ▨ FG | ⊠ V1 | ⊡ M3 |
| ▨ V0 | ☐ M2 | ☐ P0 |

FIG.10A
FIG.10B
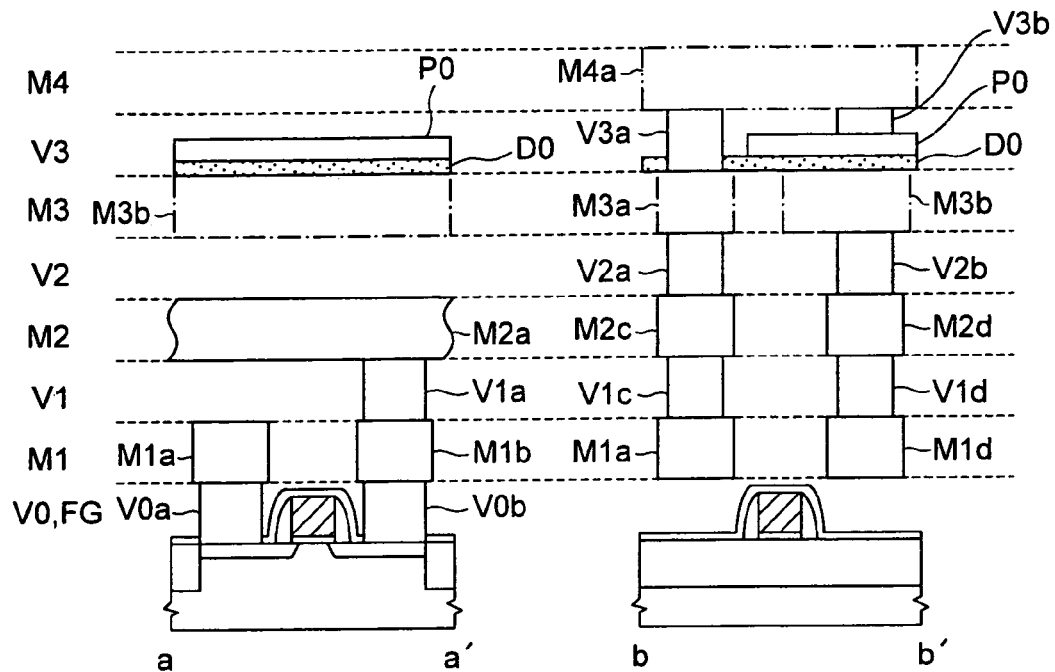
FIG.10C
FIG.10D
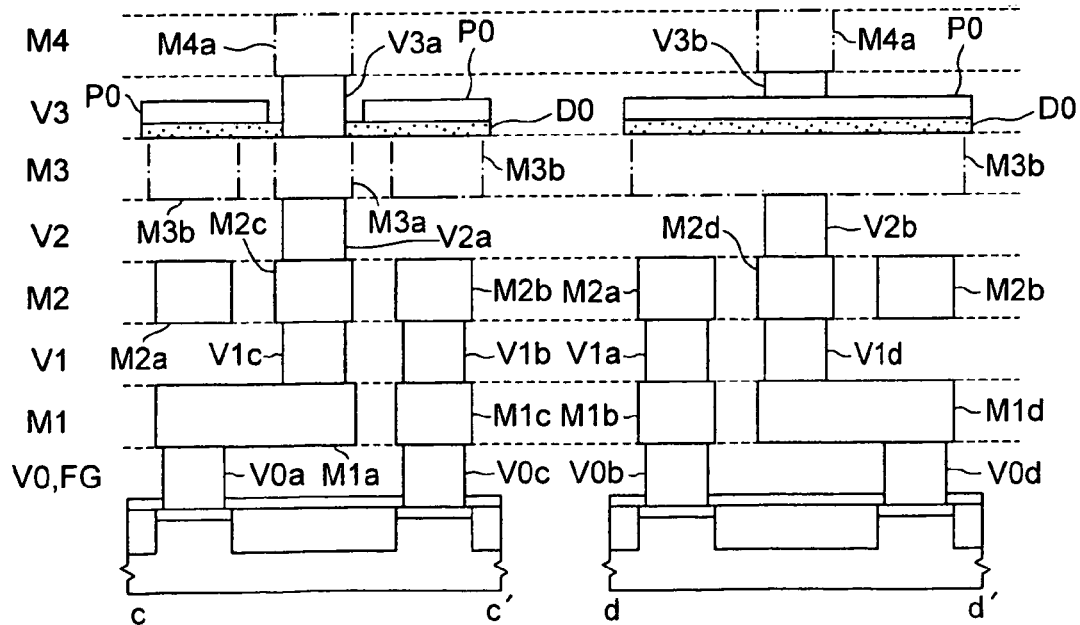

FIG.12A
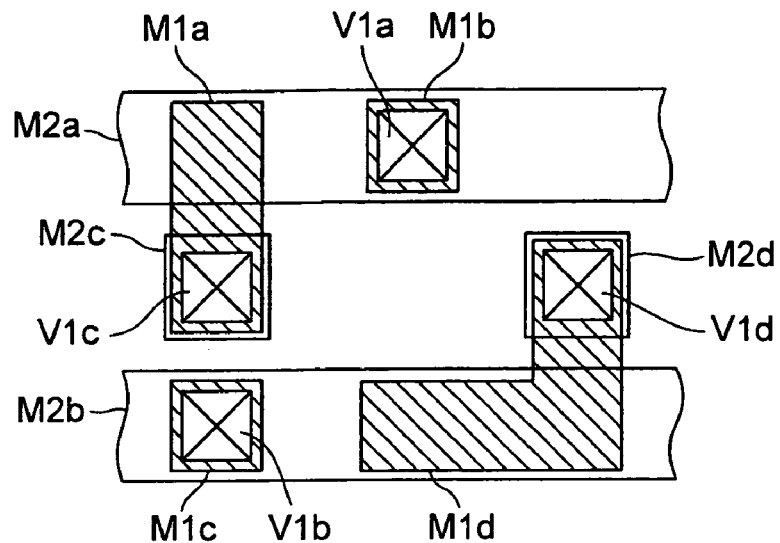
FIG.12B
FIG.12C
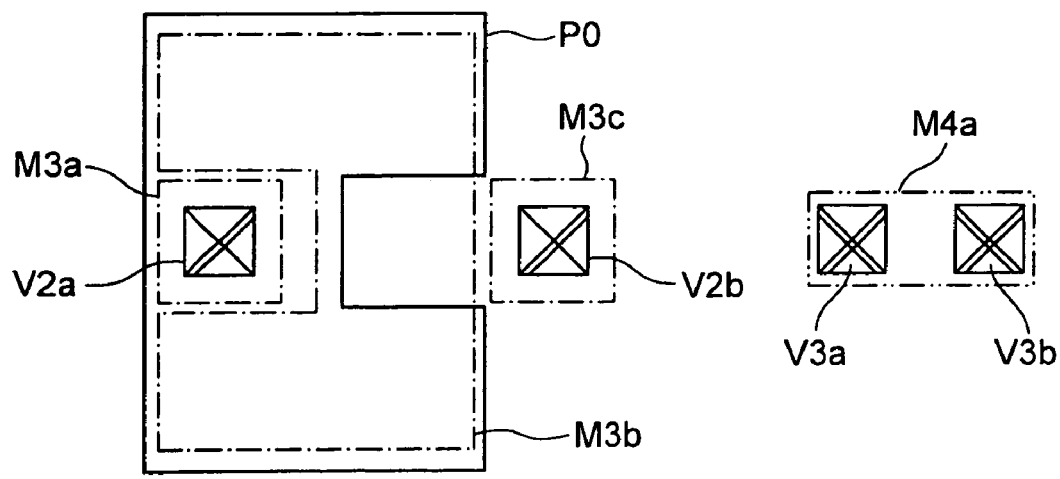
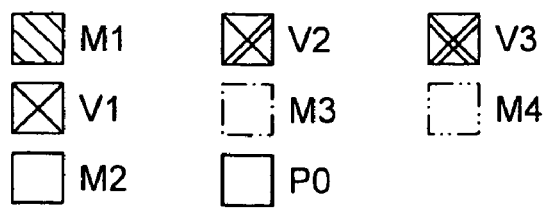

FIG.13A
FIG.13B
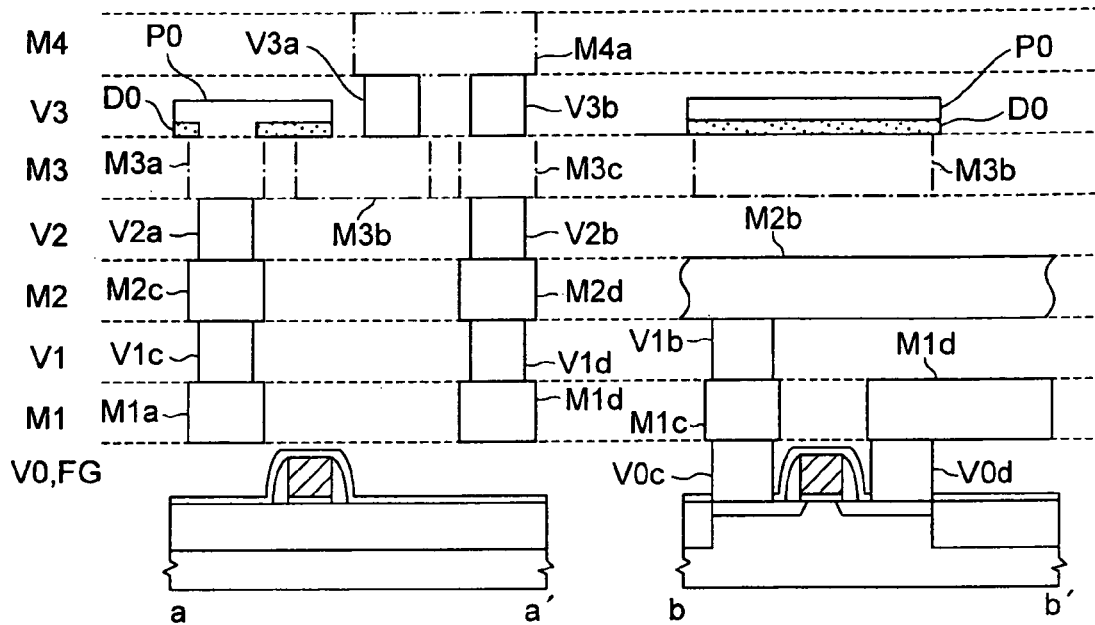
FIG.13C
FIG.13D
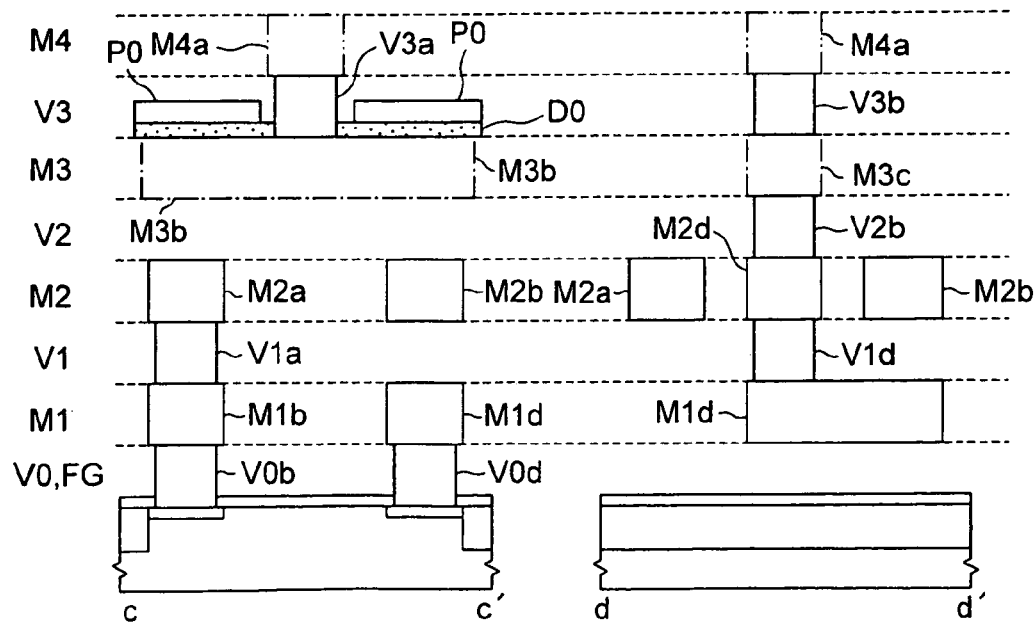

LN  M1  V2

FG  V1  M3

V0  M2  P0

FIG.24A FIG.24B
FIG.24C
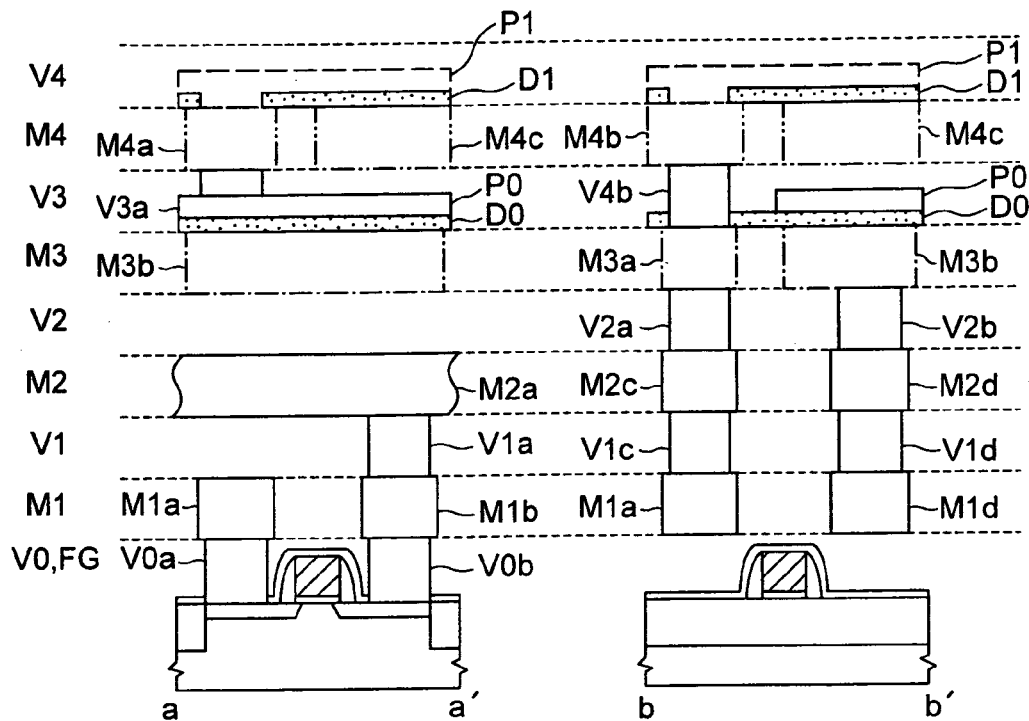
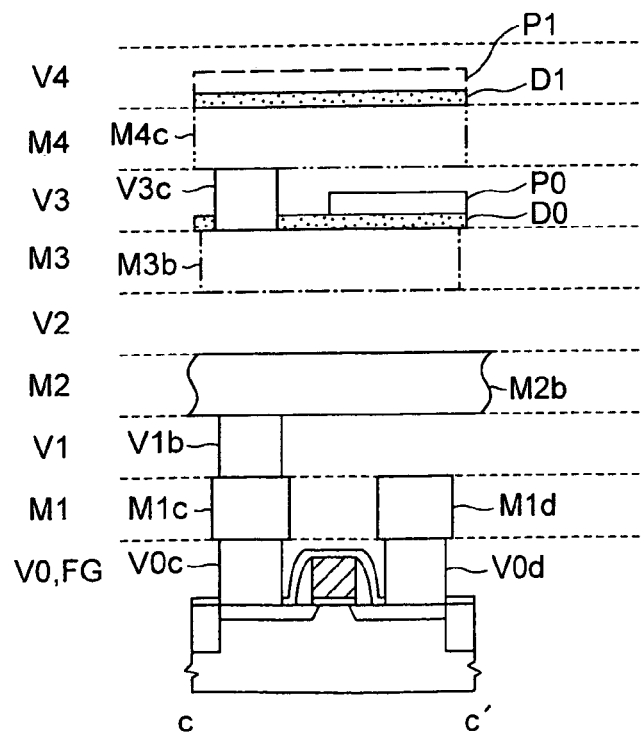

FIG.28A  FIG.28B
FIG.28C  FIG.28D
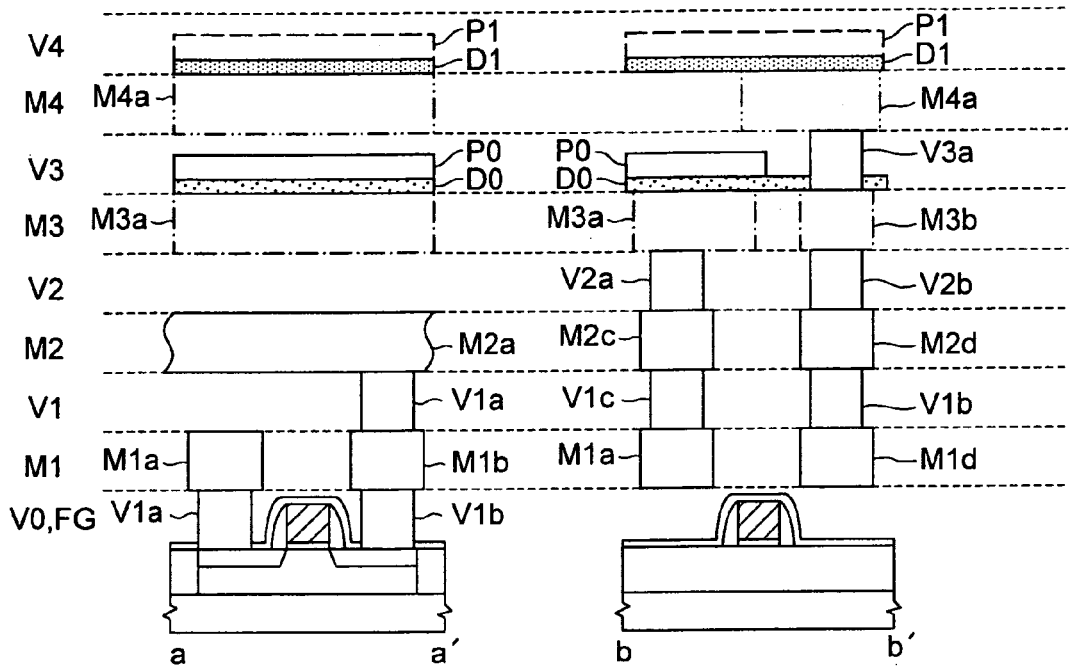
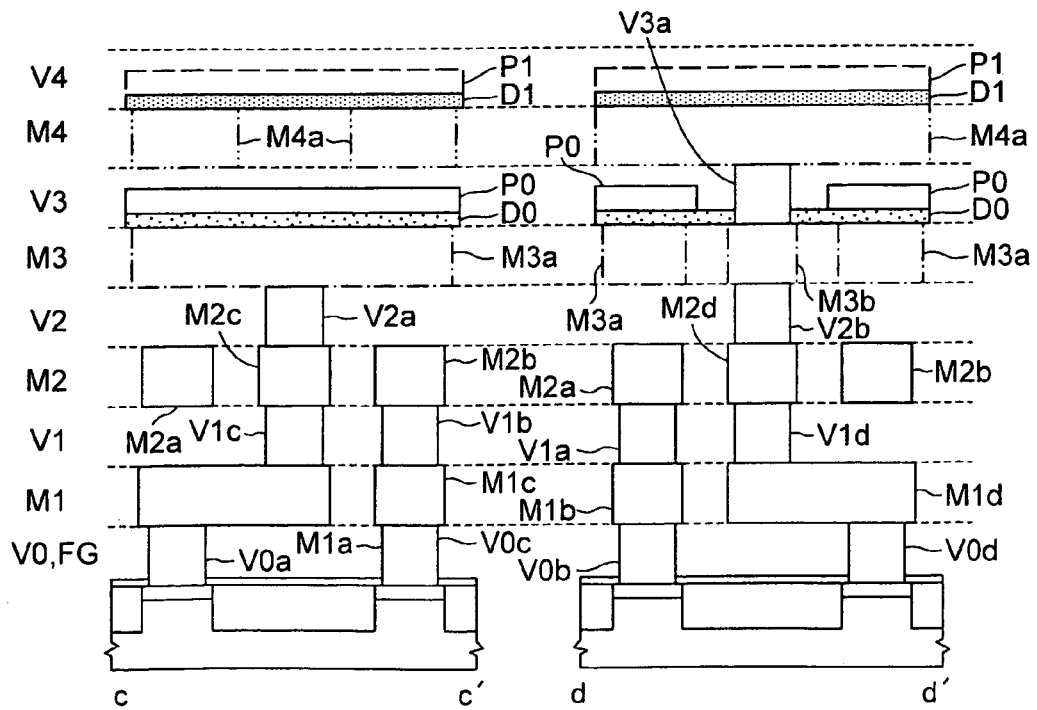

FIG.37A
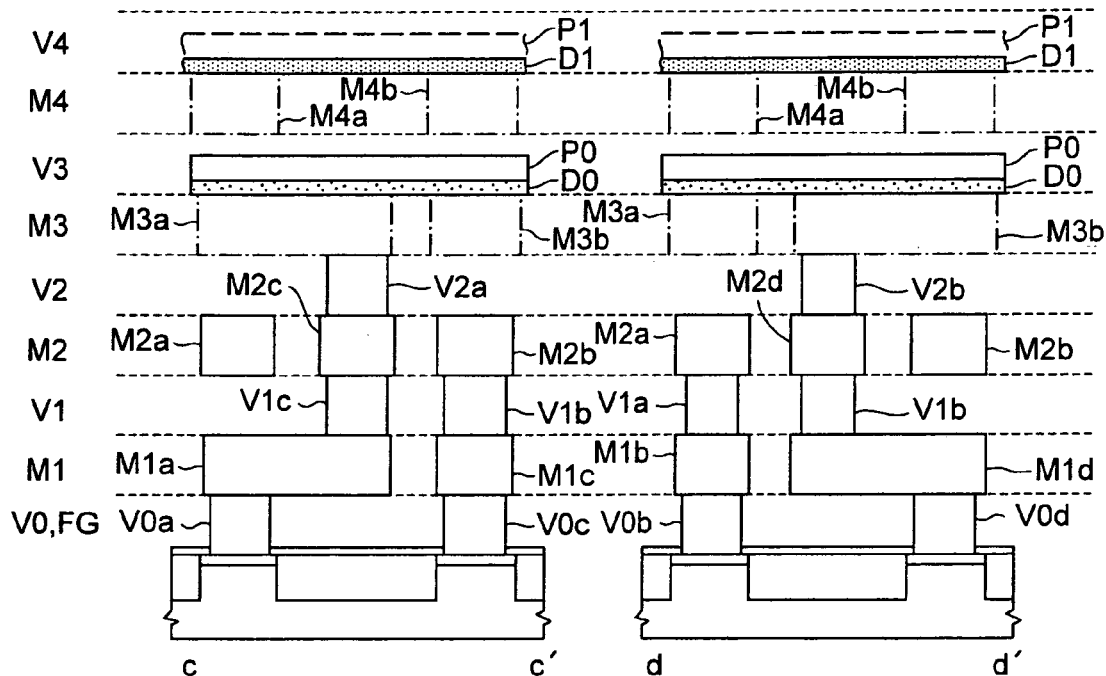
FIG.37B
FIG.37C
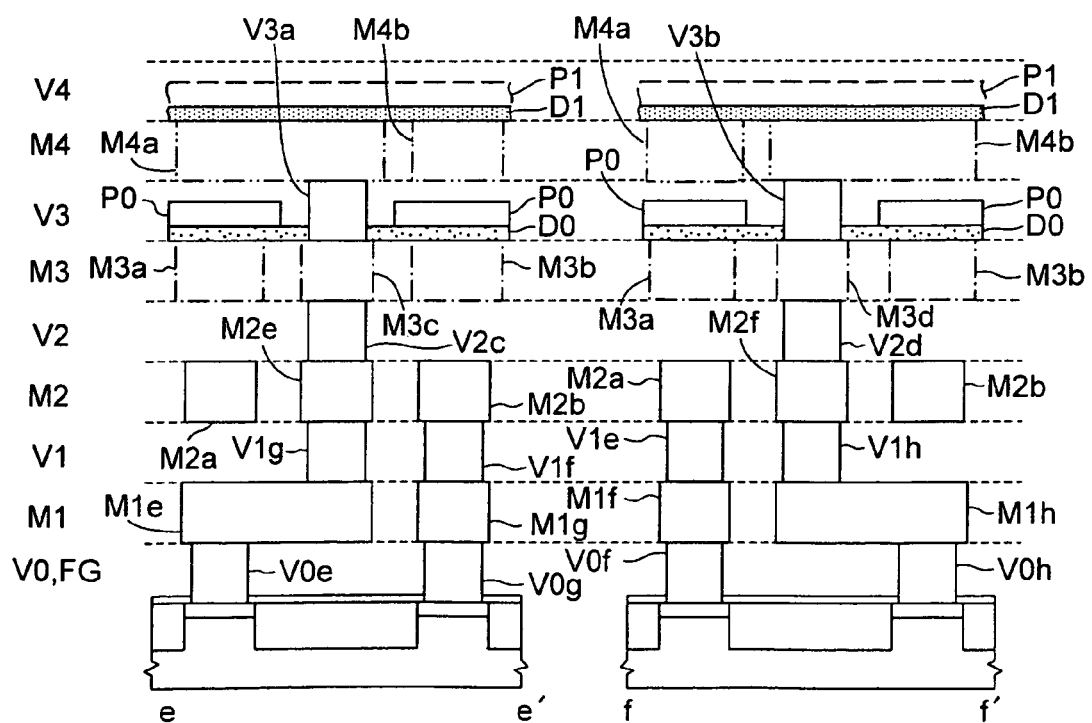
FIG.37D

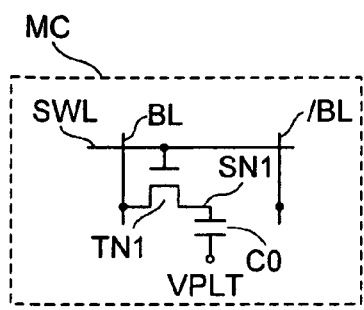
FIG.40A
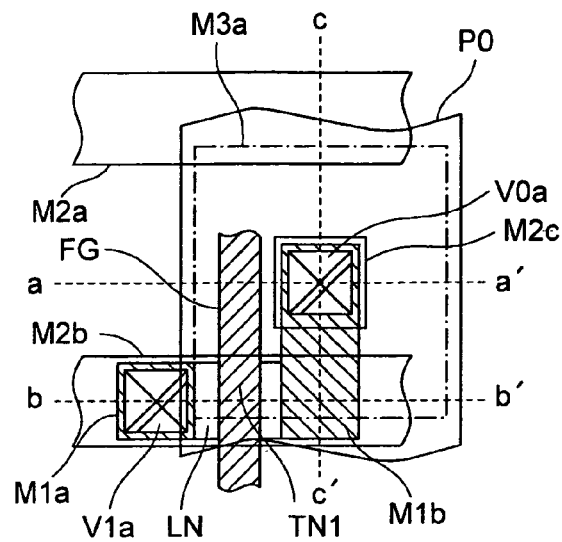
FIG.40B
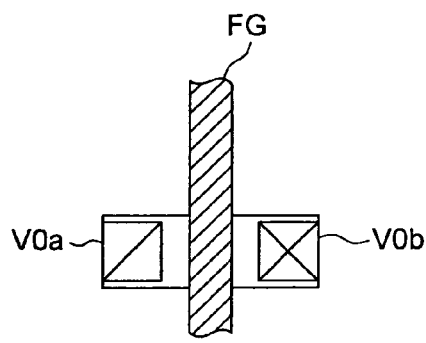
FIG.40C
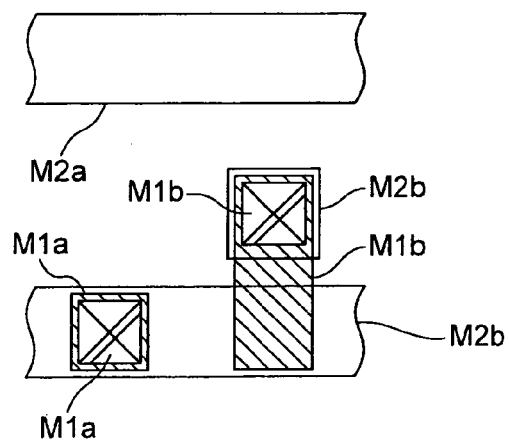
FIG.40D
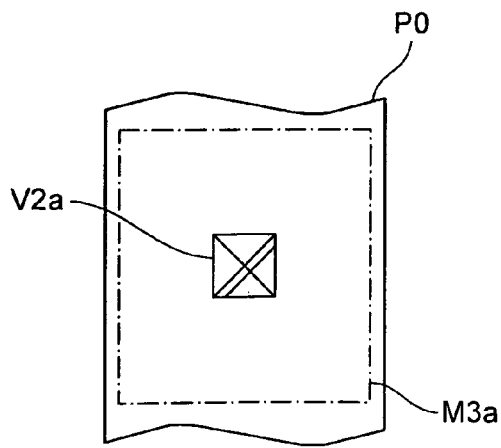
FIG.40E
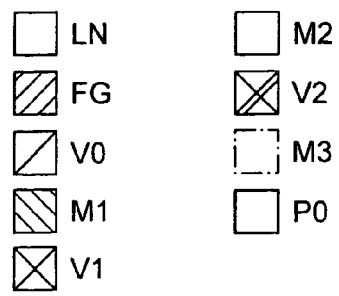

FIG.41A
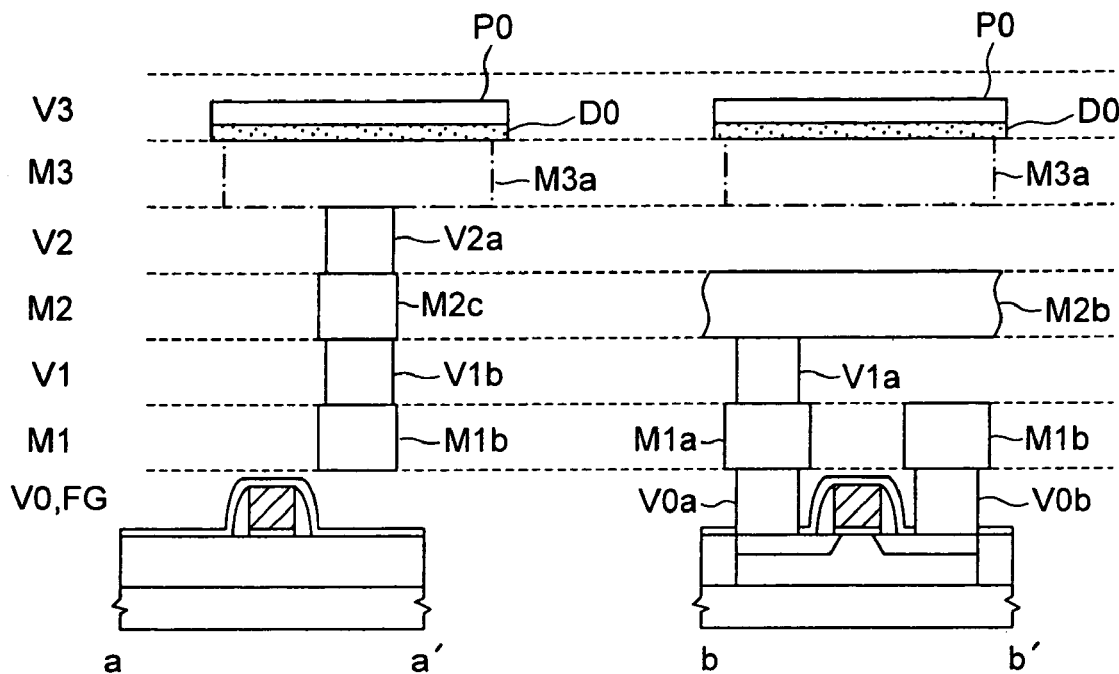
FIG.41B
FIG.41C
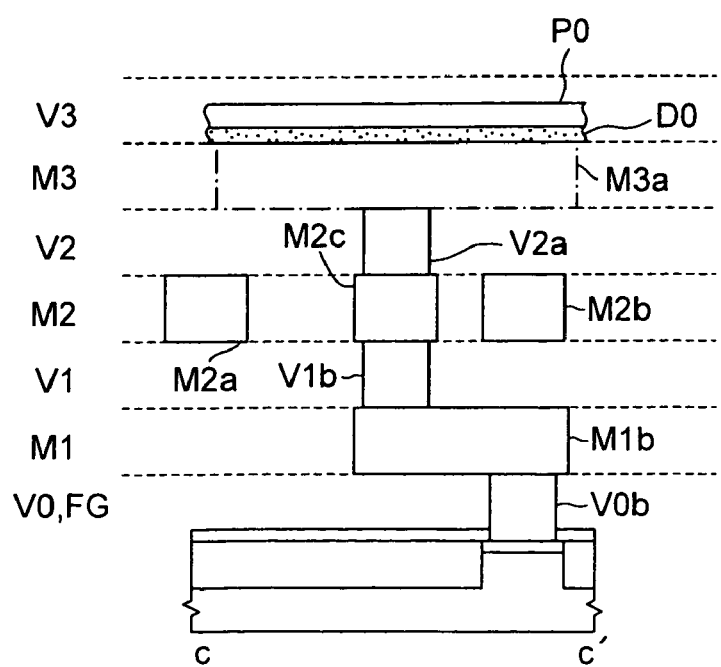

SEMICONDUCTOR DEVICE HAVING PLURAL DRAM MEMORY CELLS AND A LOGIC CIRCUIT AND METHOD FOR MANUFACTURING THE SAME

The present application is a divisional application of application Ser. No. 10/488,401, filed Jun. 24, 2004, now U.S. Pat. No. 7,408,218, the contents of which are incorporated herein by reference.

TECHNICAL FIELD

The present invention relates to a semiconductor device and a manufacturing method thereof. In particular, the invention relates to a semiconductor device preferably adaptable for use in applications under high speed, high integration, and low power requirements.

BACKGROUND ART

The quest for higher functionality and higher performance is growing rapidly in a variety of types of information equipment including, but not limited to, mobile tools such as cellular phones, multimedia instruments such as game machines, personal computers or equivalents thereto. Under such circumstances, integrated circuits (referred to as LSI hereinafter) making up these apparatuses are more strictly required to offer higher performances in near feature, in terms of high integration, high-speed operability, low power and low cost.

It is the on-chip memory that attracts attention as one of the techniques for fulfilling this requirement. The on-chip memory as used herein refers to a memory device (simply called the memory hereafter) which integrates its memory part together with a logic circuit on an LSI chip. When compared to the case where the memory is designed in the form of a single separate LSI chip, it has been known that the onchip memory offers advantages which follow: improvements in LSI mount density owing to a decrease in number of chips, and high-speed/low-power operability due to data transmission on an LSI chip.

Presently main current memory cells for the onchip memory use are static random access memory (abbreviated as SRAM hereinafter) cells. In the SRAM cells, a cell which is made up of six transistors (referred to hereafter as 6T cell) is used in most cases. Other known cells include a dynamic type memory cell consisting of one transistor and one capacitor (noted as 1T1C cell hereafter). Memory cells of this type involve several types of known ones different in capacitor structure. A representative one is a memory cell that utilizes a capacitor having a 3D structure. Known examples of this are the trench type with a capacitor formed in a silicon substrate and the stack type with a capacitor separated from a substrate and formed thereover. An example of the former is recited in FIG. 7 on page 61 of "SPECTRUM" issued by the IEEE-USA, April, 1999. An example of the latter is found in the collection of draft papers of "1999 VLSI Technology Short Course" issued by IEEE-USA, page 90, FIG. 30. Additionally, as a different example from them, an exemplary 1T1C memory cell using a planar MOS capacitor is recited in FIG. 3 of U.S. Pat. No. 6,075,720. Furthermore, cells other than the 6T and 1T1C cells are also known. For example, in JP-A-5-291534 and U.S. Pat. No. 5,357,460, a cell is described which utilizes two transistors and one or two capacitors (referred to as 2T1C cell, 2T2C cell hereinafter). In addition, JP-A-9-12070 discloses therein a ferroelectric memory device with the switchability of 1T1C and 2T2C cells.

The 6T cell is structured from transistors only so that there is an advantage that additional steps with respect to the process for fabricating logic transistors are less in number. However, the cell area is large so that the capacity of a memory mountable on one LSI chip is limited. In contrast, the 1T1C cell is less in area than the 6T cell. Especially in those cells of the stack type and the trench type using 3D structured capacitors, it is possible to realize areas of about ⅛ or less than that of 6T cell. However, this results in an increase in process steps for fabrication of 3D structured capacitors; thus, there is a disadvantage that the cost becomes higher.

In the 1T1C cell using a MOS capacitor which is one of the above-noted prior known examples, the problem as to an increase in process step is avoidable because it is possible to fabricate capacitors at the same step as that for forming logic transistors. Obviously, memory cell transistors and capacitors are laid out side by side, and the capacitor shape also is planar; thus, it is said that a highly integrated on-chip memory is realizable when compared to 6T cells, although this cell is less in integration than the stack and trench cells.

In prior art on-chip memories having more than one capacitor, these stay merely at a level of technology which simplifies the manufacturing procedure by separately performing processes of a memory unit and a logic circuit unit or by simultaneously performing any sharable processes. For example, in JP-A-11-251647, a trench capacitor is used, which is a process unique to DRAMs.

In the circumstances stated above, a first goal or issue to be attained by the present invention is to realize an on-chip memory having a capacitor which takes advantage of the CMOS process of logic circuitry to thereby provide an onchip memory which highly satisfies the conflicting requirements for process cost reduction and integration. Furthermore, a second issue is to enable achievement of a low-voltage operation with 1V or below in the above-noted onchip memory. In addition, a third issue is to realize an on-chip memory suitable also for co-integration with not only digital logic circuitry but also analog circuitry. The first issue is deemed problematical even at the present time as described in the explanation of the prior art. And, the second and third issues are the ones that are expected to become important in the near future. The second and third issues will be explained below.

As well known, the supply voltage of LSIs is potentially lowered per process generation for purposes of miniaturization of circuit elements and achievement of low power operability. In logic LSIs, products of 1.5V or less have already been available in the marketplace. The quest for lower voltage is expected to further advance from now on, which in turn requires the on-chip memory also to operate with 1V or lower voltages. This can be said because if the memory unit fails to offer low-voltage operability then it becomes a must to supply different voltages to the logic unit and the memory unit, resulting in incapability to further lower the power consumption of the memory unit. Unfortunately, an operation at low voltages would result in occurrence of various problems. For instance, as well known, the amount of a read signal of a 1T1C cell is proportional to the power supply voltage. Accordingly, when reducing the operating voltage, it becomes difficult to acquire the read signal amount. To avoid this, it is required to lessen the number of memory cells on a bit line to thereby reduce the bitline capacitance or, alternatively, to enlarge the size of a capacitor to thereby increase the capacitance of such capacitor. However, any one of the both results in an increase in area, which spoils the high integrability. In addition, the operation of a sense amplifier also becomes difficult. In particular, with the prior art configuration, the operation at a voltage of about 1V or less is unrealistic. Accordingly, it is an important matter in the future to achieve a highly integrated onchip memory with low-voltage operability.

Additionally, the third issue will become important in the future by taking account of the following circumstance. As known under the name of "system-on-chip," the circuitry to be integrated on an LSI increases in scale. For example, as suggested in JP-A-11-2511647 and JP-A-2001-196561, it is no longer uncommon that analog and digital circuits are integrated together. While transistors are used in digital circuit, the analog circuit requires the use of certain circuit elements such as capacitors in addition thereto. Therefore, in the case of integrating an onchip memory of large capacity together with a large-scale digital circuit and analog circuit, various kinds of fabrication steps are added, resulting in occurrence of anxiety as to an increase in manufacturing process cost. Another anxiety lies in a decrease in performance, reliability or manufacturing yield due to the combination of different kinds of processes.

DISCLOSURE OF INVENTION

In order to resolve the foregoing issues, the present invention uses the following means. Firstly, for resolution of the issue 1, an attempt is made to use, as a capacitor electrode for onchip memory use, a planar structure with a dielectric film sandwiched between metals, called the MIM (Metal-Insulator-Metal) structure, while utilizing a wiring layer on or above the same LSI for one of the electrodes of it. In addition, high dielectric constant material is employed as an insulator of the capacitor. Further, let it have the COB (capacitor Over Bitline) structure with capacitors formed above bitlines. Furthermore, electrical contacts for connection between capacitor electrodes and transistors are taken from the downside of electrodes as will be described later.

For the issue 2, a two-transistor/one-capacitor (2T1C) cell or 2-transistor/2-capacitor (2T2C) cell is used as the memory cell. In addition, what is called the VDD precharge scheme or VSS (GND) precharge scheme is employed as a bit-line precharge scheme.

For the issue 3, capacitors for use in the above-noted onchip memory and capacitors including those for analog circuit use or for power stabilization use are formed of similar structures and the same material. Further, in case the requirements to the capacitors concerning the thickness of dielectric film and the distance from a substrate are almost the same, it is also possible to utilize capacitors using the same wiring layer for a plurality of ones, such as the memory and analog.

By using the means stated above, it is possible to attain the issues 1 to 3. Needles to say, it is obvious that it is possible to use all of these means or use part thereof according to need. For example, it is likely that some products mount no the analog circuits; however, even in such a case, exploiting part of the above-noted means makes it possible to fabricate at low costs a highly integrated onchip memory with low-voltage operability on the same LSI as that of the logic circuit. Alternatively, other products require the onchip memory to have ultra-high integration. In such case, it is permissible to use the 1T1C cell with the COB structure using a MIM structure capacitor with one of its electrodes made common or "commonized" with a wiring line, such as stated in the above-noted resolving method of the issue 1. In this case, although the low voltage characteristics decrease to less than those of 2T cells, it is possible to lessen the size of memory cells. Thus, this approach is effective for fulfillment of certain operation voltage requirements.

BRIEF DESCRIPTION OF DRAWINGS

FIG. 10 is a sectional diagram of the memory cell in FIG. 8.

FIG. 12 is a diagram showing the layout drawing in FIG. 11 while classifying it on a per-layer basis.

FIG. 13 is a sectional diagram of the memory cell in FIG. 11.

FIG. 24 is a sectional diagram of a memory cell in FIG. 23.

FIG. 28 is a sectional diagram of the memory cell in FIG. 26.

FIG. 37 is a sectional diagram of the memory cell in FIG. 34.

FIG. 40 is a circuit diagram of a 1T1C memory cell in FIG. 39 and a diagram showing a layout.

FIG. 41 is a sectional diagram of the memory cell in FIG. 40.

MODES FOR CARRYING OUT THE INVENTION

It should be noted that the transistors making up each block of preferred embodiments are fabricated on a single semiconductor substrate such as a single-crystalline silicon by known CMOS (complementary MOS transistor) integrated circuit technologies, although not specifically limited thereto. More specifically, these are fabricated by a process including the steps of forming wells and element isolation regions plus an oxide film(s), and thereafter forming gate electrodes and first and second semiconductor regions which form source/drain regions. Regarding the circuit symbols of MOSFET (Metal Oxide Semiconductor Field Effect Transistor), the one with no circle mark added to a gate represents an N-type MOSFET (NMOS), which is distinguished from a P-type MOSFET (PMOS) with a circle mark added to its gate. Hereinafter, MOSFET will be simply called the MOS or MOS transistor. Note that the present invention is not limited only to the field effect transistors containing an oxide film provided between a metal gate and a semiconductor layer and is also applicable to circuits using general FETs, such as MISFET (Metal Insulator Semiconductor Field Effect Transistor) involving a dielectric film therebetween.

First Embodiment

Figure 1:
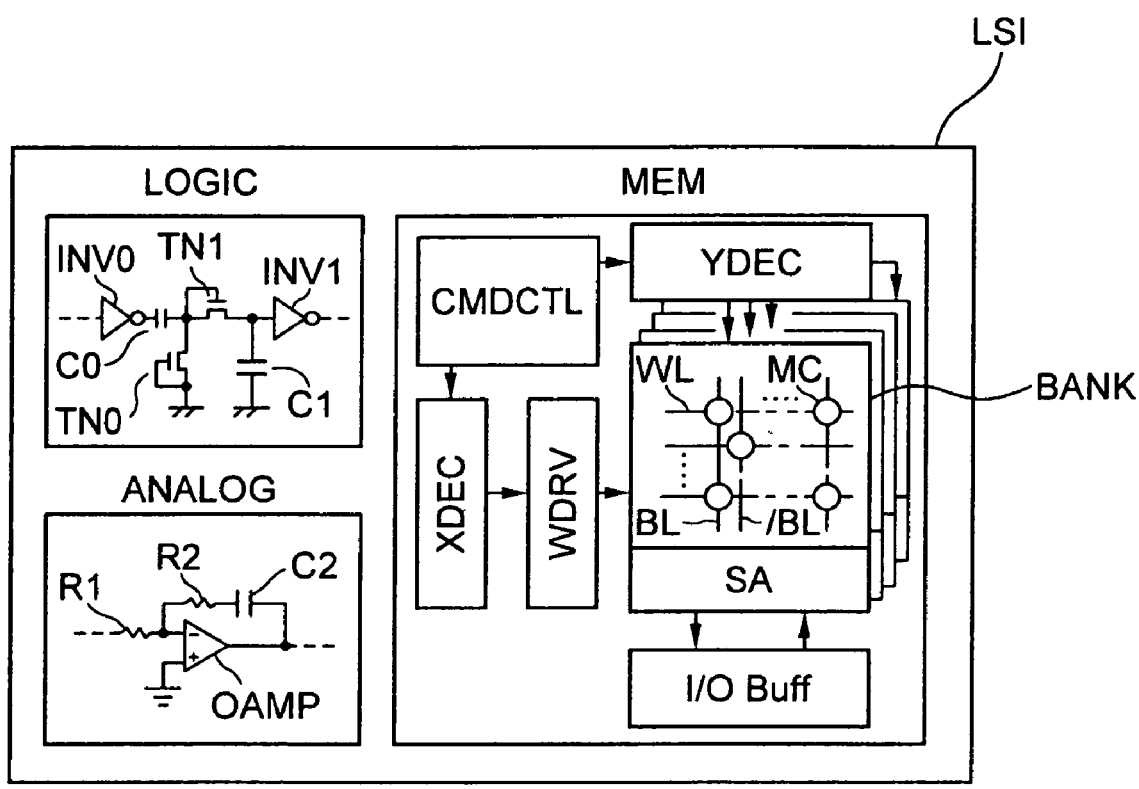
FIG. 1 is a diagram showing a first embodiment of the present invention.
Figure 2:
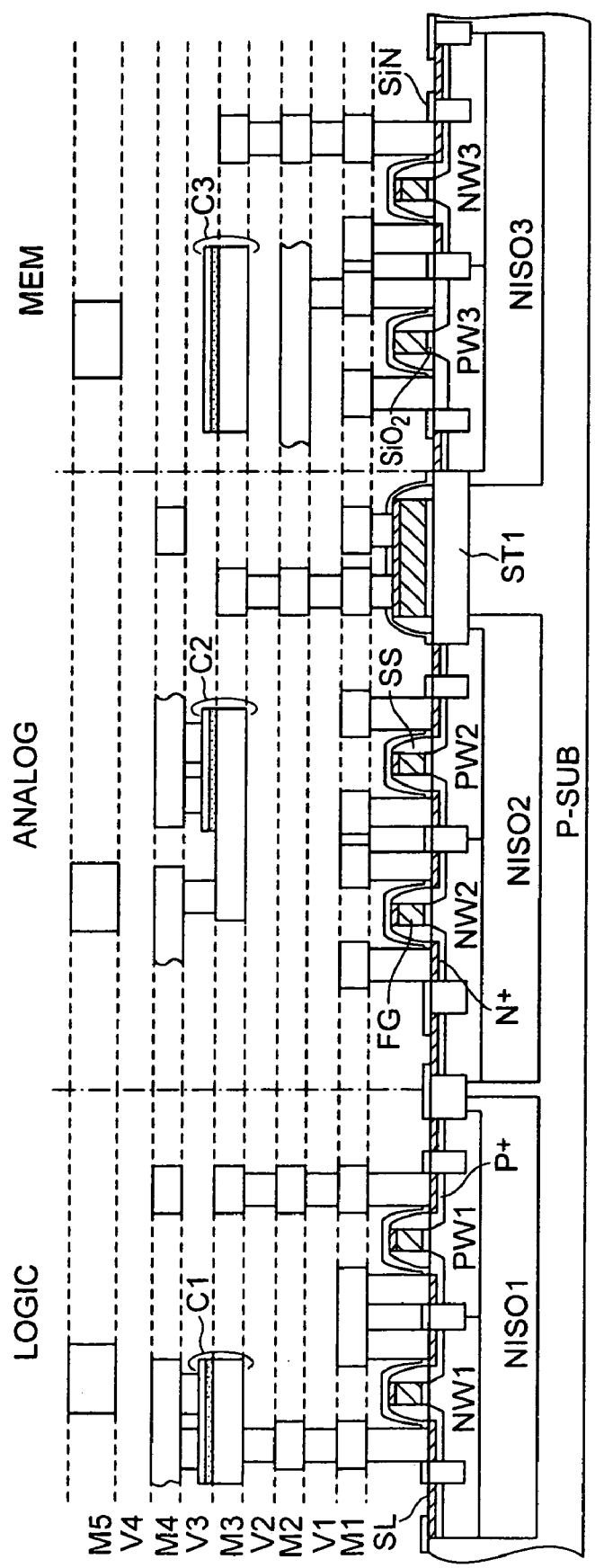
FIG. 2 is a cross-sectional diagram of a semiconductor integrated circuit in the first embodiment of FIG. 1.
Figure 3:
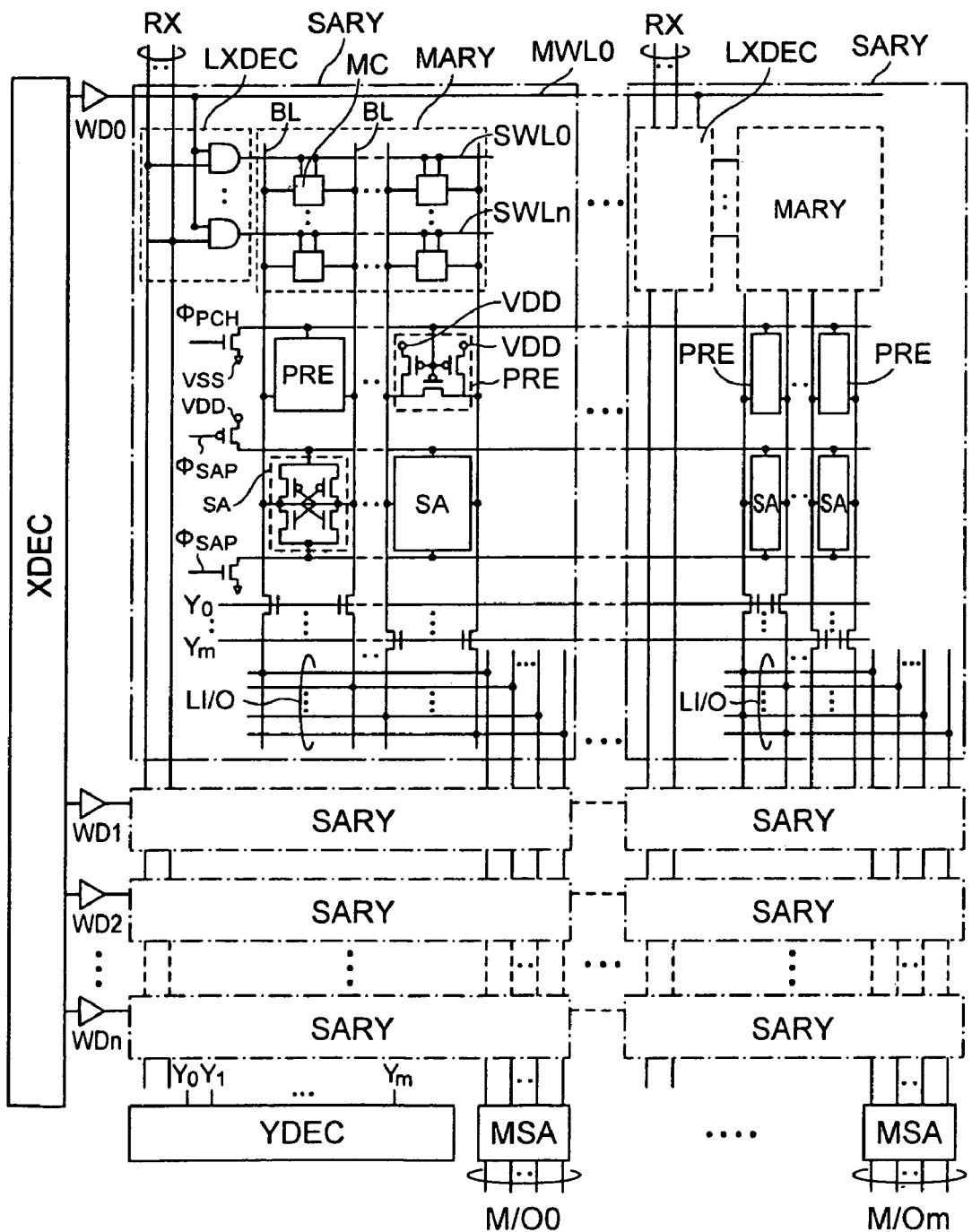
FIG. 3 is a diagram showing a semiconductor memory device in the first embodiment.

FIG. 1 is a diagram showing a semiconductor integrated circuit LSI (referred to as "LSI" hereinafter) which is one embodiment of the present invention. FIGS. 2 to 7 show practical embodiments of main parts making up the LSI of FIG. 1. FIG. 2 shows a cross-sectional diagram of a part of said LSI. FIG. 3 is an embodiment of a memory unit MEM which is the embodiment of FIG. 1; FIG. 4 is an embodiment of a memory cell MC in FIG. 3, which shows its circuit diagram and one example of operation waveforms. FIG. 5 shows a layout drawing of a 2T1C cell which was formed using a MIM capacitor. FIG. 6 is a diagram indicating the layout of the embodiment of FIG. 5 while classifying it in units of wiring layers. In addition, FIG. 7 is a diagram showing a cross-sectional structure of the 2T1C cell of FIG. 5. These embodiments will first be explained in the description below.

In the embodiment of FIG. 1, there is shown an embodiment of an LSI with a logic unit LOGIC, an analog unit ANALOG and a memory unit MEM mounted together on a single chip. The logic unit LOGIC is mainly constituted from NMOS transistors TN0 and TN1, inverters INV0-INV1 made up of CMOS circuits including MOSFETs of first and second conductivity types (P type, N type) with their gates connected together and drains coupled together, more than one basic digital circuit such as AND circuit, NAND circuit or the like, and capacitors C0-C1. The logic unit may comprise an arithmetic circuit such as a product-sum circuit and/or a central processing device CPU. The analog unit ANALOG is generally configured from an operational amplifier OAMP, resistors R1-R2 and a capacitor CAP. The memory unit MEM is made up of peripheral circuitry—including a command controller CMDCTL, word-line decoder XDEC, bitline decoder YDEC, wordline driver WDRV, memory bank BANK, sense amplifiers SA, input/output buffer I/O Buff—and a memory bank BANK. Although details will be explained in FIG. 3, the memory bank BANK is comprised of a plurality of sub-arrays SARY. Furthermore, said sub-array SARY consists essentially of memory cell MC sub-word lines SWL0-SWLn, bit lines BL0 to BLm-1, and bitlines /BL0 to /BLm-1. Note that some of control signals—such as address lines, clocks and others being input from bitline drivers and the outside—are eliminated herein for purposes of avoiding complexities of the drawing.

Moreover, although concretely explaining in FIG. 2 and its following diagrams, the embodiment of FIG. 1 is arranged to utilize a planar structure with a dielectric film sandwiched between metals—namely, the so-called MIM (Metal-Insulator-Metal) structure (referred to as MIM capacitors hereinafter)—for those capacitors on the same chip, such as the capacitors used in an on-chip memory, capacitors used in the analog circuit, and capacitors used for power supply stabilization use. And, one of the capacitor electrodes is also used as a wiring line. Furthermore, a two-transistor/one-capacitor (2T1C) cell or a 2-transistor/2-capacitor (2T2C) cell is used as a memory cell MC (note that the term "2T cell" is used to indicate both 2T1C and 2T2C). With these features, it is possible to realize a highly integrated on-chip memory of low cost with low-voltage operability and also minimize process costs and yield deterioration even in the case of integration together with analog circuitry or else.

FIG. 2 is one embodiment pictorially showing cross-sectional structures of the logic unit LOGIC, analog unit ANALOG and memory unit MEM in FIG. 1. Although an explanation is given here on the assumption of CMOS structure, it is obvious that the present invention is also applicable to other structures including the so-called BiCMOS structure with a mixture of bipolar and CMOS transistors. In this embodiment, the logic unit LOGIC, analog unit ANALOG and memory unit MEM are formed on a single P-type silicon substrate P-SUB. A manufacturing method of the LSI of FIG. 1 will be explained along the sectional structure shown in FIG. 2. Firstly in the semiconductor substrate P-SUB, a process is performed for fabricating wells, a dielectric film SiO2 and an element isolation region STI. Although in FIG. 2 the element isolation region uses STI (Shallow Trench Isolation) for isolation of grooves or trenches, isolation oxide films may be formed through thermal oxidation by LOCOS (Local Oxidation Of Silicon) methods. Well fabrication is performed by injection of an impurity of the same conductivity type as the conductivity type to be formed. N-well regions NISO1, NISO2, NISO3 are formed within the single P-type silicon substrate P-SUB to have island-like shapes; further, N-well regions NW1, NW2, NW3 and P-well regions PW1, PW2, PW3 are formed in respective regions NISO as shown in the drawing. The well structure in FIG. 2 is the so-called triple well structure, which uses N-well regions NISO1, 2, 3 to isolate the logic unit LOGIC, analog unit ANALOG and memory unit MEM respectively. Whereby, respective regions of the logic unit LOGIC, analog unit ANALOG and memory unit MEM can be electrically isolated so that it becomes possible to avoid mutual interference, thereby enabling them to perform stabilized operations. It is also possible to set the potential levels of N- and P-wells suitable for respective operating voltages. Obviously, in cases where such the triple well structure is unnecessary, simple designs may be used, such as a double well structure without provision of the N-well regions NISO1-3; alternatively, various modifications are possible if necessary in such a way that only the memory unit MEM or only the memory unit MEM and analog unit ANALOG is/are isolated by NISO2, 3 or still alternatively two regions are surrounded by the same NISO region.

Next, perform a process for fabricating respective electrodes of the gates, sources and drains of transistors. In order to reduce manufacturing costs and improve yields, it is desirable to maximally commonize the transistor fabrication processes of the logic unit LOGIC, analog unit ANALOG and memory unit MEM to thereby simplify the process steps involved. As will be described later, several options may be considered for this process in a way depending upon whether the high-speed operability of the transistors in the logic unit LOGIC is given higher priority or whether the integration density of the transistors of memory cells within the memory unit MEM receives higher priority (for example, several methods are indicated in the collection of drafts of "1999 VLSI Technology Short Course" issued by IEEE-USA, pp. 95 to 103). Here, an explanation is given of a method using the so-called salicide process which lowers by silicidization the electrical resistances of the gates, drains and sources of the logic unit LOGIC. Use of this method is advantageous in two points. One of them lies in an ability to realize the high-speed operability of logic circuitry. The other is that adaptive usage of design resources of logic circuits is made possible by using the salicide process that is generally used in logic LSIs. For the design of logic circuits in the logic unit LOGIC, make use of a library of macro cells including basic circuits such as NAND circuits and CPU cores or else. Owing to this, there is an advantage which follows: as far as logic portions are formed in advance by using ordinary salicide processes, it is possible, without newly creating a design library, to employ the design resources which have been prepared and standardized for most logic LSIs. Obviously, if general transistors are used to configure the analog circuit also, then it is expectable to bring the effect that the presently available library becomes usable efficiently. It is noted that an example with its memory cell unit being not silicidized will be explained below, because silicidization of the source and drain electrodes of memory cell transistors results in an increase in leakage current, which possibly leads to deterioration of the refresh characteristics. However, it is obvious that in cases where such deterioration of the refresh characteristics causes no problems, the silicidization by means of a salicide process may be performed for the memory part also, in order to simplify the fabrication procedure.

A practically implemented manufacturing method will be described below. First performed is a process for fabricating on a dielectric film of each part a gate electrode FG made of polysilicon. At the same step, it is also possible to fabricate more than one resistive element that is formed of a polysilicon layer FG in the analog unit ANALOG. This FG layer is formed by depositing a polycrystalline silicon film and then patterning it into a desired shape by photolithography and dry etching techniques. Subsequently, use dry etching to remove a dielectric film SiO2 which covers first and second semiconductor regions for use as the source/drain regions of a transistor at each part, followed by a process for doping an impurity into such regions. Form diffusion layers by doping by ion implantation an N-type impurity such as phosphorus P, arsenic As or the like into P-type wells while ion-implanting into N-type wells a P-type impurity such as boron B or else. When implanting ions of one conductivity type, the other well regions are masked by a photoresist. This ion implantation step results in fabrication of a PMOS transistor in the N-well region NW1, NW2, NW3 and an NMOS transistor in the P-well region PW1, PW2, PW3. At this ion implantation step, power feed portions for the N- and P-well regions, which are formed of semiconductor regions with the concentration being greater than that of the wells, are also formed at locations adjacent to the transistors.

Next, a process is performed for fabrication of a side spacer SS on the sidewall of each gate. By anisotropically etching an oxide film that was deposited by CVD method, side spacers are formed on the sidewalls of gate electrodes. Subsequently, perform again the ion implantation at the source/drain diffusion layers to thereby make the so-called LDD (Lightly Doped Drain) structure. Thereafter, deposit an oxide film on the entire surface, followed by selective removal of certain portions of the oxide film which are subjected to silicidization of the transistor regions of the logic unit. At the next salicide step, it becomes possible by the remaining oxide film to eliminate silicidization at those transistors making up the memory cells. Whereby, the source and drain electrodes of a transistor of the memory cell unit does not experience the silicidization; thus, it is possible to avoid deterioration of the refresh characteristics stated supra. Obviously, if in the analog unit also there is a region that the silicidization is undesirable because it increases the resistance values in FG layers for resistor use and the diffusion layers for resistor use, it is possible to mask it in a similar way to the memory cell part. Note that in the case of masking the transistor of the memory cell part from the salicide process, the gate electrode also remains as polysilicon. Due to this, if the length of word lines becomes longer depending on the arrangement of a memory cell array, then the wordlines made of polysilicon become larger in resistance value, resulting in occurrence of a signal delay. This causes a problem in a certain case. In such case, it becomes effective to employ a hierarchical wordline structure to be later described, thereby designing so that the length of wordlines formed of gate electrodes does not become longer. When it is inevitable to use long polysilicon wiring lines, an attempt is made to employ the so-called shunt structure having an upper metal wiring layer and a polysilicon wiring line which are connected together at specified intervals. In the case of a 3D memory cell of the stack type as widely used in general-purpose DRAMs or the like, a 3D capacitor is present on or above the substrate so that the distance between a metal wiring line and a gate electrode increases unintentionally. Due to this, there is a problem that deep contact holes must be formed in case a wordline is shunted relative to the upper metal wiring line. However, in the present invention, capacitors are planarly formed at wiring portions as will be described later so that there is an advantage that it is no longer required to form any deep contact holes.

Next, a salicide process is performed for simultaneous silicidization of the gate, source and drain regions of the transistors of the logic unit LOGIC. This process includes the steps of depositing a high-melting-point metal film such as a cobalt Co film, tungsten Ta film or the like by CVD method, sputter method or else; performing thermal processing in an inactive gas atmosphere to thereby perform annealing (let the semiconductor surface react with the high-melting-point metal film); and removing non-reactants. Although the transistors of peripheral circuits of the memory unit MEM are such that only an NMOS within PW3 is shown in FIG. 2, the transistors for use in the peripheral circuits are such that both NMOS and PMOS are silicidized.

Note that although the silicidization is selectively performed by using the oxide film in the above case, it is also possible to selectively perform the silicidization by selectively removing the high-melting-point metal film for silicide.

Also note that the memory cell unit may not be masked if the leakage current is at a degree which does not affect the refresh characteristics of the memory cells as has been stated previously. In case all the transistors such as the resistors of the memory cell unit and analog unit may not be masked, it is unnecessary to selectively leave any nitride film whereby the process is simplified so that the photomasks required decrease in number. Thus it is possible to further reduce manufacturing costs.

Next, perform a wiring line fabrication process. Each wiring line layer is fabricated through the steps of forming an interlayer dielectric film, defining contact holes, and forming a contact layer. In the drawing, broken lines shown above the substrate are used to indicate the positions of contact layers (V1, V2, . . . , V5) which are comprised of via holes or plugs used for connection between metal wiring layers (M1, M2, . . . , M5) and wiring layers thereof. An interlayer dielectric film is formed between metal wiring layers. MIM capacitors C1, C2, C3 having lower electrodes, dielectric films and upper electrodes which are formed using the same layers (processes) respectively are utilized in the logic unit LOGIC, analog unit ANALOG and memory unit MEM, respectively. The layer that forms one electrode of MIM is used as a wiring line of a peripheral circuit of the memory unit and/or wiring layers of the analog unit and logic unit. The usability of a capacitor is as follows. For example, in the logic unit, a capacitor is provided at a wiring line being connected to the power supply to thereby increase the electrostatic capacitance of the power supply, thus enabling stabilization of the power supply. Obviously it is also possible to use this in power supply wiring line sections of the analog unit ANALOG and memory unit MEM. Furthermore, it is possible to apply it to a capacitive element of the analog unit ANALOG and/or a memory cell in the memory unit MEM as will be described later. Although in FIG. 2 the capacitor is provided in the logic unit while letting the lower electrodes of capacitors at respective portions be formed of the same metal wiring layer, there is a case where capacitors are not always necessary for the logic unit. In such case, certain ones of the capacitor electrodes of the analog unit and memory unit may be formed by the same layer (process) as at least the wiring line used in the logic unit. In prior art 1T1C cells using a 3D capacitor, polycrystalline silicon excellent in heat resisting properties or the like is mainly used as the lower electrode; for the upper electrode, a metal having the oxidization resistance such as TiN or else has been used to form a memory capacitor. Thus, it was difficult to use the metal wiring layer for use in the logic as the capacitor electrode.

The MIM capacitor of this embodiment is formed by the same wiring layer (process) as the wiring lines used in analog and logic circuits while utilizing as the lower electrode a wiring layer overlying the third layer of metal wiring layer M3 above the semiconductor substrate surface. Using wiring lines of the wiring layers overlying the bit lines makes it possible to effectively acquire the capacitor area with respect to the area of a memory cell without receiving the restraints of contact portions for connection between diffusion layers and capacitor electrodes and the other wiring lines (bitlines). After the step of forming the lower electrode, a dielectric film is formed, followed by fabrication of the upper electrode. At this time the upper electrode is formed in a layer of via holes V3 between the fourth layer of metal wiring layer M4 and the wiring layer M3. When utilizing the wiring layer for the one electrode of a capacitor in this way, any special processes become unnecessary in the formation of one electrode of capacitor. Unlike a capacitor having the 3D structure as in prior art general-purpose DRAMs, the illustrative capacitor has a planar structure so that the diversion of metal wiring layer stated above is readily achievable. Furthermore, owing to the planar structure, there are merits which follow: patterning is easy; and capacitors are can be fabricated with good yields. Additionally, examples of the wiring layer utilizable herein are metal wiring lines such as an aluminum wiring line with Al as its principal component, a copper wiring line with Cu as its main component and the like. When using a high dielectric constant material with its relative dielectric constant of 7 or more—for example, Si3N4, Al2O3, Ta2O5, (Ba,Sr)TiO3, SrTiO3, Pb(Zr,Ti)O3, SrBi2Ta2O9, et alia—for the dielectric film, the capacitance per unit area increases, thereby enabling the memory cells to decrease in area. If necessary, a barrier metal such as TiN, TaN or else may be provided at each wiring layer, although not shown in the drawing. In case the heat resistance property is not excellent and less than that of Cu wiring lines, it is effective to fabricate Ta2O5 by using sputtering methods at a low temperature of about 400° C. Regarding the others, it is obvious that a suitable scheme is chosen in accordance with the characteristics of wiring line material and dielectric film.

As apparent from the foregoing, the present invention offers an ability to reduce process costs owing to the use of capacitors of a simple planar structure. Further, the use of high-dielectric-constant material makes it possible to enlarge the MIM capacitor's capacitance value per unit area, thereby enabling the memory cell capacitor to decrease in area. Thus it is possible to realize a highly integrated memory at low costs. Moreover, by utilizing the wiring layer for the electrode of MIM capacitor, it is possible to fabricate the capacitors of the memory unit MEM, logic unit LOGIC and analog unit ANALOG to have similar structures while using the same material. This makes it possible to realize cost reduction and improvements in reliability and process yields. More specifically, it is possible to accomplish the first and third issues to thereby realize an LSI with the attainability of both the highly integrated memory and the process cost reduction. Note here that the capacitors of the memory unit MEM, logic unit LOGIC and analog unit ANALOG can sometimes differ in required capacitance value per unit area. For example, while the memory cells are required to have a high unit capacitance due to the presence of priority to the area, it is occasionally considered desirable for the analog unit to have a low unit capacitance in reply to the requirements of memory cells since an excessive decrease in size results in an increase in affection of size variations. In this case, it is difficult to change the thickness of a high dielectric film at the same layer. To avoid this, a capacitor having a different unit capacitance may be fabricated in a separate wiring layer.

So far, one embodiment of the process of this invention has been explained with reference to FIG. 2. In the above-noted embodiment, a standard salicide process in logic LSIs was used for transistors other than those in the memory cell unit. In the salicide process, the gate electrodes and the source/drain electrodes are exposed and then subjected to silicidization simultaneously. Due to this, there is a problem that the process increases in complexity in order to establish the compatibility with the so-called gate SAC, which fabricates source/drain contacts in such a manner that these are self-aligned with the gates while covering the gate electrodes with a nitride film or else. Although the gate SAC was not used in the above, it is desirable that the gate SAC be used to lessen the transistor area in case the area of a diffusion layer portion of lower transistor becomes larger than the area of a memory cell capacitor. In such case, it becomes effective to use the gate SAC process while using for the gate FG a poly-metal capable of lowering the resistance in a way independent of the source/drain silicidization or a polycide gate. The polymetal is the one that has a barrier metal film, such as a tungsten silicon film, and a metal film made of tungsten or the like which are deposited on a polysilicon film, whereas the polycide is the one with deposition of a tungsten silicon film or else on a polysilicon film. Using these materials makes it possible to lower the gate electrode resistance, although it is impossible to silicidize the gates due to the gate SAC. Even in this case, it is still possible to silicidize the sources and drains of the transistors of the logic unit LOGIC. Obviously, in the case where the retention of memory cells is of anxiety or in the case of retaining the resistance value like the diffusion layer resistance of the analog unit ANALOG, silicidization may be eliminated while masking such part. Additionally, if it is convenient for the resistor using FG layer of the analog unit ANALOG also to remain as polysilicon, such part may be masked during fabrication of a polymetal or polycide. When using the polymetal or polycide as the gate material in this way, the gate SAC is employable. Thus, there is a merit as to the capability to lessen the area of diffusion layer portions of the memory cells.

Subsequently, the on-chip memory will be explained in detail, followed by an explanation about a practical means for realizing the low-voltage operability, which is the second issue. FIG. 3 is one embodiment of the memory unit MEM shown in FIG. 1. An address signal that was output from a command controller CMDCTL is input to a wordline decoder XDEC. A decoded signal is input to wordline drivers WD0-WDn so that a single main word line MWL of main wordlines MWL0-MWLn is asserted (selected and set at a different potential level from the other main wordlines). Next, when looking at one sub-array SRAY, this subarray SRAY is configured from a memory array MARY, a local wordline decoder LXDEC, a common wordline RX, a plurality of precharge circuits PRE, and a plurality of sense amplifiers SA. A sense amp SA is of the CMOS latch type with two pairs of MISFETs of the first conductivity type and second conductivity type (P type and N type) being cross-coupled together. Note that as the drawing becomes complicated, clocks CLK and a common wordline driver along with precharge circuits of main input/output lines MI/O and control signals thereof are omitted since the drawing becomes complicated. By an asserted main wordline MWL and common wordline RX, one of the subwordlines SWL making up the memory array MARY is asserted. A plurality of memory cells MC are connected to one subwordline SWL, wherein a very small or "micro" signal is output from a selected memory cell onto a pair of bit lines BL and /BL and is then amplified by a sense amp SA. An address signal as output from the command controller CMDCTL is similarly input to the bitline decoder YDEC, for selecting from among the plurality of memory cells MC a memory cell MC to be input/output. A signal of such memory cell MC is passed through a local input/output line LI/O and then amplified by a main sense amp MSA whereby input/output to and from the outside is performed via main input/output lines MI/O0-MI/Om. Additionally, control signals such as a precharge control signal ΦPCH, sense-amp control signals ΦSAN, ΦSAP and bitline select signals Y0-Ym are controlled by the command controller CMDCTL at desired timings.

FIG. 4 is an embodiment of the memory cell MC, i.e. one of the 2T1C cells in FIGS. 1 and 3, wherein part (a) is a circuit diagram, (b) shows operation waveforms during reading, and (c) shows operation waveforms during writing. The memory cell MC consists essentially of two NMOS transistors TN1, TN2 (denoted as TN1, TN2 hereinafter) and a capacitor C0, wherein a source-drain path of TN1 is connected between a first bit line BL and a storage node SN1 which is one electrode of the capacitor C0 while a source-drain path of TN2 is connected between a second bitline /BL and a storage node SN1 that is the other electrode of the capacitor C0. Note here that in the explanation below, the storage node side of TN1, TN2 is regarded as a source, whereas the side being connected to the bitline BL, /BL is indicated as a drain. Additionally the gates of TN1 and TN2 are connected to a common word line SWL.

A read operation will be explained by using the waveforms shown in FIG. 4(a). The explanation below assumes that the voltage swing width of a bit line is 0.9V. As will be described later, a 2T1C cell is used as the memory cell; further, the precharge voltage is set at 0.9V to enable operations at such the low voltage. As in FIG. 4(b), a single sub-wordline SWL is asserted (selected to take a voltage different from that of the other sub-wordlines) in a read cycle, resulting in a micro signal being output to the bitline pair BL, /BL in accordance with the information being stored in the cell. After the elapse of a specified time, assert a sense-amp control signal ΦSAN, ΦSAP to activate a sense amp SA for amplification (RD) of a bitline signal. Furthermore, a Y signal is used to read a signal from the bitline onto local input/output line LI/O and then output it through a main amp. The data amplified by the sense amp SA is rewritten (RWT) into the memory cell; thereafter, negate the wordline. Further, assert the precharge control signal ΦPCH, causing the precharge circuit PRE to precharge (PCH) the bitline pair BL, /BL at the same potential (here, 0.9V). As in FIG. 4(c), the subwordline SWL is asserted during a write operation in a similar way to the read operation. Subsequently, after sense-amp drive, a bit line is driven in accordance with write data to thereby write (WR) desired data into a selected memory cell MC. The above is one example of the operation waveforms of the illustrative memory cell.

Figure 4A:
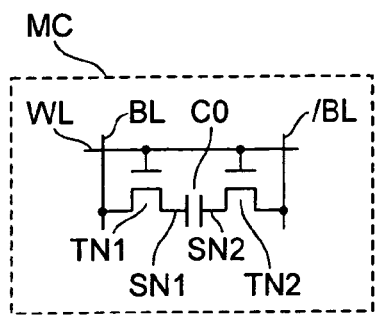
FIG. 4 is a circuit diagram of a memory cell in the first embodiment and waveform diagrams showing operation waveforms.

In this embodiment, the 2T1C cell shown in FIG. 4(a) was used as a memory cell in order to enable a low-voltage operation of 1V or less as shown in FIG. 4. The reason why the low-voltage operation becomes possible by use of this cell will be explained while comparing to the operation principles of a 1T1C cell. The amount of a read signal of an ordinary 1T1C cell is represented by:

$$Vsig = VDD/2 * Cs/(Cs+Cd) \qquad (1)$$

Here, Vsig, VDD, Cs and Cd are the read signal amount, power supply voltage, memory cell capacitance, and bitline's parasitic capacitance, respectively. From Equation (1), it can be seen that the read signal amount is proportional to the power supply voltage. It is required to design the read signal amount so that no operation failures occur by taking account of possible threshold voltage variations of the transistors of sense amplifiers and also noises induced to bitlines—generally, about 0.2V or greater is necessary.

From the above-noted Equation (1), it can be seen that the ratio Cd/Cs of the bitline parasitic capacitance to the memory cell capacitance is required to be set at 1.25 or less in order to permit Vsig to stay at 0.2V or more while setting the supply voltage at 0.9V. In normal DRAMs, this ratio is 5 or more or less. Accordingly, in order to provide proper operability with 1V or below, significant reduction of Cd/Cs is necessary. To reduce Cd/Cs, it is considered to increase the memory cell capacitance or decrease the bitline parasitic capacitance. However, in order to increase the memory cell capacitance, it is required to increase the memory cell area or alternatively to use a capacitor with a complicated structure such as 3D structure. Thus, this approach is not suitable for realization of a highly integrated on-chip memory at low costs. On the other hand, in order to reduce the bitline parasitic capacitance, it is necessary to lessen the number of memory cells per bitline, thereby shortening the bitline length. This results in an increase in number of sense amps in an entirety of the memory array so that an increase in area resulted therefrom becomes a problem. Especially, if Cd/Cs is made smaller in the way stated above then it is required to extremely lessen the number of the memory cells per bitline. Depending on the circumstances, there is a risk that the memory area is kept identical to that in the case of using SRAM cells or, alternatively, the area becomes larger unintentionally.

In contrast, in the 2T1C cell, it is known that the read signal amount is given as:

$$Vsig=VBL-V/BL=VDD*Cs/(Cs+Cd/2) \qquad (2)$$

Comparing the right part of Equation (2) to that of Equation (1), it can be seen that the former is in the form that VDD/2 in Equation (1) is replaced with VDD, and Cd is replaced by Cd/2. Accordingly, in case the memory cell capacitance and the bitline parasitic capacitance are the same as each other, even when lefting the operation voltage of 2T1C cell be half of the operation voltage of 1T1C cell, the read signal mount is still large. Adversely, it can be seen that when calculating Cd/Cs for acquisition of Vsig of more than 0.2V while setting the supply voltage at 0.9V in the same way as the previous case, this value may be equal to or less than 7. This value is a practical value in the viewpoint of design. In this manner, according to this embodiment, even during low-voltage operations with 1V or less, it becomes possible to provide a sufficient signal amount without unnecessarily dividing bit lines into portions.

Figure 4B:
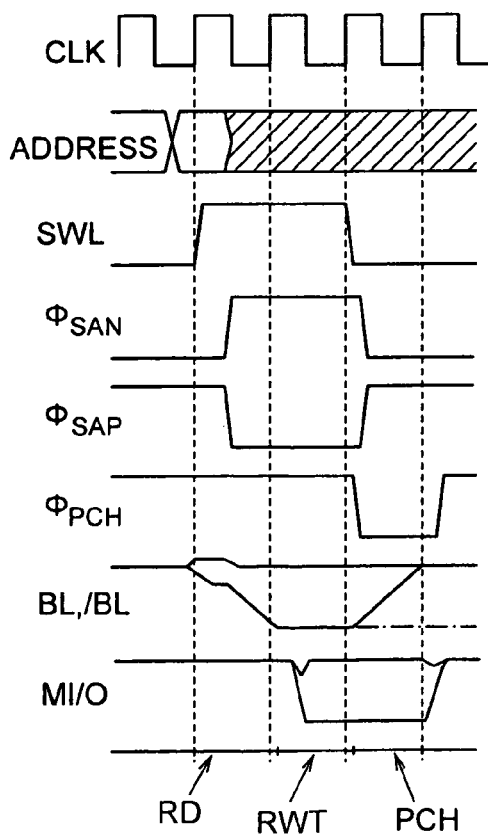
Figure 4C:
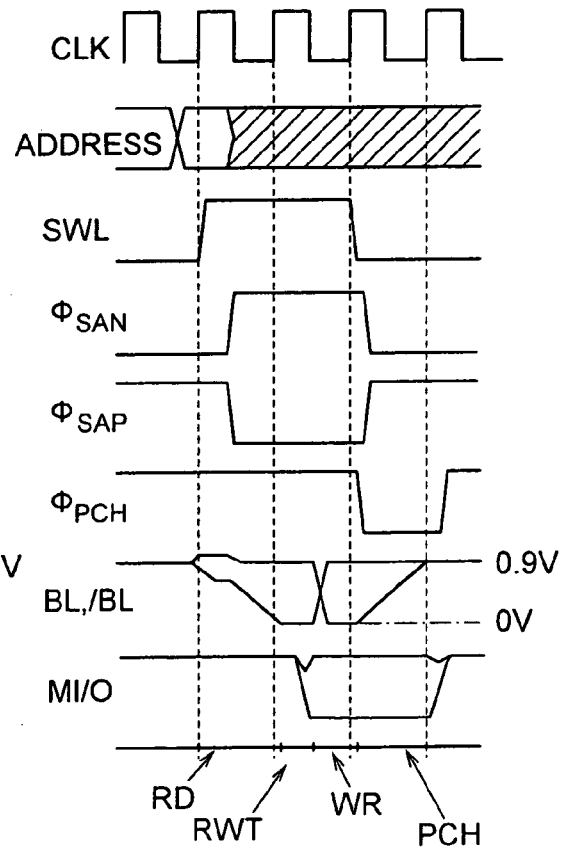
Figure 5:
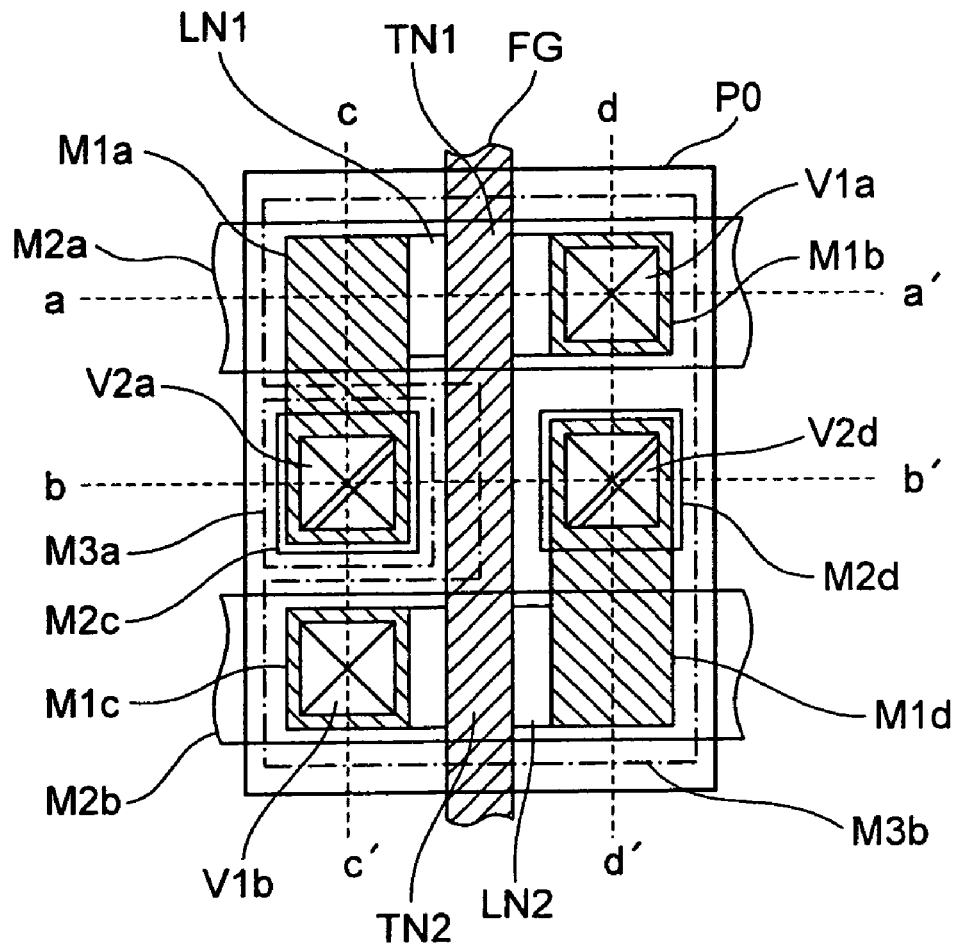
FIG. 5 is a diagram showing a layout of memory cells in the first embodiment.

With the technique above, the read signal amount problem was solved. However, in order to enable achievement of operations at 1V or less, it is necessary to cause a sense amplifier for amplification of a signal from a memory cell to operate with low voltages. As a method for resolving this, the illustrative embodiment is arranged to use a VDD precharge scheme (the scheme for causing a precharge circuit to set a bitline pair at a first potential level in case a potential difference between paired bitlines after potential amplification of the bitline pair is made equal to a difference between a first potential and a second potential lower than the first potential). The reason of this is that if the voltage being applied to a sense amplifier becomes lower then its operating speed decreases. In a VDD/2 precharge scheme that is generally used in 1T1C cells, the voltage to be applied upon activation of the sense amp is the half of the supply voltage so that the scheme is not suitable for operations with 1V or below. Consequently, this embodiment is arranged to use the VDD precharge scheme for precharging a bitline at a high level as shown in the waveform of FIG. 4(b). Note that although similar effects are expectable as to the voltage being applied to a sense amp even in a VSS precharge scheme for precharging a bitline at a low level (the scheme for causing a precharge circuit to set a bitline pair at the second potential level in case a potential difference between paired bitlines after voltage amplification of the bitline pair is made equal to a difference between the first potential and the second potential lower than the first potential), the case of the VDD precharge scheme will be explained here.

Generally, in the case of employing the VDD precharge scheme, the use of dummy cells is required. In the VDD precharge, when reading a signal of H level out of a memory cell, a bitline on the VDD-precharged memory cell side does not vary in potential. For this reason, no potential differences take place between paired bitlines while the bitlines potentially stay at VDD. Thus, it is a must to generate a reference voltage by a dummy cell and provide a differential voltage by letting one bitline slightly decrease in potential. Unfortunately, this results in occurrence of problems which follow: the reference voltage generated can vary due to fluctuations in the manufacture of cell capacitors of dummy cells; and the parasitic capacitances of bitlines exhibit unbalance due to the presence of dummy cells. Consequently the VDD precharge scheme is not often employed for most 1T1C cells.

In contrast, as apparent from FIG. 4(b), (c), the 2T1C cell stores an H level and L level at its storage nodes SN1 and SN2 respectively so that the signal from a memory cell is output to the complementary bitlines BL and /BL at all times. In other words, since a voltage difference takes place without fail at the bitlines BL and /BL, no dummy cells are necessary while making it possible to freely set the precharge voltage. In this manner, the memory cell of this embodiment is capable of free setup of the precharge voltage. Thus it is possible to employ the VDD precharge suitable for low-voltage operations.

As apparent from the foregoing, according to this embodiment, the intended memory capable of offering low-voltage operability with 1V or below is achievable owing to the capabilities to sufficiently acquire the read signal amount and to employ the VDD (VSS) precharge without using dummy cells. As a result, it is possible to take from the same power supply the operating voltage being supplied to the logic unit and the voltage being supplied to the memory unit without using voltage rise-up/drop-down circuitry. In short, it is possible to permit the operation voltage being supplied to the circuits making up the logic unit to be equal to the maximum potential level being supplied to a bitline and a complementary bitline associated therewith.

Next, a description will be given as to a layout method for realizing by use of a MIM capacitor the memory cell MC of FIG. 4 with a small area at low costs, along with an embodiment of a fabrication method thereof.

FIG. 5, 6 is a layout diagram, and FIG. 7 shows a fabrication method. In FIG. 5, respective figures indicate a P-well region (not depicted) formed on a semiconductor substrate, diffusion layers LN which form first and second semiconductor regions (drain region and source region) of first and second transistors, gate layers FG forming the gate electrodes of the first and second transistors and connection thereof, a first layer of metal wiring layer M1, via holes V0 which are electrical contacts for connection between diffusion layer LN and wiring layer M1, a second layer of metal wiring layer M2, via holes V1 that are contacts for connection between wiring layer M1 and wiring layer M2, a third layer of metal wiring layer M3, via holes V2 for use as contacts for connection between wiring layer M2 and wiring layer M3, and an upper electrode P0. Note that in FIG. 5 and layout diagrams to be presented later, only those layers necessary for indication of the structure of a memory cell are shown, and some layers such as ion implantation layers for adjustment of transistor threshold voltages are omitted.

The source side of an NMOS transistor TN1 having its diffusion layer LN1 and gate layer FG is connected to the upper electrode P0 of capacitor C0 through a via hole V0a, wiring line M1a, via hole V1c, wiring line M2c, via hole V2a and wiring line M3a so that a storage node SN1 is formed. On the other hand, the source side of an NMOS transistor TN2 having its diffusion layer LN2 and gate layer FG is coupled to a wiring line M3b which is the lower electrode of capacitor C0, through a via hole V0d, wiring line M1d, via hole V1d, wiring line M2d and via hole V2b, thereby forming a storage node SN2. The drain of TN1 is connected to a wiring line M2a for use as a bit line BL through a via hole V0b, wiring line M1b and via hole V1a. The drain of TN2 is coupled to a wiring line M2b that is a bit line /BL through a via hole V0c, wiring line M1c and via hole V1b.

Figure 6A:
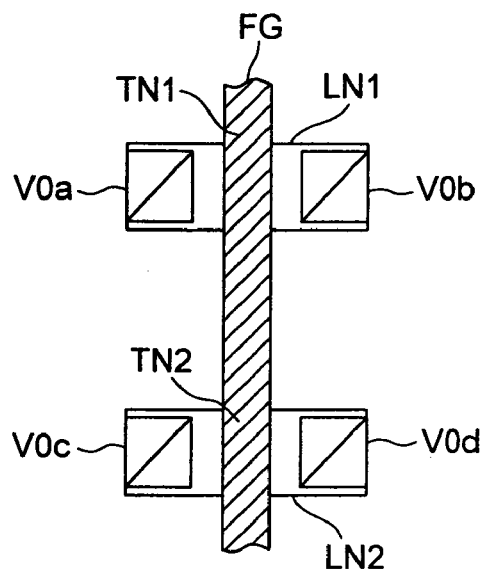
FIG. 6 is a diagram showing the layout drawing in FIG. 5 while classifying it on a per-layer basis.
Figure 6B:
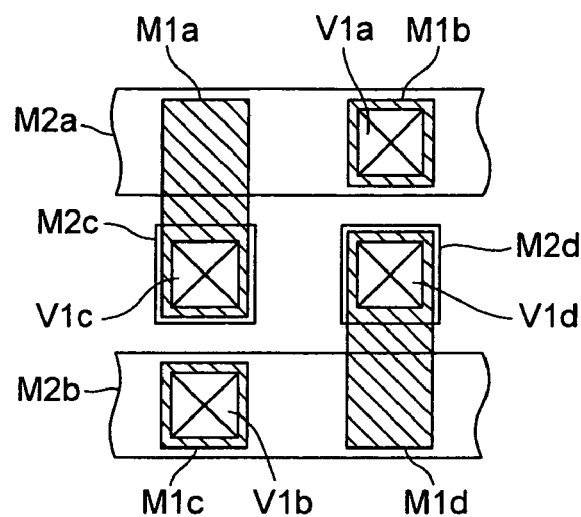
Figure 6C:
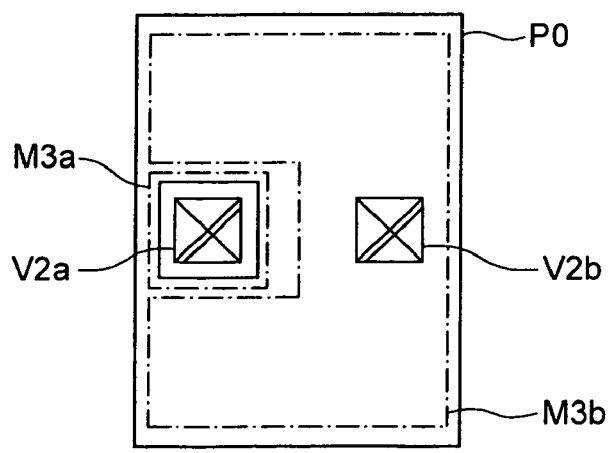

FIGS. 6(a) to (c) show the layout structure of FIG. 5 while dividing it into groups each including several layers in an easy-to-see way. FIG. 6(a) shows the layout of some major layers covering up to the via holes V0, FIG. 6(b) shows the layout of main layers covering from the first layer of metal wiring layer M1 to the second layer of metal wiring layer M2, and FIG. 6(c) shows the layout of further upper layers, wherein fabrication is done in the order of (a), (b) and (c). As shown in FIG. 6(a), fabricate a via hole V0a on the source side of TN1 while forming a via hole V0b on the drain side thereof. Similarly, fabricate a via hole V0d on the source side of TN2; form a via hole V0c on its drain side. These are formed in a way corresponding to respective steps as has been described in the explanation of FIG. 2. As shown in FIG. 6(b), a wiring line M1a is formed from a location above the via hole V0a to an intermediate or midway portion between the diffusion layer LN1 and diffusion layer LN2, and is connected to the wiring line M2c through a via hole V1c. On the other hand, a wiring line M1b and via hole V1a are formed above the via hole V0b on the drain side and coupled to the wiring line M2a which is a bitline BL. Similarly a wiring line M1d is formed from a location above the via hole V0d to a mid portion between the diffusion layer LN1 and diffusion layer LN2. Further, a via hole V1d is formed on the wiring line M1d and is coupled to wiring line M2d. Additionally a wiring line M1c and via hole V1b are formed above the via hole V0c on the drain side and then coupled to the wiring line M2b which is formed above the diffusion layer LN2 and wiring line M1d and which is a bitline /BL. Moreover, as shown in FIG. 6(c), the wiring line M2c shown in FIG. 6(b) is connected to wiring line M3a through via hole V2a and then coupled to the upper electrode P0 of capacitor C0, which resides thereover. In addition, form a via hole V2b on wiring line M2d and then connect it to the lower electrode M3b.

From the above, the source side of TN1 is connected to the upper electrode P0 through the via hole V0a, wiring line M1a, via hole V1c, wiring line M2c, via hole V2a and wiring line M3a whereby the storage node SN1 is formed. In contrast, the drain side is connected through the via hole V0b, wiring line M1b and via hole V1a to the wiring line M2a that is a bitline BL. Similarly the source side of TN2 is connected to the wiring line M3b for use as the lower electrode through the via hole V0d, wiring line M1d, via hole V1d, wiring line M2d and via hole V2b so that the storage node SN2 is formed. The drain side is connected through the via hole V0c, wiring line M1c and via hole V1b to the wiring line M2b that is a bitline /BL. Note here that respective wiring lines and via holes (M1, M2, M3 and V1, V2) of FIG. 2 are sequentially fabricated in the order of from a lower layer to an upper layer at the same steps as those of corresponding wiring lines and via holes of the logic unit and analog unit. Additionally, form at the same steps the lower electrodes, dielectric films and upper electrodes of those capacitors of the logic unit and analog unit, respectively. At the step of forming one capacitor electrode, wiring lines are formed within the peripheral circuits of the memory unit, the logic unit and the analog unit.

One feature of the embodiment of the memory cell layout explained in FIGS. 5 and 6 is that a capacitor is disposed above the diffusion layer of a transistor and also that one of its electrodes is formed of a wiring layer (although this is M3 in the embodiment, another layer overlying the M3 is also usable). Whereby, small-area memory cells are realizable at low process costs. A second feature lies in the method for connection between a capacitor electrode and transistor diffusion layer. More specifically, the wiring line M1 that extends from one end of each diffusion layer LN1, LN2 up to the mid portion of diffusion layer is used to connect between a transistor and capacitor. The connection between the capacitor electrode and the above-noted wiring layer M1 is taken at a portion overlying an element isolation region which is laid out between the semiconductor regions that form the diffusion layers of first and second NMOS transistors TN1-TN2 so that any via holes for connection to capacitor electrodes do not exist above such diffusion layers. Owing to this, it is possible to permit the bitline that is formed of the M2 wiring layer to extend straightly above diffusion layers without having to detour any diffusion layers. This makes it possible to allow the distance between first and second bitlines M2a-M2b to take a value which is smaller than the sum of a minimal distance between the semiconductor active regions LN1-LN2 of first and second NMOS transistors and the lengths of semiconductor active regions LN1-LN2 of first and second NMOS transistors in the direction of the layer FG that form gate electrodes. With this structure, it is possible to make the area smaller when compared to a layout that takes a structure in which the bitline is formed above an element isolation region between the first and second NMOS transistors and those transistors of their neighboring memory cells. It is also possible to prevent any extra parasitic capacitance from being added to a bitline, since the bitline is not drawn out and extended to the lateral part of a diffusion layer. In addition, two contact portions V1a-V1b for connection between a bitline and diffusion layer are structured so that they put a gate electrode therebetween while the structure of a bitline pair is point-symmetrical with respect to the center of a memory cell. Thus, the both become substantially equal to each other in parasitic capacitance and in influenceability of coupling noises during operation. With these features, a stabilized operation is enabled even at low voltages. Furthermore, since the diffusion layers are of simple rectangular shapes, it is possible to lower the parasitic capacitance of the diffusion layers. Moreover, as it is no longer required to excessively enlarge the area of a diffusion layer corresponding to a storage node, a leakage current which deteriorates the retention characteristics becomes less. It is also possible to lower the collection efficiency of electrical charge carriers occurring within the substrate due to alpha rays and neutron radiation. Thus it is possible to enhance the resistance against soft errors also.

Figures 7A, 7B:
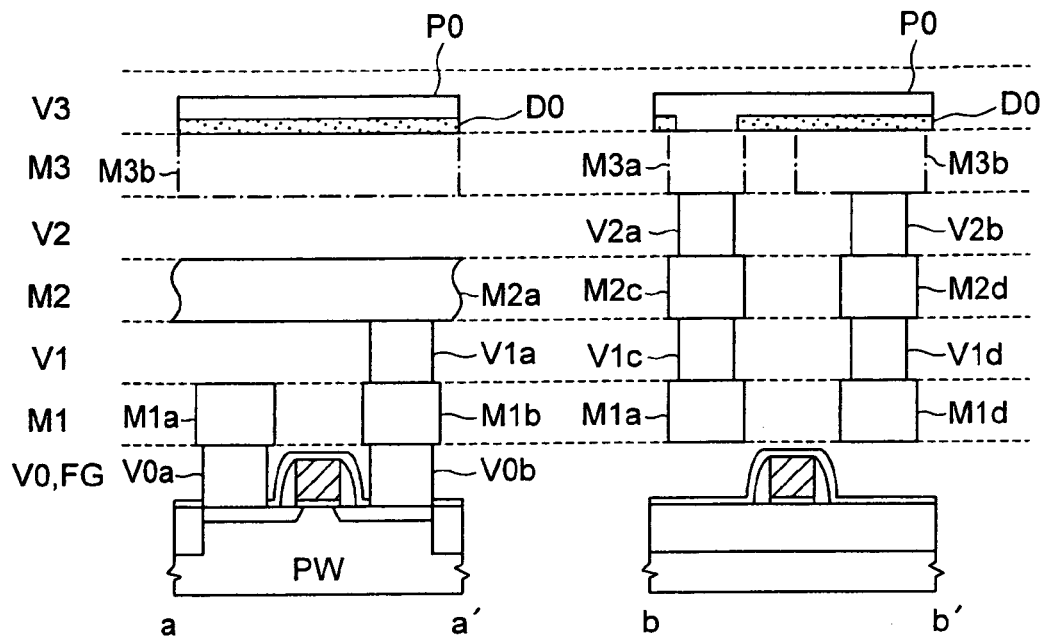
FIG. 7 is a sectional diagram of the memory cell in FIG. 5.

Subsequently, cross-sectional structures of the memory cell in FIG. 5, 6 are shown in FIG. 7 in order to facilitate the understanding of the connection relationship explained above. FIG. 7 shows sectional structures taken from respective directions a-a', b-b', c-c' and d-d' in FIG. 5. FIG. 7(a) shows a cross-section a-a', which indicates that the drain side of TN1 is connected through a via hole V0b, wiring line M1b and via hole V1a to the wiring line M2a that is a bitline BL. The source side of TN1 is connected through via hole V0a to wiring line M1a. Furthermore, a capacitor C0 which consists of a lower electrode M3b, dielectric film D0 and upper electrode P0 is formed above the bitline BL, wherein this bitline is formed in a layer between a wiring layer forming the capacitor electrode and a semiconductor substrate surface. Saying by a term used when classifying 1T1C cell structures, this is a structure equivalent to the COB (Capacitor Over Bitline). With such an arrangement, it is possible to sufficiently retain the capacitor area even for a small memory cell area. Thus it is possible to achieve memory cells suitable for low-voltage operations.

Next, FIG. 7(b) shows a sectional view b-b', which indicates that a wiring line M1a that was drawn out of the source side of TN1 is connected through a via hole V1c, wiring line M2c, via hole V2a and wiring line M3a to the upper electrode P0 of capacitor C0. On the other hand, a wiring line M1d extended from the source side of TN2 is connected through via hole V1d, wiring line M2d and via hole V2b to the wiring line M3b that is the lower electrode of capacitor C0. In this way, this embodiment is arranged so that the dielectric film D0 is holed to take an electrical contact of the upper electrode P0 and wiring line M3a. More specifically, the contact is taken directly from the downside of a respective one of the upper electrode P0 and lower electrode M3b, thereby enabling connection to the M1 wiring layer which was extended from a diffusion layer. This removes the necessity of any extra lead lines from the electrodes. Thus it is possible to sufficiently retain the effective capacitor area.

Figures 7C, 7D:
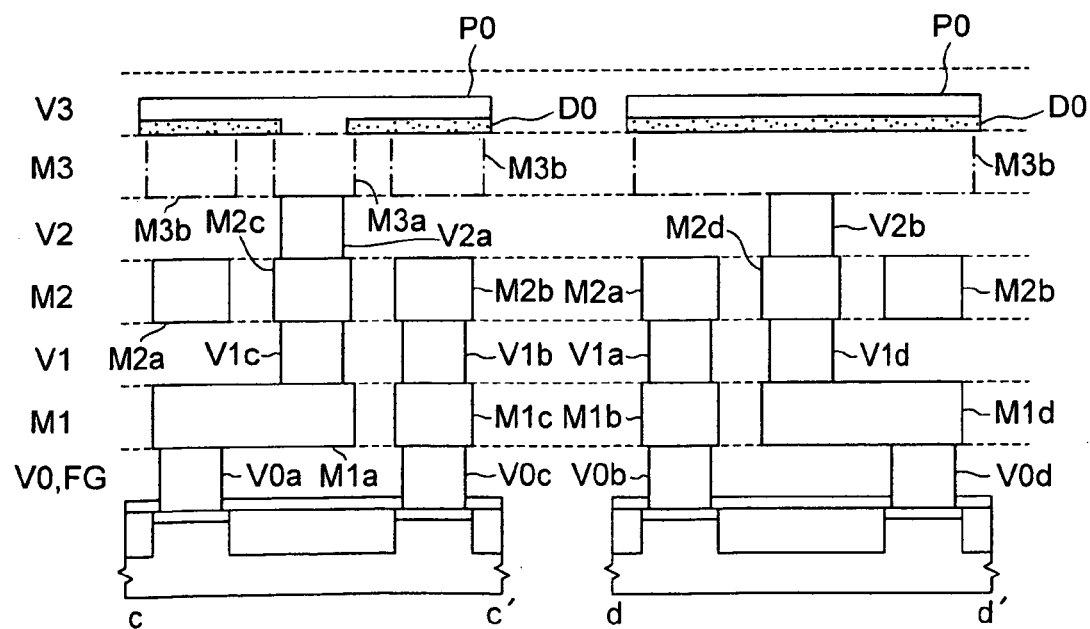

Next, FIG. 7(c) shows a cross-section c-c', which indicates that the source of TN1 is connected to the upper electrode P0 through a wiring line M1a drawn out of the via hole V0a, a via hole V1c, wiring line M2c, via hole V2a and wiring line M3a and further by holing the dielectric film D0. The drain side of TN2 is connected through via hole V0c, wiring line M1c and via hole V1b to the wiring line M2b that is a bitline /BL. Lastly FIG. 7(d) shows a cross-section d-d', from which it can be seen that the source of TN2 is connected to the lower electrode M3b by projecting a wiring line M1d over the via hole V0d and by way of via hole V1d, wiring line M2d and via hole V2b. The drain of TN1 is coupled to the wiring line M2a that is a bitline through via hole V0b, wiring line M1b and via hole V1a.

As apparent from the above explanation of FIGS. 5 to 7, the memory cell offers a feature that it uses a capacitor of the planar structure, in addition to the above-noted features such as utilizing wiring layers as electrodes. Owing to this, it is possible to significantly reduce the cost for capacitor fabrication. This makes it possible to achieve a memory which is low in process cost. It should be noted that although this embodiment is capable of attaining large capacitor areas as stated supra, it will possibly happen that the sufficient capacitance is hardly achievable with the use of an ordinary dielectric film in a way depending upon the memory cell area required. If this is the case, using what is called the high-dielectric-constant material such as Ta2O5 or equivalents thereof makes it possible to achieve highly integrated memory cells with active use of the features of this embodiment.

Although the explanation was given by using FIGS. 1 to 7, the present invention should not be limited to these ones and may be modified in various ways within the scope that does not depart from the principles of the invention. For example, although in FIG. 1 one specific case is explained which mounts the logic unit LOGIC, analog unit ANALOG and memory unit MEM together on one LSI, it is obvious that the LSI may be configured from only the analog unit ANALOG and memory unit MEM or alternatively made up of only the logic unit LOGIC and memory unit MEM. While in this embodiment the explanation was targeted at 2T cells, 1T cells of FIG. 40, 41 may alternatively be used. The shape of capacitor also is not limited to that of this embodiment. The capacitor size may also be made smaller than the range of a diffusion layer—that is, less than the memory cell area of minimum layout—if necessary; adversely, the former may be larger than the latter. Additionally it is self-evident that the film thickness of dielectric films and the layers forming bitlines and capacitors are also alterable. Note that in logic processes, there is a case where the sub-threshold current of a transistor is greater than that of transistors by means of DRAM-dedicated processes. In such case, when the retention characteristics of memory cells are not sufficient, it is possible to lower the sub-threshold current to thereby improve the retention characteristics, by lowering the gate-source voltage of NMOS of a memory cell, which is attainable by slightly increasing the potential on the low level side of a bitline during rewriting and writing rather than setting it at 0V or alternatively by little reducing from 0V the potential of a wordline at the time of non-selection. Optionally the transistors making up memory cells MC may be PMOS transistors. In this case, it is possible to realize memory cells excellent in soft error withstandability, because PMOS transistors are inherently less in funneling length than NMOS transistors. Needless to say, when using PMOS transistors, it is necessary to drive them while using a different potential relationship from that of NMOS such as lowering the wordline potential level at the time of selection; however, an explanation thereof is eliminated since this is readily understandable matter in view of differences in operation between NMOS and PMOS. Additionally even when using PMOS transistors, either the VSS precharge scheme or the VDD precharge scheme is employable. Thus it is possible to achieve the intended memory suitable for low-voltage operations.

Second Embodiment

An explanation will be given of three modified examples of the memory cell layout of FIG. 4(a) of the first embodiment. In the memory cell layout shown in FIGS. 5 to 7, at the capacitor fabrication step, the dielectric film D0 is holed by etching process to thereby connect the wiring layer M3 and upper electrode P0 at an opening or hole of the dielectric film D0. At this time, the dielectric film D0 is exposed to a photolithography process resulting in unwanted contamination of the surface of dielectric film D0, which sometimes leads to a decrease in capacitor reliability and yield. In this case, a barrier metal may be used on or above the dielectric film D0 to thereby form capacitors. However, the use of such barrier metal would result in an unintentional increase in process cost. If this is the case, the use of a memory cell layout of FIG. 8, 9 and a fabrication method of FIG. 10 makes it possible to improve the capacitor reliability without using any barrier metal. A first modification shown in these drawings is such that the photolithography process is performed in the state that upper part of dielectric film D0 is covered with the upper electrode P0. Whereby, the surface of dielectric film D0 is hardly contaminated so that the reliability improves.

Figure 8:
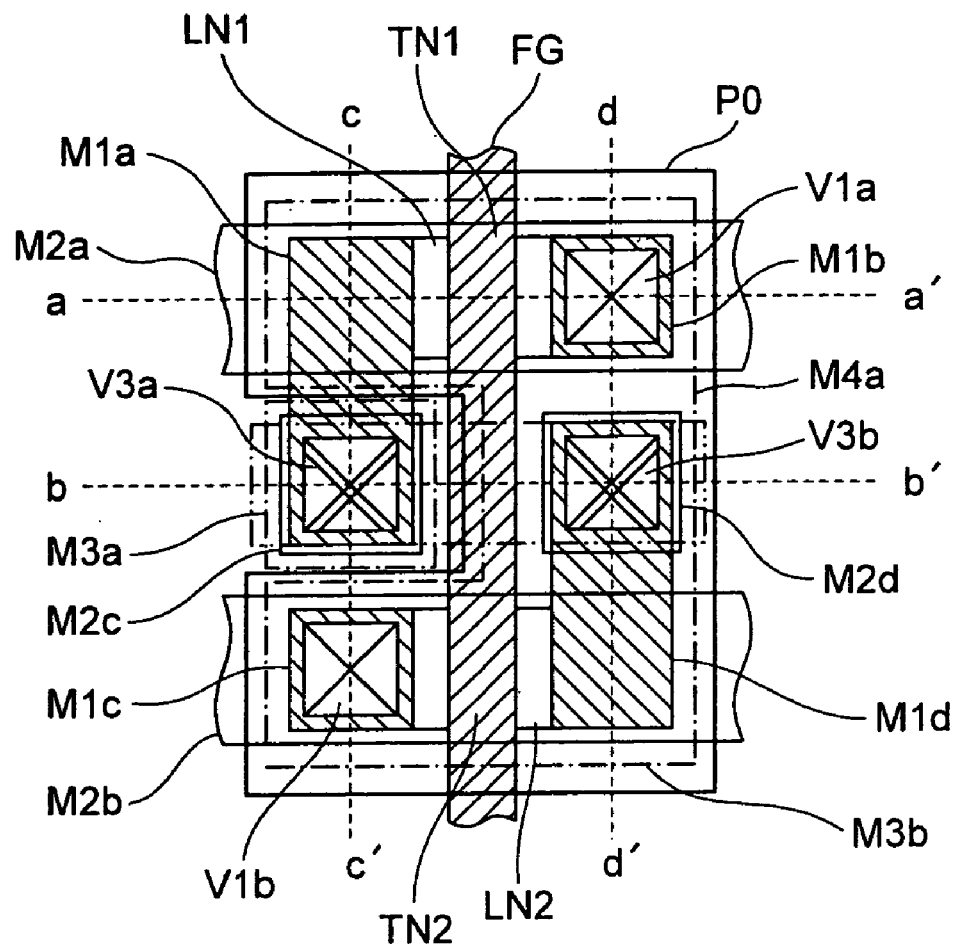
FIG. 8 is a first modified example showing a layout of the memory cell in FIG. 4.
Figure 8:
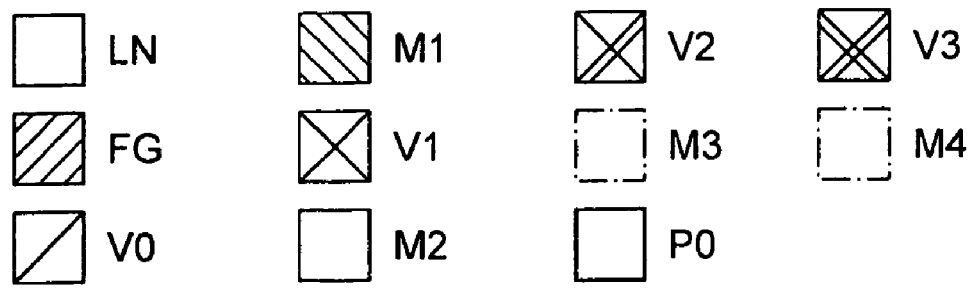

In FIG. 8, the source side of TN1 is connected to the upper electrode P0 of a capacitor C0 through a via hole V0a, wiring line M1a, via hole V1c, wiring line M2c, via hole V2a, wiring line M3a, via hole V3a, wiring line M4a and via hole V3b so that a storage node SN1 is formed. On the other hand, the source side of TN2 is connected to a wiring layer M3b which is the lower electrode of capacitor C0 through a via hole V0d, wiring line M1d, via hole V1d, wiring line M2d and via hole V2b, thus forming a storage node SN2. The drain of TN1 is connected through a via hole V0b, wiring line M1b and via hole V1a to a wiring line M2a that is a bitline BL, whereas the drain of TN2 is coupled to a wiring line M2b that is a bitline /BL through a via hole V0c, wiring line M1c and via hole V1b.

Figure 9A:
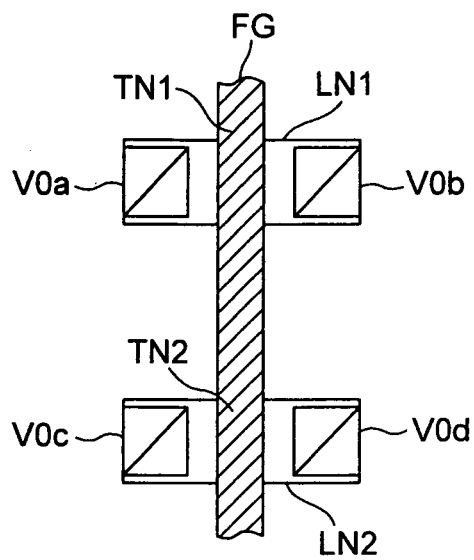
FIG. 9 is a diagram showing the layout drawing in FIG. 8 while classifying it on a per-layer basis.
Figure 9B:
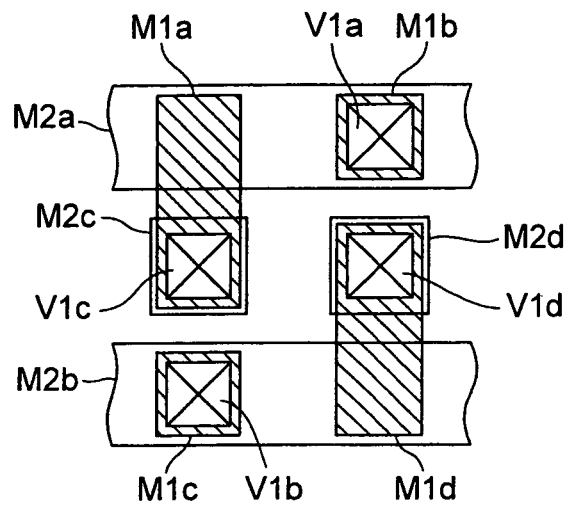
Figure 9C:
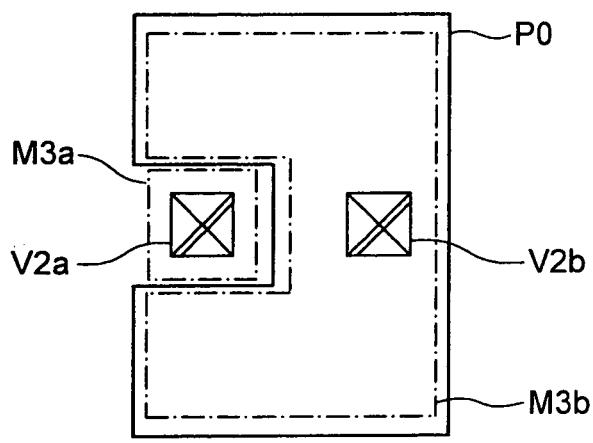
Figure 9D:
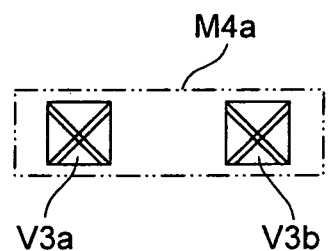

FIGS. 9(a) to (d) show the layout structure of FIG. 8 while dividing it into groups of several layers for purposes of convenience in illustration. FIG. 9(a) shows a layout of some major layers up to the via holes V0; FIG. 9(b) shows main layers of from a first layer of metal wiring layer M1 to a second layer of metal wiring layer M2; FIG. 9(c) shows main layers of from the layer of via holes V2 to the upper electrode P0; and, FIG. 9(d) shows a layout of a further upper layer. Note that since the layers shown in FIG. 9(a), (d) are similar in layout and connection relationship to those of FIG. 6(a), (b) which is the first embodiment, an explanation thereof is omitted here. The wiring line M2c shown in FIG. 9(b) is connected to the wiring line M3a through via hole V2a in a way shown in FIG. 9(c). The via hole V2b is formed above wiring line M2d, and then connected to the wiring line M3b that is the lower electrode of capacitor C0. Further, as shown in FIG. 9(d), the wiring line M3a shown in FIG. 9(c) is connected through via hole V3a to wiring line M4a while connecting the wiring line M4a to the upper electrode P0 of capacitor C0 through via hole V3b. In this manner, this modification is arranged to perform the photolithography process while letting the upper electrode P0 cover the dielectric film D0 so that it is possible to fabricate the capacitor without the risk of surface contamination of dielectric film D0.

Subsequently, in order to make the above-stated connection relationship more understandable, the sectional structure of the memory cell in FIG. 8, 9 is shown in FIG. 10. FIG. 10 shows sectional structures taken from respective directions a-a', b-b', c-c' and d-d' in FIG. 8. FIG. 10(a) shows a cross-section a-a', form which it can be seen that the drain side of TN1 is connected to a wiring line M2a that is a bitline BL through via hole V0b, wiring line M1b and via hole V1a. The source side of TN1 is coupled through a via hole 0a to wiring line M1a.

Next, FIG. 10(b) shows a cross-section b-b', wherein a wiring line M1a that was drawn out of the source side of TN1 is connected to a wiring line M3a through a via hole V1c, wiring line M2c and via hole V2a. On the other hand, a wiring line M1d projected from the source side of TN2 is coupled to the lower electrode M3b of capacitor C0 through a via hole V1d, wiring line M2d and via hole V2b.

Note here that in this modification, the dielectric film D0 is formed on the wiring line M3a and lower electrode M3b, followed by fabrication of the upper electrode P0 on dielectric film D0; thereafter, remove by etching the upper electrode P0, dielectric film D0 and an interlayer dielectric film. Using this process, form the via hole V3a and via hole V3b at holed portions; then, connect the wiring line M3a to the upper electrode P0 through via hole V3a, wiring line M4a and via hole V3b. Since this structure is such that the surface of dielectric film D0 is always covered with the upper electrode P0 at the photolithography step, it is possible to resolve the problem caused by contamination. More specifically, it is possible to form capacitors at good yields without having to use any barrier metal on or above the dielectric film D0, which in turn makes it possible to reduce process costs.

Next, FIG. 10(c) shows a cross-section c-c', which indicates that the source of TN1 is connected to a wiring line M4a by way of a wiring line M1a projected from the via hole V0a, via hole V1c, wiring line M2c, via hole V2a and wiring line M3a and further through a via hole V3a which is defined in the dielectric film D0. The drain side of TN2 is coupled to the wiring line M2b that is a bitline /BL through via hole V0c, wiring line M1c and via hole V1b. Lastly FIG. 10(d) shows a cross-section d-d', from which it can be seen that the source of TN2 is coupled to the lower electrode M3b by extending a wiring line M1d above the via hole V0d and through via hole V1d, wiring line M2d and via hole V2b. The upper electrode P0 is connected through via hole V3b to wiring line M4a. The drain of TN1 is coupled to the wiring line M2a that is a bitline BL by way of via hole V0b, wiring line M1b and via hole V1a.

As apparent from the above explanations of FIGS. 8 to 10, it is possible in this modification to fabricate the upper electrode P0 on dielectric film D0 and thereafter form the via hole V3a on wiring line M3a by holing the dielectric film D0 by etching. More specifically, the dielectric film surface is no longer contaminated due to direct exposure to the photolithography process so that it is possible to fabricate the capacitor C0 without using any barrier metal, which makes it possible to reduce process steps. Thus it is possible to form capacitors while reducing costs and also improving yields. Note that the memory cells explained in FIGS. 8 to 10 are principally the same as the structures explained in FIGS. 5 to 9 in layout and overall shape and also in having a MIM capacitor using a wiring layer(s). Accordingly, it is obvious that the basic features and effects in the modification of FIGS. 5 to 7 are inheritable.

It is also obvious that various changes as to the memory cell layout and fabrication method of this implementation are possible in a similar manner to the embodiment stated above. Furthermore, it is needless to say that the MIM capacitor explained in this embodiment is applicable to not only memory cells but also those for analog and logic use. Owing to the above-noted features, it is possible to realize an LSI at further reduced costs.

In the above-described memory cell layouts shown in FIGS. 5 to 7 and FIGS. 8 to 10, a capacitor is formed by connecting the lower electrode M3b onto the via hole V2b. However, when fabricating the via hole V2b, a recess or the like can take place in some cases. If the lower electrode M3b is formed on or above it, then there is a case where any good electrical connection is hardly obtainable. It can also happen that a stair step-like difference is created at lower electrode M3b due to the influence of such recess, which affects the capacitor characteristics. In such case, when using a second modification of the memory cell shown in FIG. 13, it is possible to fabricate the capacitor while avoiding the problem noted above.

Figure 11:
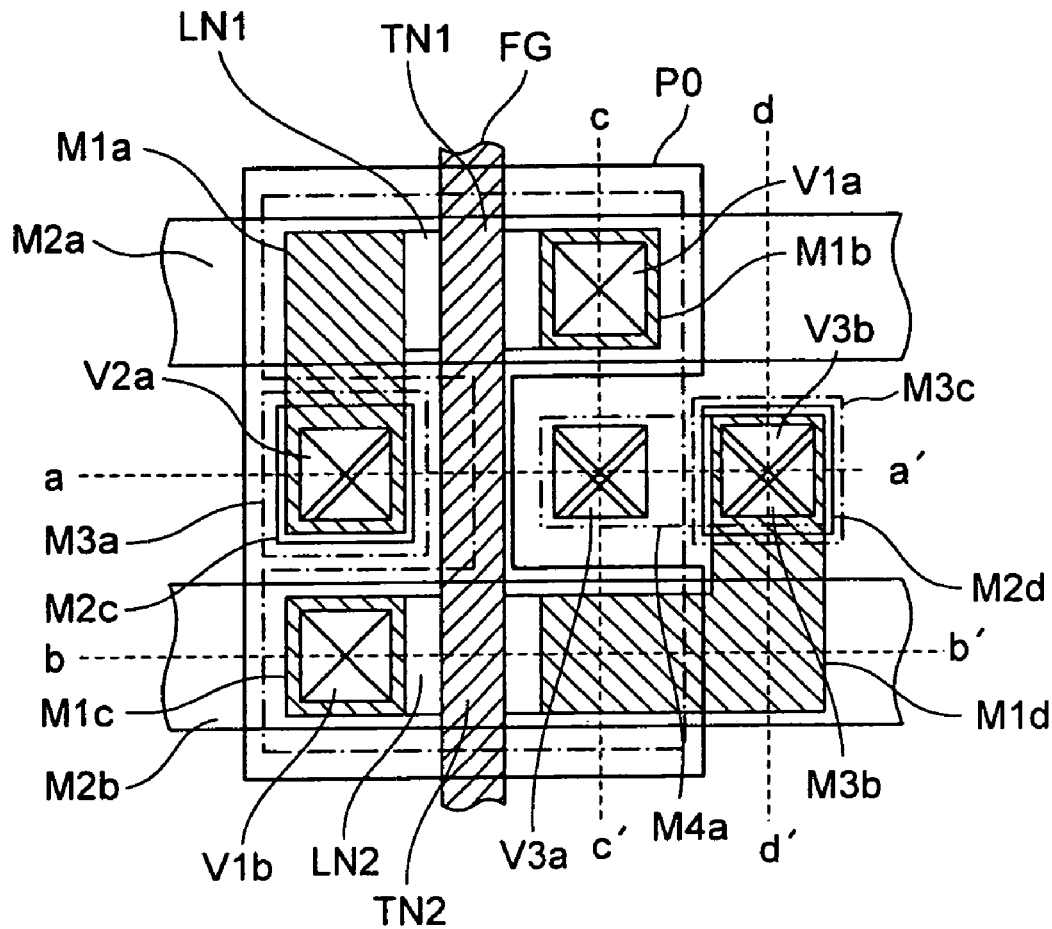
FIG. 11 is a second modification showing a layout of the memory cell in FIG. 4.
Figure 11:
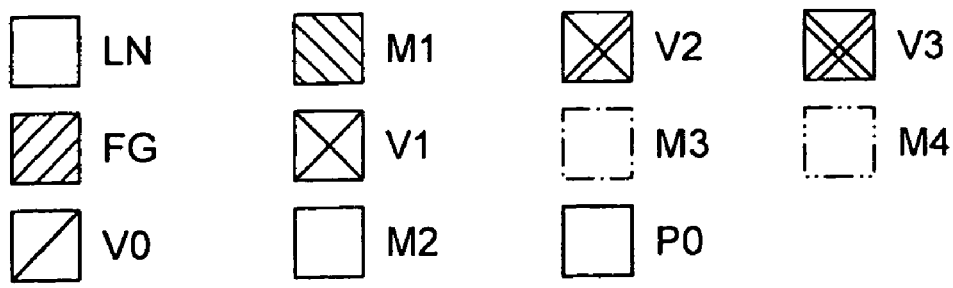

FIG. 11, 12 shows a layout, and FIG. 13 shows a fabrication method. A modification shown in these drawings is featured in that a contact is taken out of upper part of the lower electrode and is connected to a storage node. Thus it is possible to form a flat lower electrode.

In FIG. 11, the source side of TN1 is connected to the upper electrode P0 of capacitor C0 through a via hole V0a, wiring line M1a, via hole V1c, wiring line M2c, via hole V2a and wiring line M3a so that a storage node SN1 is formed. On the other hand, the source side of TN2 is connected to a wiring line M3b that is the lower electrode of capacitor C0 through a via hole V0d, wiring line M1d, via hole V1d, wiring line M2d, via hole V2b, wiring line M3c, via hole V3b, wiring line M4a and via hole V3a, thereby forming a storage node SN2. The drain of TN1 is connected to a wiring line M2a that is a bitline BL through a via hole V0b, wiring line M1b and via hole V1a; the drain of TN2 is coupled to a wiring line M2b that is a bitline /BL through a via hole V0c, wiring line M1c and via hole V1b.

FIGS. 12(a) to (c) show the layout structure of FIG. 11 while dividing it into groups of several layers in an easy-to-see way. FIG. 12(a) shows a layout of some major layers covering from a first layer of metal wiring layer M1 up to a second layer of metal wiring layer M2; FIG. 12(b) shows a layout of main layers of from the layer of via holes V2 to the upper electrode P0; and FIG. 12(c) shows a layout of a further upper layer. Note that since the layers underlying the wiring layer M1 are similar in layout and connection relationship to those of FIG. 6(a), (b) which is the above-noted embodiment, a drawing and its explanation are omitted here.

In this modification, as shown in FIG. 12(a), the wiring line M1a is formed to range from upper part of via hole V0a to a midway portion of diffusion layer LN1 and diffusion layer LN2 and is connected to wiring line M2c through via hole V1c. On the other hand, the wiring line M1b and via hole V1a are formed on or above the drain-side via hole V0b and connected to the wiring line M2a that is a bitline BL. Similarly a wiring line M1d is formed, as shown in the drawing, to span from upper part of via hole V0d to a mid portion of diffusion layer LN1 and diffusion layer LN2; further, a via hole V1d is formed on wiring line M1d and connected to wiring line M2d. Additionally a wiring line M1c and via hole V1b are formed on the drain-side via hole V0c and connected to the wiring line M2b for use as a bitline /BL, which was formed above the diffusion layer LN2 and wiring line M1d.

As shown in FIG. 12(b), the wiring line M2c shown in FIG. 12(a) is connected through a via hole V2a to wiring line M3a and further connected to the upper electrode P0 of its overlying capacitor C0. In addition, a via hole V2b is formed on wiring line M2d and is connected to wiring line M3b. Lastly as in FIG. 12(c), the wiring line M3c shown in FIG. 12(b) is connected to wiring line M4a through via hole V3b; further, the wiring line M4a is connected through via hole V3a to a wiring line M3b which is the lower electrode of capacitor C0. In this way, this structure is arranged to take a contact from the upper part of lower electrode M3b whereby any step-like difference does not take place at the lower electrode M3b so that a capacitor with high reliability is realizable.

Subsequently, in order to make the above-stated connection relationship more understandable, the cross-sectional structure of the memory cell in FIG. 11, 12 is shown in FIG. 13. FIG. 13 shows sectional structures taken from respective directions a-a', b-b', c-c' and d-d' in FIG. 11. FIG. 13(a) shows a cross-section a-a', which indicates that the wiring line M1a which was drawn out of the source side of TN1 is connected to the upper electrode P0 of capacitor C0 through via hole V1c, wiring line M2c, via hole V2a and wiring line M3a. On the other hand, it is shown that the wiring line M1d extended from the source side of TN2 is connected to the wiring line M3b that is the lower electrode of capacitor C0 through via hole V1d, wiring line M2d, via hole V2b, wiring line M3c, via hole V3b, wiring line M4a and via hole V3a. Next, FIG. 13(b) shows a cross-section b-b', from which it can be seen that the drain of TN2 is connected to the wiring line M2b that is a bitline /BL through via hole V0c, wiring line M1c and via hole V1b. The source side of TN2 is coupled through via hole V0d to wiring line M1d. Next, FIG. 13(c) shows a cross-section c-c', wherein the drain of TN1 is connected to the wiring line M2a that is a bitline BL through via hole V0b, wiring line M1b and via hole V1a. The source side of TN2 is connected through via hole V0d to wiring line M1d. This drawing also shows that the dielectric film D0 is holed causing the lower electrode M3b to be coupled through via hole V3a to wiring line M4a. Finally, FIG. 13(d) shows a cross-section d-d', wherein the wiring line M1d drawn out of TN2 is connected to wiring line M4a through via hole V1d, wiring line M2d, via hole V2b, wiring line M3c and via hole V3b.

As apparent from the explanations of FIGS. 11 to 13, the memory cell of this implementation is arranged to take a contact by forming the via hole V3a on the upper side of lower electrode M3b. Hence, any step-like difference is no longer created at the lower electrode so that there is an advantage that the stress of capacitor is suppressed to the minimum level. In other words, it is possible to realize memory cells while using capacitors with high reliability. Note that it is obvious that various changes as to the memory cell layout and the fabrication method of this implementation are available in a similar way to the previous embodiment. It is also obvious that the MIM capacitor explained in this modification is applicable not only to memory cells but also to those for analog and logic use.

In the memory cell layout shown in FIGS. 11 to 13, when fabricating capacitors, the dielectric film D0 is etched to defile holes for connection between the wiring layer M3 and upper electrode P0 at an opening of dielectric film D0. In this case, the dielectric film D0 is sometimes contaminated on its surface for the same reason as that of the first modification shown in FIGS. 5 to 7, resulting in a decrease in yield of capacitors. If this is the case, this problem is avoidable by use of a barrier metal in a similar way to the previous case of FIGS. 5 to 7. In cases where the addition of such barrier metal is not desirable, it is also possible to use a method similar to that of the modification shown in FIGS. 8 to 10 to thereby avoid the above-noted problem. Hereinafter, such the method will be explained by using a third embodiment of the memory cell MC shown in FIGS. 14 to 17.

Figure 14:
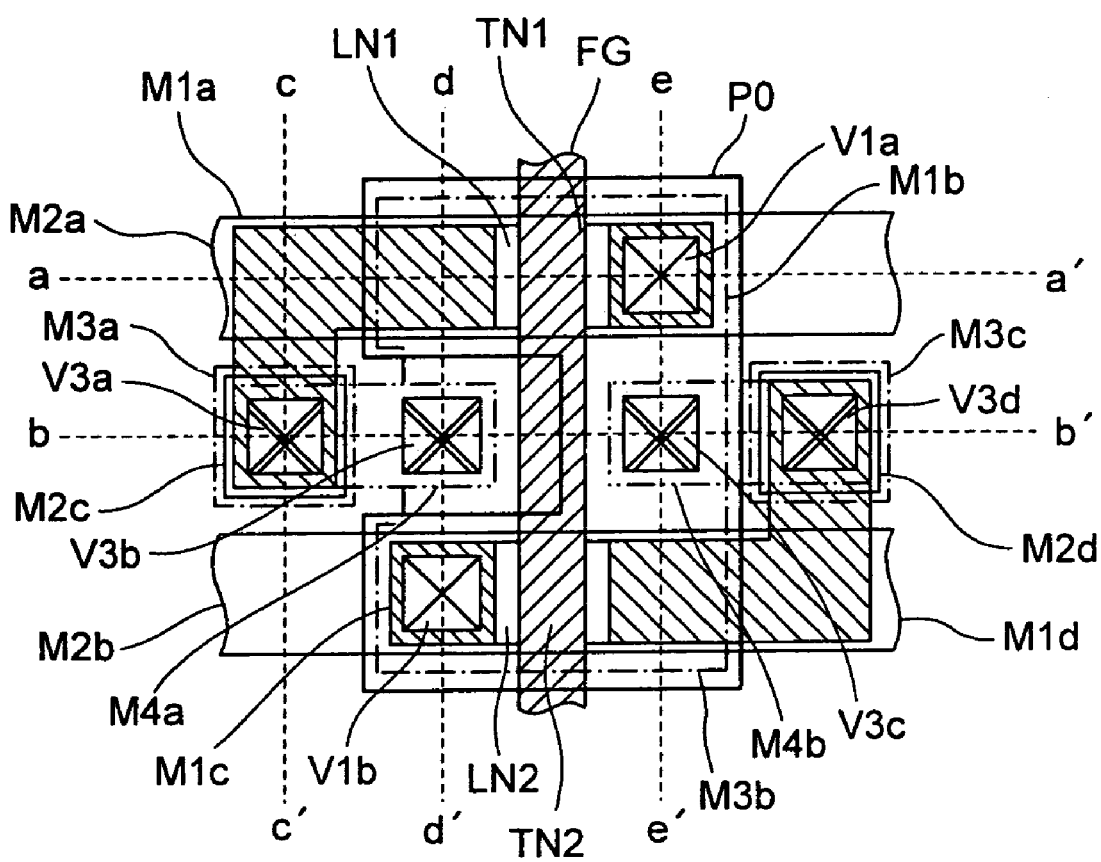
FIG. 14 is a third modification showing a layout of the memory cell in FIG. 4.
Figure 14:
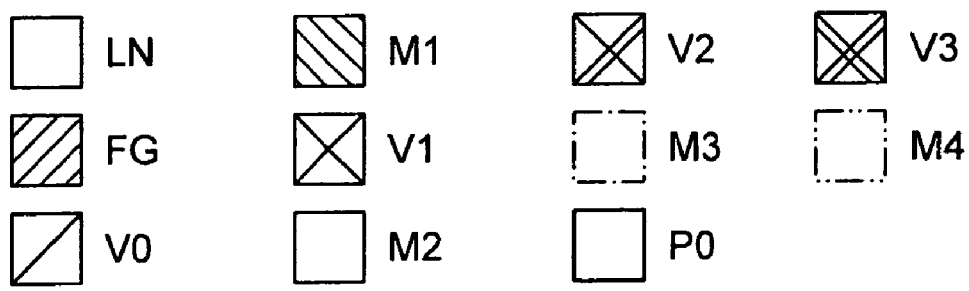

FIG. 14, 15 shows a layout, and FIGS. 16-17 are cross-sectional diagrams showing a fabrication method. In the layout shown in these drawings, a photolithography process is performed after having formed an upper electrode P0 on dielectric film D0 while retaining the feature of the previous modification which follows: a contact is taken from the upper part of a lower electrode to thereby connect it to a storage node. More specifically, it is possible to realize a reliability-enhanced capacitor with no step-like differences at its lower electrode and also possible to fabricate the capacitor at good yields without having to use any barrier metal. Thus it is possible to achieve the capacitor with high reliability while simultaneously reducing process costs.

In FIG. 14, the source side of TN1 is connected to a wiring layer M3b which is the lower electrode of a capacitor C0 through a via hole V0a, wiring line M1a, via hole V1c, wiring line M2c, via hole V2a, wiring line M3a, via hole V3a, wiring line M4a and via hole V3b so that a storage node SN1 is formed. In contrast, the source side of TN2 is connected to the upper electrode P0 of capacitor C0 through a via hole V0d, wiring line M1d, via hole V1d, wiring line M2d, via hole V2b, wiring line M3c, via hole V3d, wiring line M4b and via hole V3c, thereby forming a storage node SN2. The drain of TN1 is connected to a wiring line M2a that is a bitline BL through a via hole V0b, wiring line M1b and via hole V1a. The drain of TN2 is coupled to a wiring line M2b for use as a bitline /BL through a via hole V0c, wiring line M1c and via hole V1b.

Figure 15A:
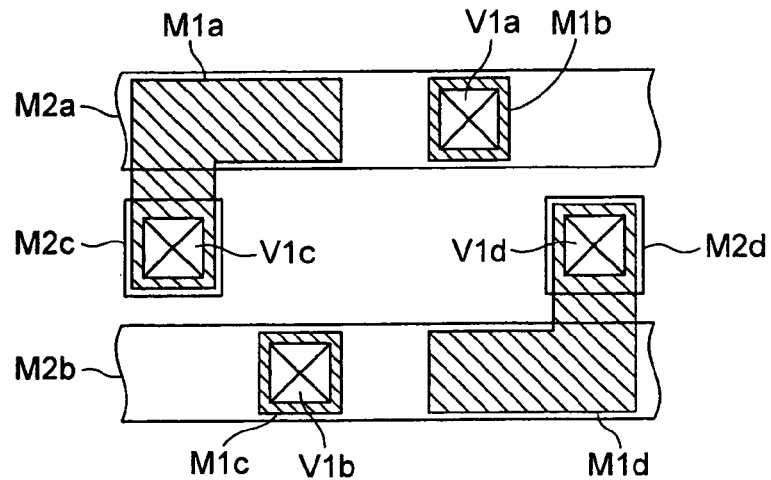
FIG. 15 is a diagram showing the layout drawing in FIG. 14 while classifying it on a per-layer basis.
Figure 15B:
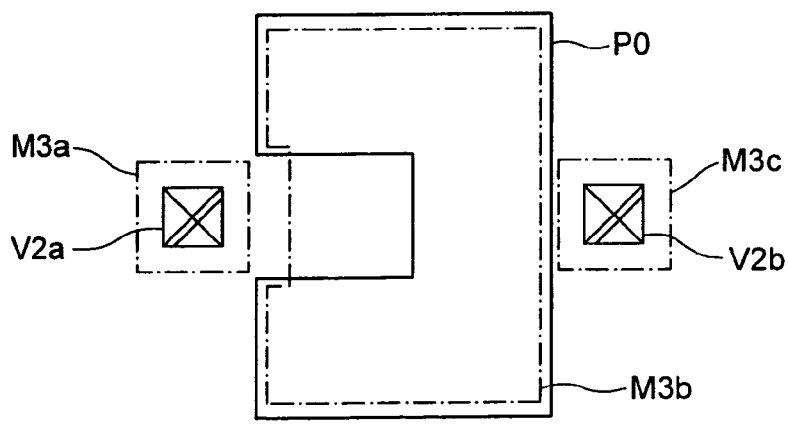
Figure 15C:
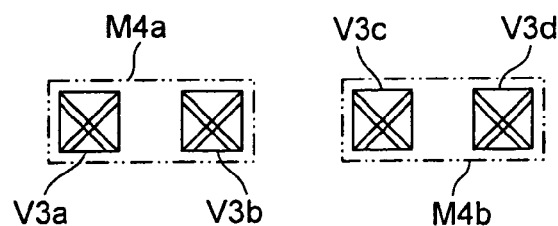
Figure 15C:
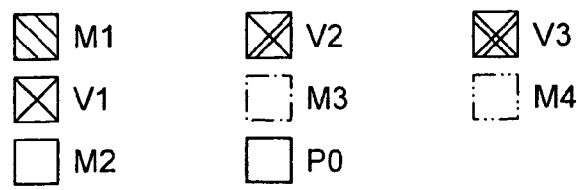

FIGS. 15(a) to (c) show the layout structure of FIG. 14 while dividing it into groups of several layers in an easy-to-see way. FIG. 15(a) shows a layout of some major layers covering from a first layer of metal wiring layer M1 up to a second layer of metal wiring layer M2; FIG. 15(b) shows a layout of main layers of from the layer of via holes V2 to the upper electrode P0; and FIG. 15(c) shows a layout of further upper layers. Note that since the layers underlying the wiring layer M1 are similar in layout and connection relationship to those of FIG. 6(a), (b) which is the above-stated embodiment, a drawing and its explanation are omitted here.

In this modification, as shown in FIG. 15(a), the wiring line M1a is formed to span from the upper part of via hole V0a to a mid portion of diffusion layer LN1 and diffusion layer LN2 and is then connected to wiring line M2c through via hole V1c. On the other hand, the wiring line M1b and via hole V1a are formed on the drain-side via hole V0b and connected to the wiring line M2a that is a bitline BL. Similarly the wiring line M1d is formed from the upper part of via hole V0d to a mid portion of diffusion layers LN1 and LN2; further, the via hole V1d is formed in wiring line M1d for connection to wiring line M2d. Additionally the wiring line M1c and via hole V1b are formed on the drain-side via hole V0c for connection to the wiring line M2b for use as a bitline /BL, which was formed to overlie the diffusion layer LN2 and wiring line M1d.

Additionally as shown in FIG. 15(b), the wiring line M2c shown in FIG. 15(a) is connected to the wiring line M3a through a via hole V2a. A via hole V2b is formed on wiring line M2d and coupled to wiring line M3b. Lastly as shown in FIG. 15(c), the wiring line M3a shown in FIG. 15(b) is connected through via hole V3a to wiring line M4a; further, the wiring line M4a is connected through via hole V3b to a wiring line M3b which is the lower electrode of capacitor C0. Similarly the wiring line M3c shown in FIG. 15(b) is connected through via hole V3d to wiring line M4b; further, the wiring line M4b is connected through via hole V3c to the upper electrode P0 of capacitor C0. In this modification thus arranged, the surface of dielectric film D0 is always covered with the upper electrode P0 at the photolithography step so that no contamination problems occur. Furthermore, since the contact is taken by the via hole V3b from the upper part of lower electrode M3b, any step-like difference which causes the stress or else does not take place at the lower electrode M3b. From the above features, it is possible to achieve capacitors with high reliability at good yields.

Figures 16A, 16B:
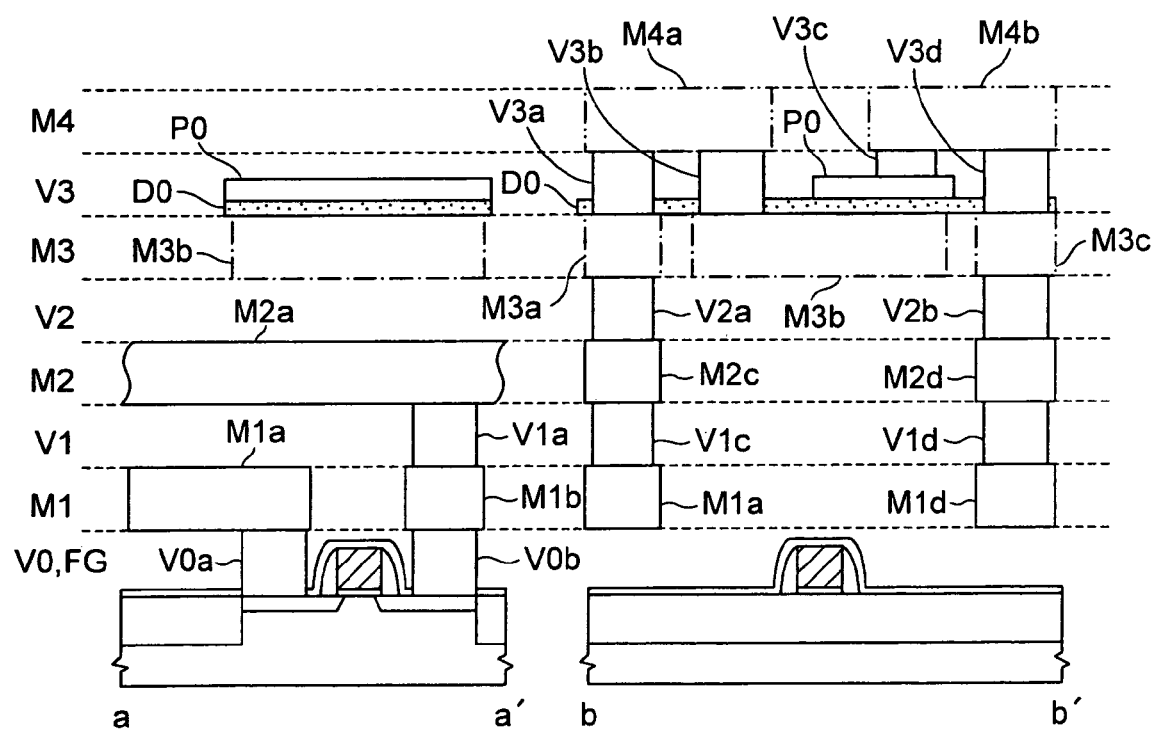
FIG. 16 is a sectional diagram of the memory cell in FIG. 14.
Figures 17A, 17B:
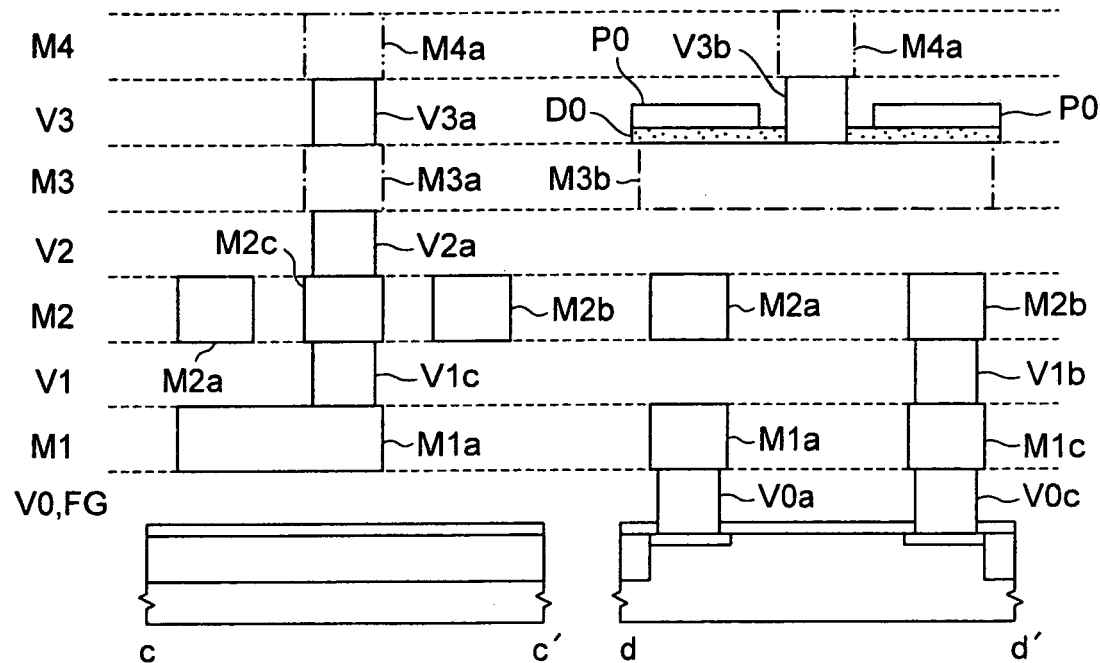
FIG. 17 is a sectional diagram of the memory cell in FIG. 14.
Figure 17C:
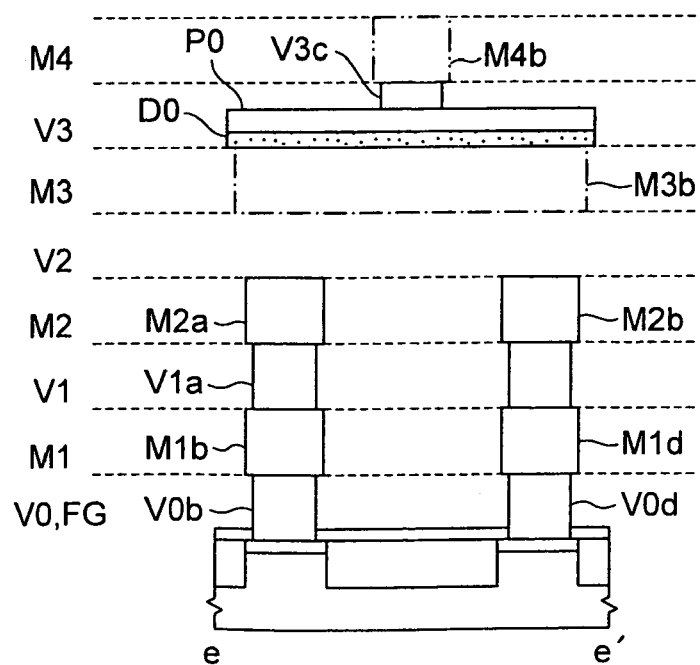

Subsequently, in order to make the above-stated connection relationship more understandable, the cross-sectional structure of the memory cell in the modification of FIG. 14, 15 is shown in FIGS. 16 and 17. FIGS. 16-17 show sectional structures taken from respective directions a-a', b-b', c-c', d-d' and e-e' in FIG. 14. FIG. 16(a) shows a cross-section a-a', from which it can be seen that the drain side of TN1 is connected through a via hole V0b, wiring line M1b and via hole V1a to a wiring line M2a that is a bitline /BL. The source side of TN1 is connected through via hole V0d to wiring line M1d. It can also be seen that a capacitor C0 consisting of a lower electrode M3b, dielectric film D0 and upper electrode P0 is formed above a bitline. Next, FIG. 16(b) shows a cross-section b-b', which indicates that a wiring line M1a which was drawn out of the source side of TN1 is connected to the wiring line M3b that is the lower electrode of capacitor C0 through a via hole V1c, wiring line M2c, via hole V2a, wiring line M3a, via hole V3a, wiring line M4a and via hole V3b. On the other hand, it shows that a wiring line M1d extended from the source side of TN2 is connected to the upper electrode P0 of capacitor C0 through a via hole V1d, wiring line M2d, via hole V2b, wiring line M3c, via hole V3d, wiring line M4b and via hole V3c. Next, FIG. 17(a) shows a cross-section c-c', wherein a wiring line M1a which was drawn out of TN1 is connected to wiring line M4a through via hole V1c, wiring line M2c, via hole V2a, wiring line M3a and via hole V3a. Next, FIG. 17(b) shows a cross-section d-d', from which it can be seen that the drain of TN2 is connected to the wiring line M2b that is a bitline /BL through via hole V0c, wiring line M1c and via hole V1b. The source side of TN1 is connected through via hole V0a to wiring line M1a. This diagram further shows that the dielectric film D0 is holed causing lower electrode M3b to be connected to wiring line M4a through via hole V3b. Lastly FIG. 17(c) shows a cross-section e-e', wherein the drain of TN1 is connected through via hole V0b, wiring line M1b and via hole V1a to the wiring line M2a that is a bitline BL. The source side of TN2 is coupled through via hole V0d to wiring line M1d. The upper electrode P0 is coupled through via hole V3c to wiring line M4b.

As apparent from the above explanation of FIGS. 14 to 17, the memory cell of this implementation is such that the upper electrode P0 is formed on the dielectric film D0 and then the dielectric film D0 is holed by etching to form the via hole V3b on the lower electrode M3b. With this technique, it is possible to form the capacitor C0 without using any barrier metals. It is also possible to minimize the stress of the capacitor while preventing creation of step-like differences at the lower electrode M3b. In short, it is possible to realize the memory cell using the capacitor with high reliability while reducing capacitor fabrication process costs. Obviously, various changes as to the memory cell layout and fabrication method are possible in a similar way to the embodiment stated supra. It is also obvious that the MIN capacitor set forth in this embodiment is applicable not only to memory cells but also to those for analog use and logic use.

Third Embodiment

Figure 18A:
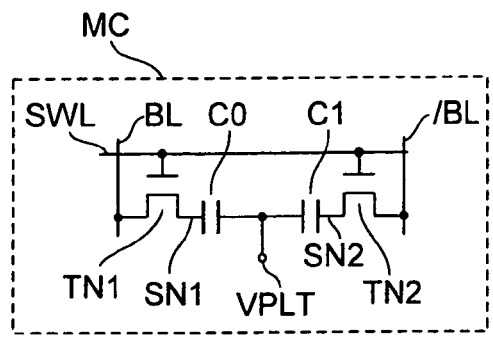
FIG. 18 is a third embodiment showing a circuit diagram of the memory cell of FIG. 3 and operation waveforms.
Figure 18B:
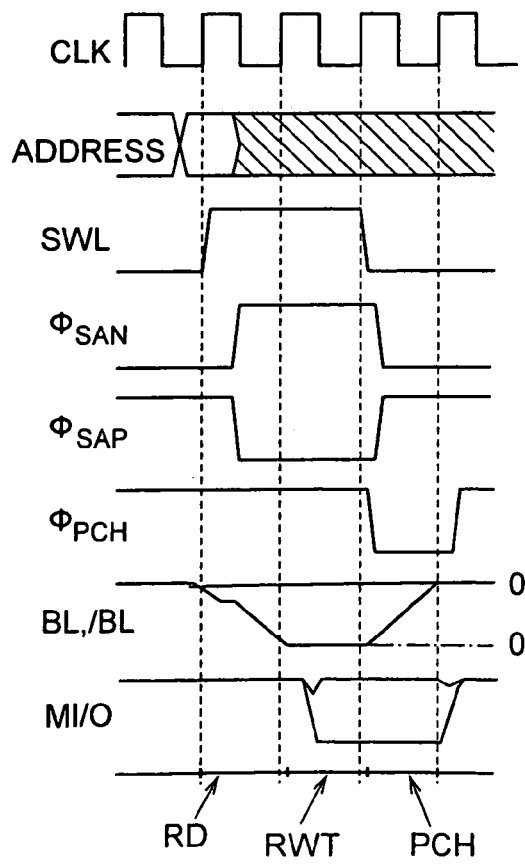
Figure 18C:
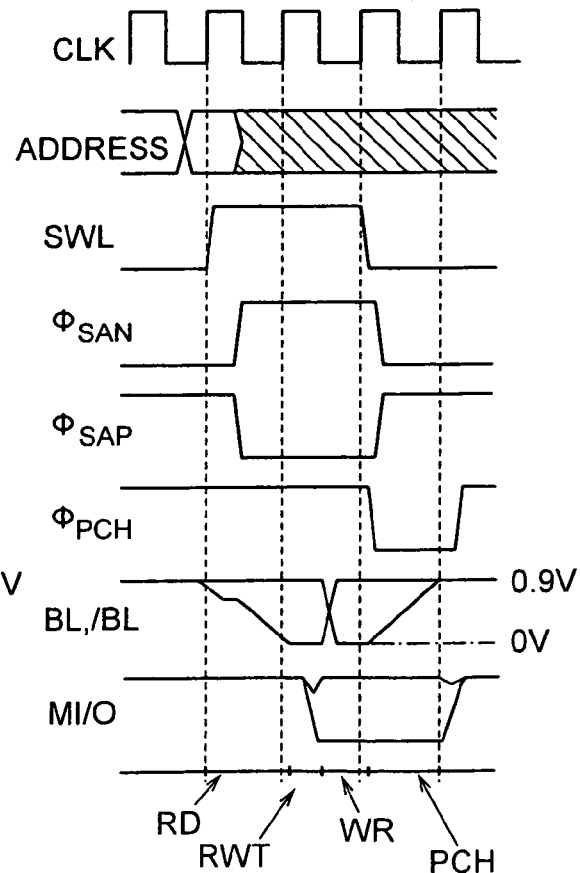

Although in the aforesaid embodiment the explanation was given while aiming at the memory cell made up of two transistors and one capacitor, an explanation will be given of the layout of a memory cell which is structured from two transistors and two capacitors in the next embodiment. In case no differences are found between one capacitor and two capacitors, handle them as a single carrier storage means. FIG. 18 depicts an arrangement with the memory cell MC in FIGS. 1 and 3 being modified to 2T2C. FIG. 18(a) is a circuit diagram, (b) shows operation waveforms during reading, and (c) shows operation waveforms during writing. The memory cell MC of this implementation is a 2T2C cell which consists essentially of two transistors TN1 and TN2 and two capacitors C0-C1. The drain of TN1 is connected to a bit line BL, and the source of TN1 is connected to one electrode of the capacitor C0 and then becomes a storage node SN1. Similarly the drain of TN2 is connected to a bit line /BL; the source of TN2 is coupled to the one electrode of capacitor C1 and becomes a storage node SN2. The remaining respective electrodes of capacitors C0-C1 are connected to a plate PLT, with the gates of TN1 and TN2 being coupled to a common word line SWL. Although the read and write waveforms of FIGS. 18(b) and (c) are basically similar to those of 2T1C so that a detailed explanation is omitted herein, the VDD precharge scheme is used in order to improve low-voltage operations for the same reason as that stated previously. Note that while the waveforms are shown here with the plate PLT being set at VSS, operations are also attainable with other potential levels. The 2T2C cell as used in this embodiment is capable of acquiring a larger signal mount than that of 1T1C cells as will be described later. Thus the cell is featured by being suitable for low-voltage operations as in 2T1C cells. In addition, since one end of a capacitor becomes the so-called plate electrode, it is possible to connect only the lower electrode of the capacitor electrodes to the diffusion layer of a transistor while permitting the plate side corresponding to its upper electrode to serve as a common wiring line. Due to this, there is a merit that the structure is simple and easy to fabricate when compared to 2T1C cells.

There is given below an explanation of the fact that the use of a 2T2C cell enables operations with 1V or less such as shown in FIG. 18. It is known that in the 2T2C cell, the amount of a read signal is given as:

$$Vsig = VBL - V/BL = VDD*Cs/(Cs+Cd) \quad (3)$$

Note that Cd is the parasitic capacitance of bitline BL, /BL. When comparing the right part of Equation (3) with that of Equation (1), it can be seen that VDD/2 in Equation (1) is replaced with VDD. This means that the signal amount becomes doubled when compared to 1T1C cells if the voltage and capacitance are the same. In other words, it is possible to attain the same signal amount with a half-reduced voltage. Another feature is that in the 2T1C cell shown in Equation (2), Cd is the half of Cd/2 so that the signal amount becomes much larger than 2T2C; however, low-voltage operations are attainable even in the 2T2C cell. For example, when calculating CD/CS for acquisition of Vsig of 0.2V or more while setting the power supply voltage at 0.9V in Equation (3), it can be seen that it is equal to or less than 3.5. This value is a practical value in design activities. In this way, according to this embodiment, it becomes possible, even at the time of a low-voltage operation with 1V or less, to retain a sufficient signal amount without unnecessarily dividing the bitlines. Obviously, the feature as to the applicability of the VDD (VSS) precharge scheme without the use of dummy cells is the same as the circumstances in 2T1C cells so that similar effects are obtainable. It is also similar to 2T1C cells that PMOS transistors are used as memory cell transistors to thereby improve the soft-error withstandability. It should be noted that although the 2T2C cell of this embodiment is capable of performing low-voltage operations as stated above, the signal amount under the same condition becomes smaller by a degree corresponding to the term of Cd when compared to 2T1C cells. In cases where the voltage is further lowered and/or the signal amount is required to increase depending upon the conditions of capacitances such as Cs and Cd, a larger signal amount is obtainable by driving the plate potential. More specifically, there is also employable a scheme for writing a signal into a storage node and thereafter applying a bias to the plate PLT to further increase an H level signal thus written, thereby improving the retention characteristics (regarding the scheme for applying a bias to plate PLT, this is recited for example in IEEE Journal of Solid State Circuits, October 1989, at pp. 1206 to 1212).

Figure 19:
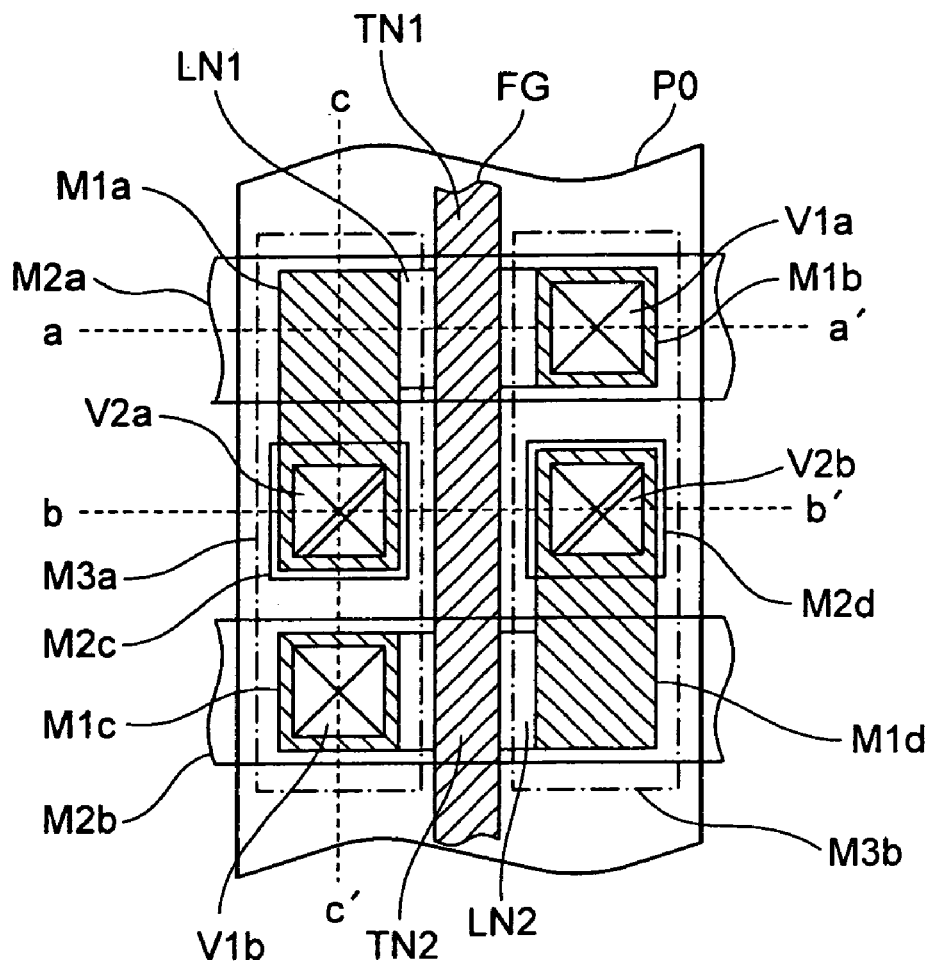
FIG. 19 is a diagram showing a layout of a memory cell in FIG. 18.
Figure 19:
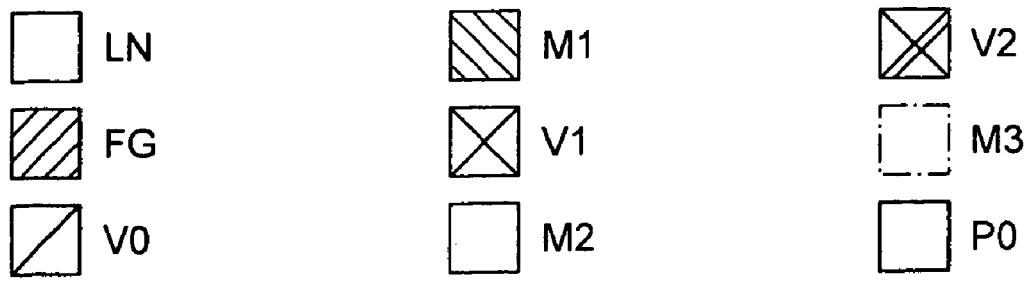
Figure 20A:
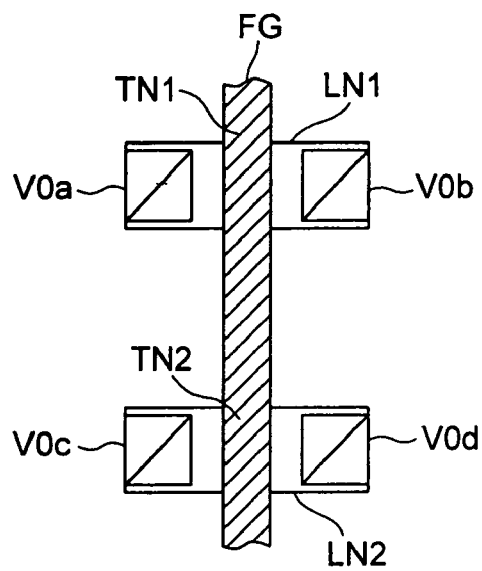
FIG. 20 is a diagram showing the layout drawing in FIG. 19 while classifying it on a per-layer basis.
Figure 20B:
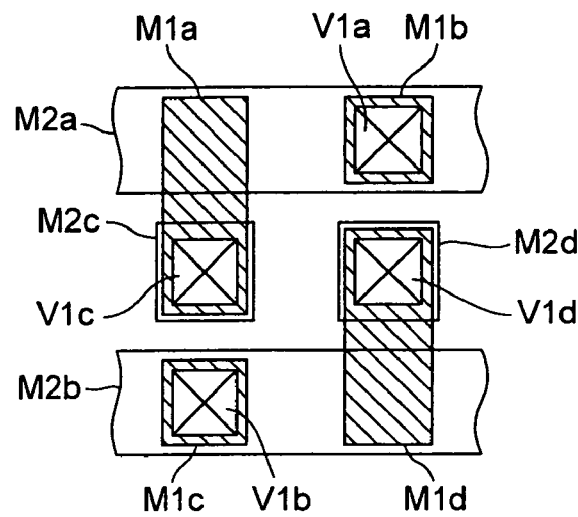
Figure 20C:
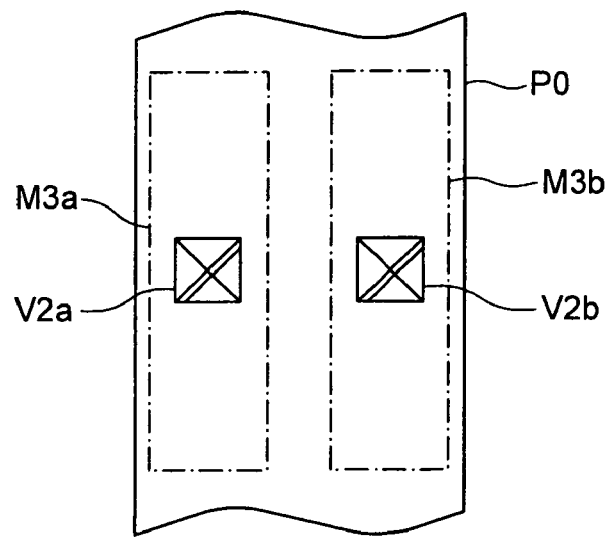
Figure 20C:
Figure 20C:
Figure 20C:
Figure 20C:
Figure 20C:
Figure 20C:
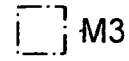
Figure 20C:
Figure 20C:
Figure 20C:

An explanation will next be given of a layout method for using a MIM capacitor to realize the memory cell of FIG. 18 with high integration at low costs, along with a fabrication method thereof. FIG. 19, 20 shows a 2T2C cell layout, and FIG. 21 shows its fabrication method. In FIG. 19, the source of TN1 is connected to a wiring line M3a that is the lower electrode of a capacitor C0 through a via hole V0a, wiring line M1a, via hole V1c, wiring line M2c and via hole V2a so that a storage node SN1 is formed. On the other hand, the source side of TN2 is connected to a wiring line M3b that is the lower electrode of a capacitor C1 through a via hole V0d, wiring line M1d, via hole V1d, wiring line M2d and via hole V2b, thus forming a storage node SN2. The drain of TN1 is connected to a wiring line M2a that is a bitline BL through a via hole V0b, wiring line M1b and via hole V1a. The drain of TN2 is coupled to a wiring line M2b for use as a bitline /BL through a via hole V0c, wiring line M1c and via hole V1b. An upper electrode corresponding to the plate PLT is formed by a P0 layer as an electrode for common use. Although the wiring line of plate PLT is sharable by not only two capacitors C0-C1 within one cell but also other cells, the plate PLT (upper electrode P0) may be shared by those memory cells sharing a wordline when driving the plate PLT as stated previously.

FIG. 20 shows the layout structure of FIG. 19 while dividing it into groups of several layers in an easy-to-see way, which indicates some major layers covering from a layer of the via holes V2 to the upper electrode P0. Since the layers underlying a wiring layer M2 are similar in layout and connection relationship to those of FIG. 6(a), (b) which is the above-noted embodiment, a drawing and its explanation are omitted herein.

In this embodiment, as shown in FIG. 20, the wiring line M2c thus fabricated is connected through via hole V2a to the wiring line M3a that is the lower electrode of capacitor C0. Similarly the wiring line M2d thus formed is coupled through via hole V2b to the wiring line M3b that is the lower electrode of capacitor C1. In this way, this embodiment is arranged so that connection is done to the lower electrode of capacitor C0, C1 through a wiring line M1 which is extended from one end of each diffusion layer LN1, LN2 up to a mid portion of the diffusion layers. This makes it possible to fabricate the bitline BL, /BL above the diffusion layers, thus enabling reduction of the memory cell area.

Figures 21A, 21B:
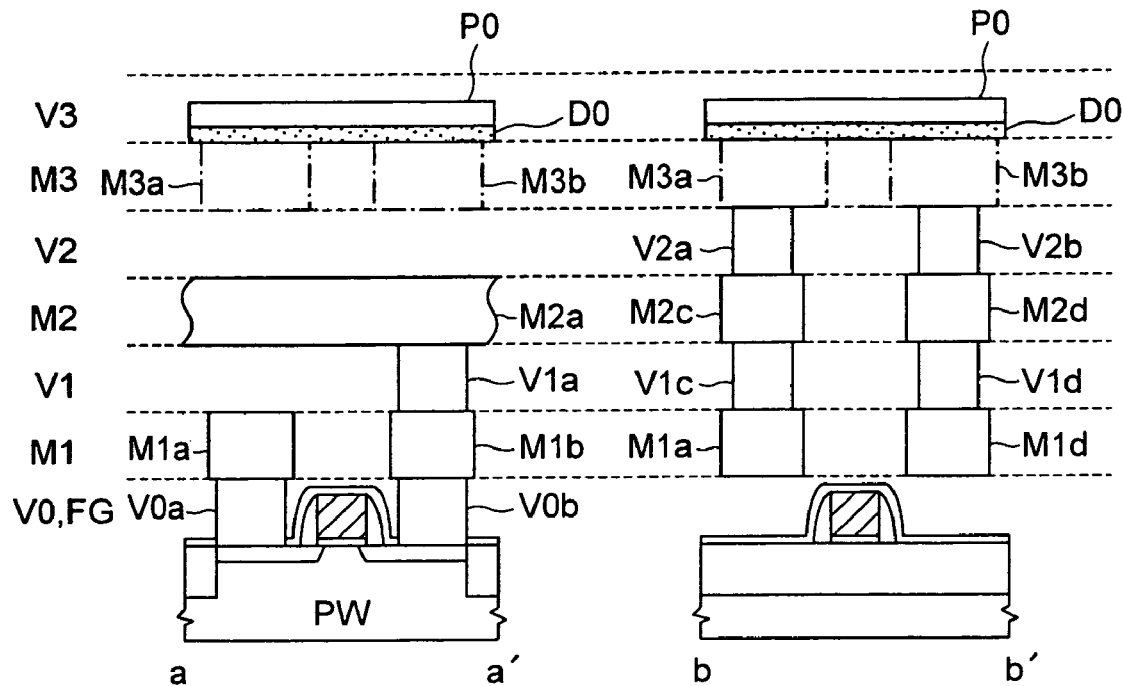
FIG. 21 is a sectional diagram of the memory cell in FIG. 19.
Figure 21C:
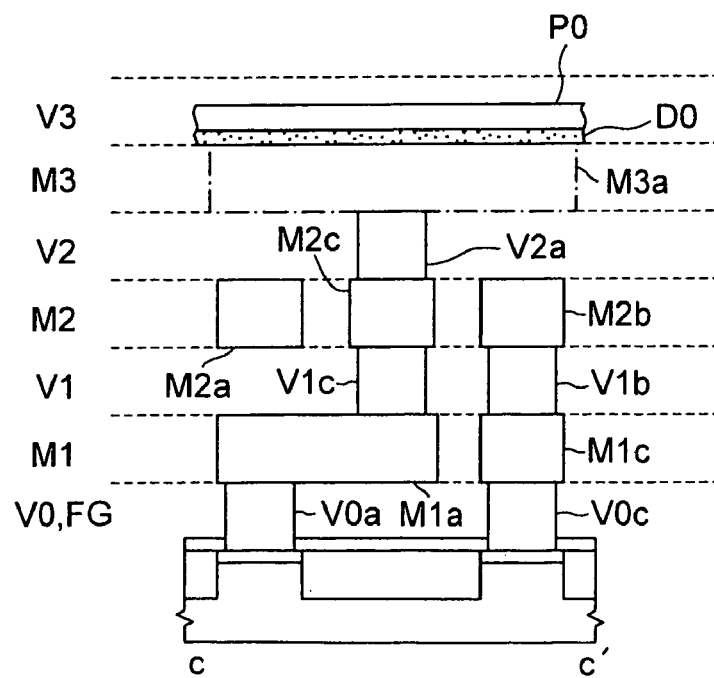

Subsequently, in order to make the above-stated connection relationship more understandable, the cross-sectional structure of the memory cell in FIG. 19, 20 is shown in FIG. 21. FIG. 21 shows sectional structures taken from respective directions a-a', b-b' and c-c' in FIG. 19. FIG. 21(a) shows a cross-section a-a', from which it can be seen that the drain of TN1 is connected through via hole V0b, wiring line M1b and via hole V1a to the wiring line M2a that is a bitline BL. The source side of TN1 is connected through via hole V0a to wiring line M1a. Next, FIG. 21(b) shows a cross-section b-b', which indicates that the wiring line M1a that was drawn out of the source side of TN1 is connected to the wiring line M3a that is the lower electrode of capacitor C0 through via hole V1c, wiring line M2c and via hole V2a. On the other hand, it shows that the wiring line M1d extended from the source side of TN2 is connected through via hole V1d, wiring line M2d and via hole V2b to the wiring line M3b that is the lower electrode of capacitor C1. Lastly FIG. 21(c) shows a cross-section c-c', indicating that the source of TN1 is connected to the wiring line M3a that is the lower electrode through the wiring line M1a extended from via hole V0a, via hole V1c, wiring line M2c and via hole V2a. The drain side of TN2 is coupled through via hole V0c, wiring line M1c and via hole V1b to wiring line M2b for use as a bitline /BL. Note that although not specifically depicted here, the upper electrode P0 of this implementation is connected to the plate PLT and is fixed to a specified voltage of Vss, for example.

As apparent from the above explanation of FIGS. 18 to 21, the memory cell of this implementation offers features of using a wiring layer as a capacitor and using a capacitor with the planar structure, in addition to the feature of forming a capacitor above a bitline to thereby enable achievement of a cell capacitance sufficient for low-voltage operations. Thus it is possible to realize a memory low in process costs in a similar way to the embodiments with 2T1C cells. Although not specifically explained in this embodiment, it is obvious that the embodiment explained in FIGS. 5 to 17 is applicable to the 2T2C cell of this implementation, and that similar effects to those of 2T1C are obtainable in respective schemes. It is also self-evident that the memory cell of this implementation is modifiable in various ways without departing from the concept thereof, including changes as to circuit operations such as letting a wordline slightly decrease from 0V in a standby mode, and alterations as to the capacitor structure and fabrication techniques. Furthermore, it is definitely needless to say that the MIM capacitor of this implementation is applicable not only to memory cells but also to elements for analog use and logic use. With the above-noted features, it is possible to achieve an LSI with reduced process costs.

Fourth Embodiment

Although in the above embodiments there has been shown the case where two upper and lower metal electrodes are used to form a capacitor to thereby constitute either a 2T1C cell or a 2T2C cell, when the miniaturization progresses resulting in a decrease in memory cell area, it will occasionally happen that the use of only one capacitor makes it impossible to sufficiently retain the cell capacitance required. If this is the case, a plurality of MIM structure capacitors are provided in a multiplexed way and connected together in parallel, thereby making it possible to attain a sufficiently large effective capacitor area even when the memory cell area is small.

Figure 22:
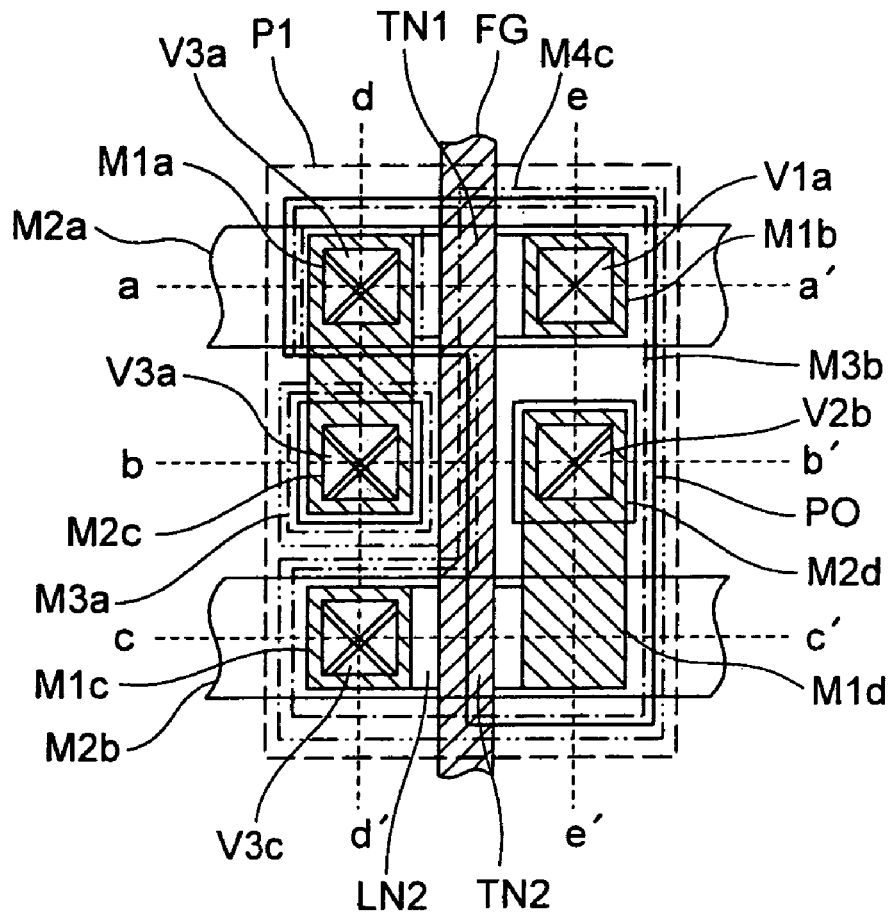
FIG. 22 is a modification showing a layout of the memory cell of FIG. 4.
Figure 22:
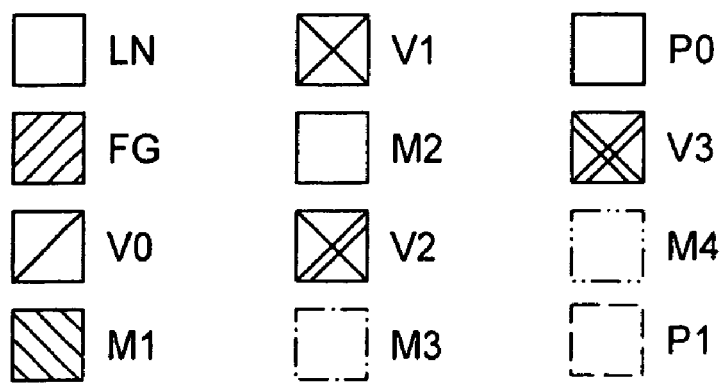

An embodiment using 2T1C cells is shown in FIGS. 22 to 25. FIG. 22, 23 shows a layout, and FIGS. 24-25 show a fabrication method. Note that as will be described later, a similar method is applicable to 2T2C cells. In other cells also, such as for example 1T1C cells, the same scheme is employable in order to increase the capacitance of a capacitor without increasing the area. Optionally, when applying to a capacitor for stabilization of analog circuitry and/or power supply, it is possible to obtain an effect such as a decrease in area with respect to the same capacitance or an increase in capacitance with the same area.

In these drawings, a feature lies in that a capacitor C0 is formed by using a wiring line M3 and a layer of via holes V3, and that another capacitor C1 is formed above the capacitor C0 by use of a wiring line M4 and a layer of via holes V4. By connecting these two capacitors in parallel with each other to make up a 2T1C cell, it is possible to achieve a large cell capacitance without having to increase the memory cell area.

In FIG. 22, the source of TN1 is connected to the upper electrode P1 of capacitor C1 through a via hole V0a, wiring line M1a, via hole V1c, wiring line M2c, via hole V2a, wiring line M3a, via hole V3b and wiring line M4b; further, its upper electrode P1 is connected through a wiring line M4a and via hole V3a to the upper electrode P0 of capacitor C0 so that a storage node SN1 is formed. On the other hand, the source of TN2 is connected to a wiring line M3b that is the lower electrode of capacitor C0 through a via hole V0d, wiring line M1d, via hole V1d, wiring line M2d and via hole V2b; further, the lower electrode M3b is connected through a via hole V3c to a wiring line M4c that is the lower electrode of capacitor C1, thereby forming a storage node SN2. The drain of TN1 is connected to a wiring line M2a that is a bitline BL through a via hole V0b, wiring line M1b and via hole V1a. The drain of TN2 is coupled to a wiring line M2b that is a bitline /BL through a via hole V0c, wiring line M1c and via hole V1b.

Figure 23A:
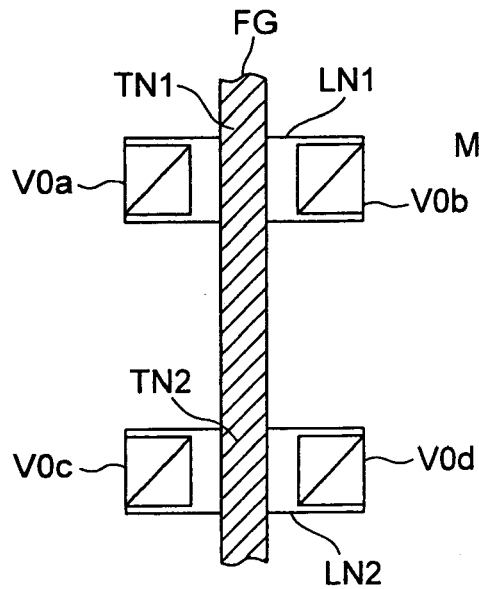
FIG. 23 is a diagram showing the layout drawing in FIG. 22 while classifying it on a per-layer basis.
Figure 23B:
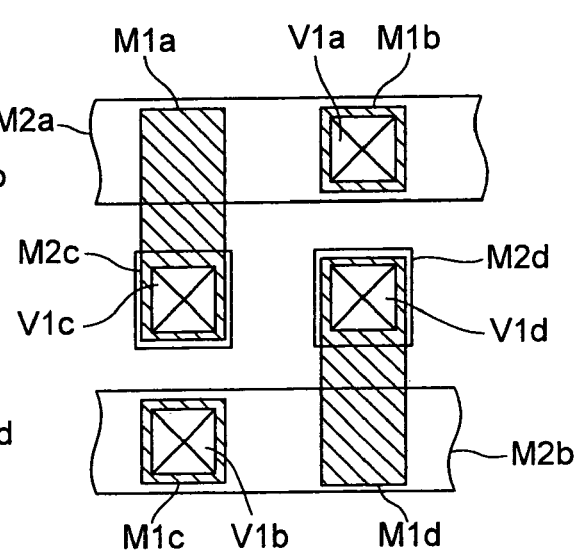
Figure 23C:
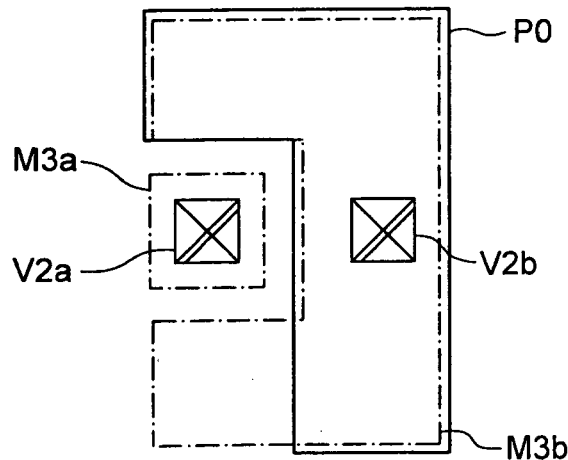
Figure 23D:
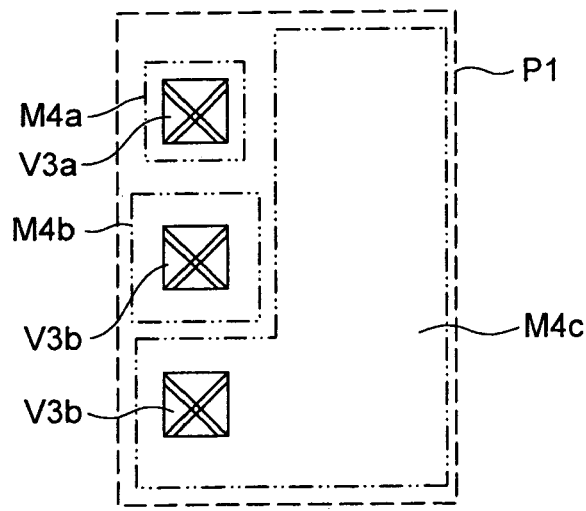

FIG. 23(a), (b) shows the layout structure of FIG. 22 while dividing it into groups of several layers in an easy-to-see way. FIG. 23(a) shows those layers covering from a layer of via holes V2 to the upper electrode P0; FIG. 23(b) shows some major layers of from a layer of via holes V3 to the upper electrode P1. Since main layers underlying the via holes V2 are similar in layout and connection relationship to those of FIG. 6(a), (b) which is the above-stated embodiment, a drawing and its explanation are omitted here.

In this embodiment, as shown in FIG. 23(a), the wiring line M2c thus fabricated is connected through via hole V2a to wiring line M3a. Similarly the wiring line M2d thus formed is coupled through via hole V2b to the wiring line M3b that is the lower electrode of capacitor C0. Next, as shown in FIG. 23(b), the wiring line M3a shown in FIG. 23(a) is connected through via hole V3b and wiring line M4b to the upper electrode P1 of capacitor C1. Furthermore, the upper electrode P1 is connected through wiring line M4a and via hole V3a to the upper electrode P0 of capacitor C0 shown in FIG. 23(a). The wiring line M3b that is the lower electrode shown in FIG. 23(a) is connected through via hole V3c to the wiring line M4c that is the lower electrode of capacitor C1. In this way, this embodiment is arranged so that two capacitors C0-C1 are connected in parallel to thereby make up a 2T1C cell. Thus it is possible to sufficiently achieve the cell capacitance required for low-voltage operations even when the memory cell area is small.

Figures 25A, 25B:
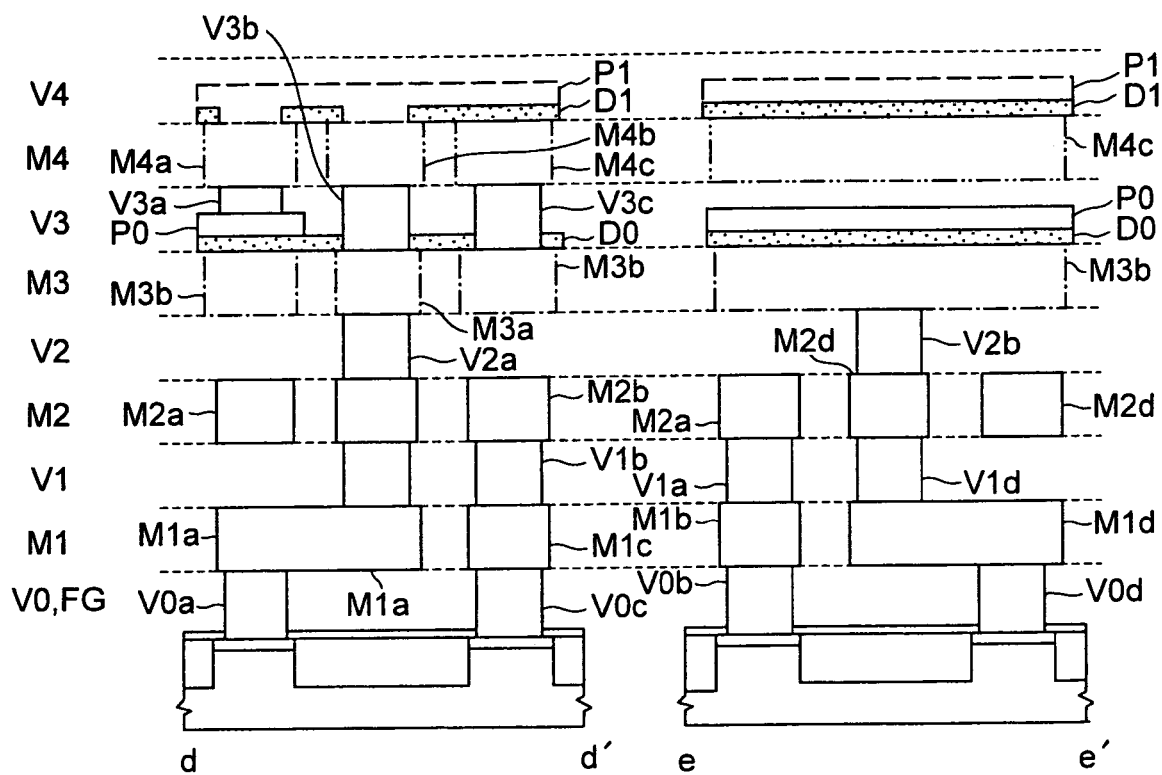
FIG. 25 is a sectional diagram of the memory cell in FIG. 23.

Subsequently, in order to make the above-explained connection relationship more understandable, the cross-sectional structure of the memory cell in FIG. 22, 23 is shown in FIGS. 24-25. FIG. 24 shows sectional structures taken from respective directions a-a', b-b' and c-c' in FIG. 22. FIG. 25 shows sectional structures taken from respective directions d-d' and e-e' in FIG. 22. FIG. 24(a) shows a cross-section a-a', from which it can be seen that the drain of TN1 is connected through a via hole V0b, wiring line M1b and via hole V1a to the wiring line M2a that is a bitline BL. The source side of TN1 is coupled through via hole V0a to wiring line M1a. The upper electrode P0 of capacitor C0 thus formed is connected through via hole V3a and wiring line M4a to the upper electrode P1 of capacitor C1. Next, FIG. 24(b) shows a cross-section b-b', which indicates that the wiring line M1a drawn out of the source side of TN1 is connected to the upper electrode P1 of capacitor C1 through via hole V1c, wiring line M2c, via hole V2a, wiring line M3a, via hole V3b and wiring line M4b. The wiring line M1d extended from the source side of TN2 is connected to the wiring line M3b that is the lower electrode of capacitor C0 through via hole V1d, wiring line M2d and via hole V2b. Next, FIG. 24(c) shows a cross-section c-c', from which it can be seen that the drain of TN2 is connected through via hole V0c, wiring line M1c and via hole V1b to the wiring line M2b that is a bitline /BL. The source side of TN2 is connected through via hole V0d to wiring line M1d. The lower electrode M3b of capacitor C0 which was formed above the bitline is connected through via hole V3c to the wiring line M4c that is the lower electrode of capacitor C1. Next, FIG. 25(a) shows a cross-section d-d', wherein the source of TN1 is connected to the upper electrode P1 of capacitor C1 through the wiring line M1a drawn out of via hole V0a, via hole V1c, wiring line M2c, via hole V2a, wiring line M3a, via hole V3b and wiring line M4b; further, the upper electrode P1 is coupled through wiring line M4a and via hole V3a to the upper electrode P0 of capacitor C0. The drain side of TN2 is connected to the wiring line M2b that is a bitline /BL through via hole V0c, wiring line M1c and via hole V1b. The lower electrode M3b of capacitor C0 is connected through via hole V3c to the lower electrode M4c of capacitor C1. Lastly FIG. 25(b) shows a cross-section e-e', wherein the source of TN2 is connected to the wiring line M3b that is the lower electrode of capacitor C0 through the wiring line M1d drawn out of via hole V0d, via hole V1d, wiring line M2d and via hole V2b. The drain side of TN1 is connected to the wiring line M2a that is a bitline BL through via hole V0b, wiring line M1b and via hole V1a.

As apparent from the above explanation of FIGS. 22 to 25, the memory cell of this implementation is such that the capacitor C0 is formed at the wiring layer M3 and the layer of via holes V3 while forming the capacitor C1 at the wiring layer M4 and the layer of via holes V4 to thereby provide a parallel connection of two capacitors. Whereby, even when the memory cell capacitor area becomes smaller due to miniaturization, it is possible to sufficiently attain the cell capacitance required for low-voltage operations. Furthermore, since two capacitors are disposed above TN1, TN2 in a multiplex fashion, it is possible to realize a highly integrated memory while using two capacitors. It should be noted that in the memory cell of this implementation, the feature of using a wiring layer as the capacitor electrode is principally the same as that of the embodiments explained in FIGS. 5 to 17 so that it is obvious that similar effects to those of the embodiments of FIGS. 5 to 17 are obtainable. It is also obvious that the memory cell layout method and capacitor fabrication method or the like of this implementation are modifiable in various ways in a similar way to the embodiments stated supra. Moreover, it is obvious that three capacitors may be connected in parallel, rather than two capacitors as in this implementation. In such case, it is possible to acquire a further increased cell capacitance.

Figure 26:
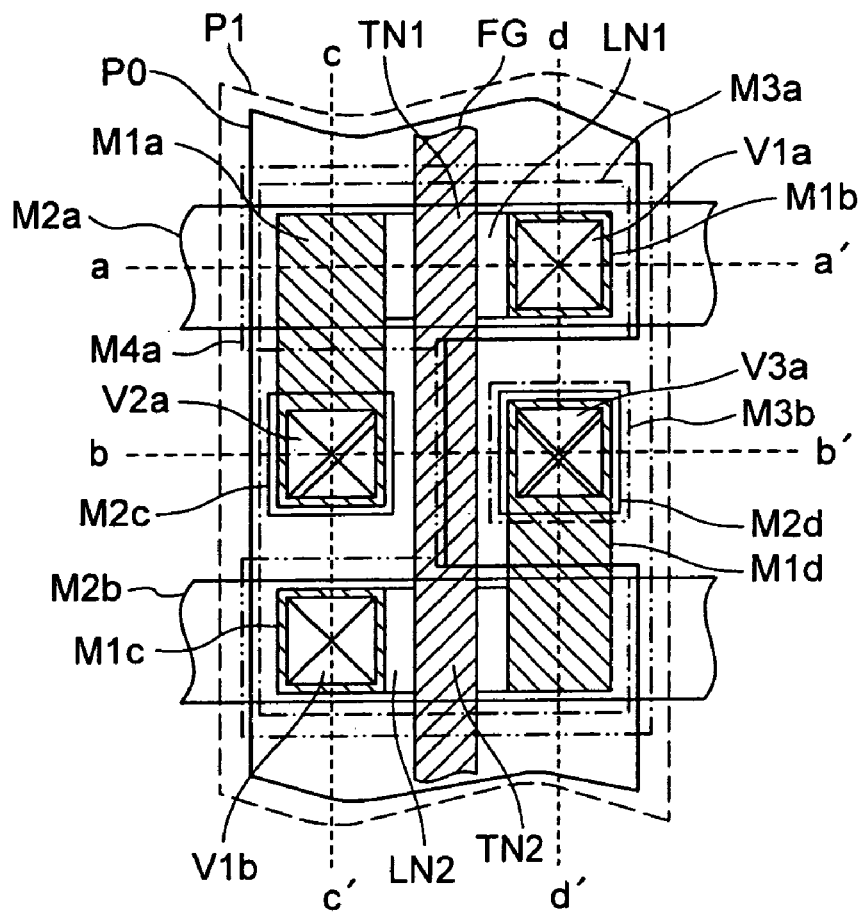
FIG. 26 is a modification showing a layout of the memory cell of FIG. 18.
Figure 26:
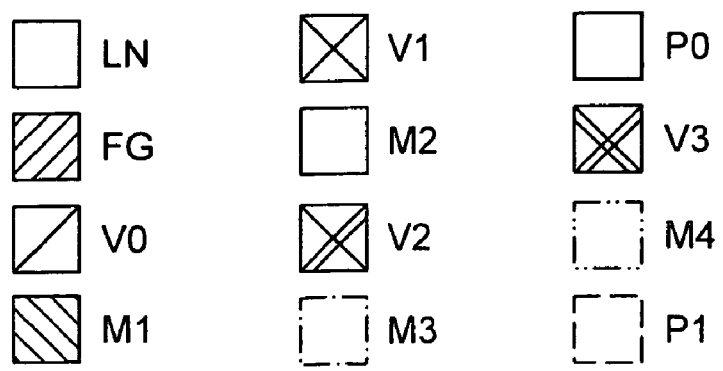
Figures 27A, 27B:
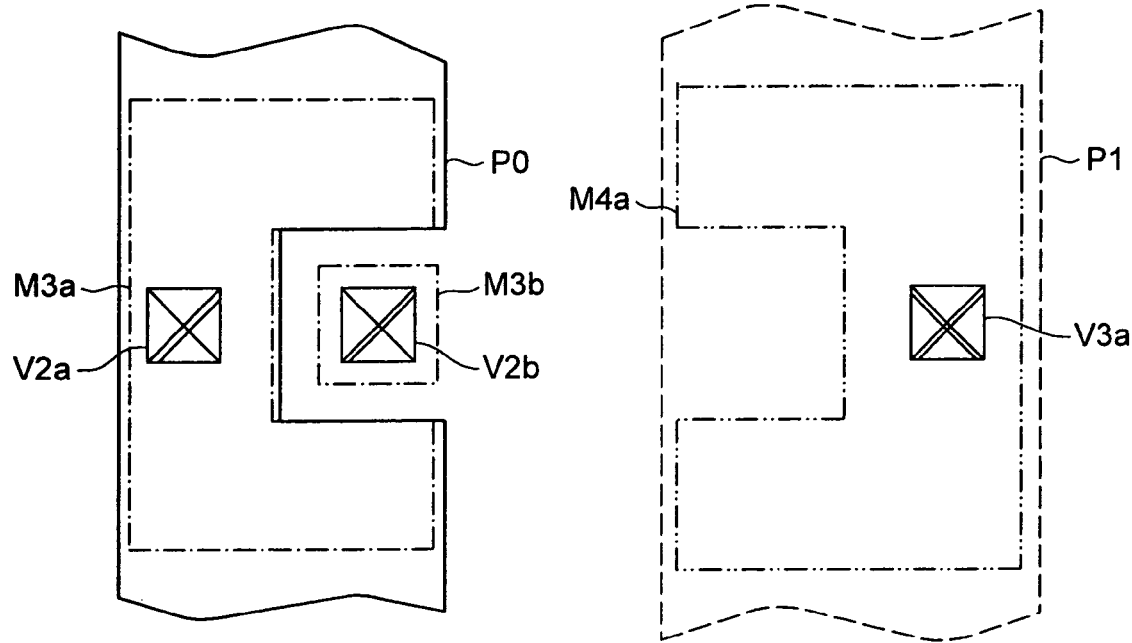
FIG. 27 is a diagram showing the layout drawing in FIG. 26 while classifying it on a per-layer basis.

Although in FIGS. 22 to 25 there is shown the example which uses the multiplexed capacitors to form a 2T1C cell, the same scheme is also applicable to a case which uses a 2T2C cell shown in FIGS. 26 to 28.

FIG. 26, 27 shows a 2T2C cell layout, and FIG. 28 is a cross-sectional diagram showing a fabrication method. In these drawings, a capacitor C0 is formed using a wiring line M3 and a layer of via holes V3; then, another capacitor C1 is formed above the capacitor C0 by use of a wiring layer M4 and a layer of via holes V4. By using these two capacitors to make up a 2T2C cell, it is possible to sufficiently retain the cell capacitance required for low-voltage operations without increasing the memory cell area.

In FIG. 26, the source of TN1 is connected to a wiring line M3*a* that is the lower electrode of capacitor C0 through a via hole V0*a*, wiring line M1*a*, via hole V1*c*, wiring line M2*c* and via hole V2*a* so that a storage node SN1 is formed. On the other hand, the source of TN2 is connected to a wiring line M4*a* that is the lower electrode of capacitor C1 through a via hole V0*d*, wiring line M1*d*, via hole V1*d*, wiring line M2*d*, via hole V2*b*, wiring line M3*b* and via hole V3*a*, thus forming a storage node SN2. The drain of TN1 is connected through a via hole V0*b*, wiring line M1*b* and via hole V1*a* to a wiring line M2*a* that is a bitline BL. The drain of TN2 is coupled through a via hole V0*c*, wiring line M1*c* and via hole V1*b* to a wiring line M2*b* that is a bitline /BL.

FIG. 27(*a*), (*b*) shows the layout structure of FIG. 26 by dividing it into several layer groups in an easy-to-see way, which indicates in FIG. 27(*a*) some major layers covering from the layer of via holes V2 to the upper electrode P0 while showing in FIG. 23(*b*) main layers spanning from the layer of via holes V3 to the upper electrode P1. As some layers underlying the via holes V2 are similar in layout and connection relationship to those of FIG. 6(*a*), (*b*) which is the above-stated embodiment, a drawing and its explanation are omitted here.

In this example, as shown in FIG. 27(*a*), the wiring line M2*c* thus fabricated is connected through a via hole V2*a* to the wiring line M3*a* that is the lower electrode of capacitor C0. Similarly the wiring line M2*d* thus formed is connected through a via hole V2*b* to wiring line M3*b*. Next, as shown in FIG. 27(*b*), the wiring line M3*b* shown in FIG. 27(*a*) is connected through via hole V3*a* to the wiring line M4*a* that is the lower electrode of capacitor C1. In this way this example is arranged so that two capacitors C0-C1 are laid out in a multiplex fashion. Accordingly, each capacitor can occupy a memory cell region formed of TN1, TN2. Thus it is possible to provide a sufficiently large effective capacitor area.

Subsequently, in order to make the above-stated connection relationship more understandable, the cross-sectional structure of the memory cell in FIG. 26, 27 is shown in FIG. 28. FIG. 28 shows sectional structures taken from respective directions a-a', b-b', c-c' and d-d' in FIG. 26. FIG. 28(*a*) shows a cross-section a-a', from which it can be seen that the drain of TN1 is connected through a via hole V0*b*, wiring line M1*b* and via hole V1*a* to the wiring line M2*a* that is a bitline BL. The source side of TN1 is connected through a via hole V0*a* to wiring line M1*a*. It can also be seen that the capacitor C0 and capacitor C1 are formed above the bitline. Next, FIG. 28(*b*) shows a cross-section b-b', which indicates that a wiring line M1*a* drawn out of the source side of TN1 is connected through a via hole V1*c*, wiring line M2*c* and via hole V2*a* to the wiring line M3*a* that is the lower electrode of capacitor C0. On the other hand, a wiring line M1*d* extended from the source side of TN2 is connected through a via hole V1*d*, wiring line M2*d*, via hole V2*b*, wiring line M3*b* and via hole V3*a* to a wiring line M4*a* that is the lower electrode of capacitor C1. Next, FIG. 28(*c*) shows a cross-section c-c', wherein the source of TN1 is connected to a wiring line M3*a* that is the lower electrode of capacitor C0 through a wiring line M1*a* drawn out of via hole V0*a*, a via hole V1*c*, wiring line M2*c* and via hole V2*a*. The drain side of TN2 is connected through via hole V0*c*, wiring line M1*c* and via hole V1*b* to a wiring line M2*b* that is a bitline /BL. Lastly FIG. 28(*d*) shows a cross-section d-d', wherein the source of TN2 is connected to a wiring line M4*a* that is the lower electrode of capacitor C0 through a wiring line M1*d* extended from via hole V0*d*, a via hole V1*d*, wiring line M2*d*, via hole V2*b*, wiring line M3*b* and via hole V3*a*. The drain side of TN1 is connected to the wiring line M2*a* that is a bitline BL through a via hole V0*b*, wiring line M1*b* and via hole V1*a*.

As apparent from the explanations of FIGS. 26 to 28, the memory cell of this implementation is arranged to form the capacitor C0 at the wiring layer M3 and the layer of via holes V3 while forming the capacitor C1 at the wiring layer M4 and the layer of via holes V4. Whereby, it is possible to sufficiently retain the cell capacitance even for a small memory cell region, which in turn makes it possible to achieve a memory with low-voltage operability. In addition, since two capacitors are laid out above a memory cell in a multiplex fashion, it is possible to achieve a highly integrated memory while using two capacitors. It should be noted that in the memory cell of this implementation, the feature of using wiring layers as capacitor electrodes is basically the same as that of the embodiments shown in FIGS. 5 to 17 so that it is obvious that similar effects to those of the embodiments of FIGS. 5 to 17 are obtainable. It is also obvious that the memory cell layout method and capacitor fabrication method or the like of this implementation are modifiable in various ways in a similar way to the embodiments stated supra.

Although in the embodiment of FIGS. 22 to 28 there was indicated the example which disposes two capacitors above one memory cell in a multiplex fashion to thereby form either a 2T1C cell or 2T2T cell, the capacitor multiplexing method may include a technique for using a structure shown in FIGS. 29 to 33 to achieve the memory cell.

Figure 29:
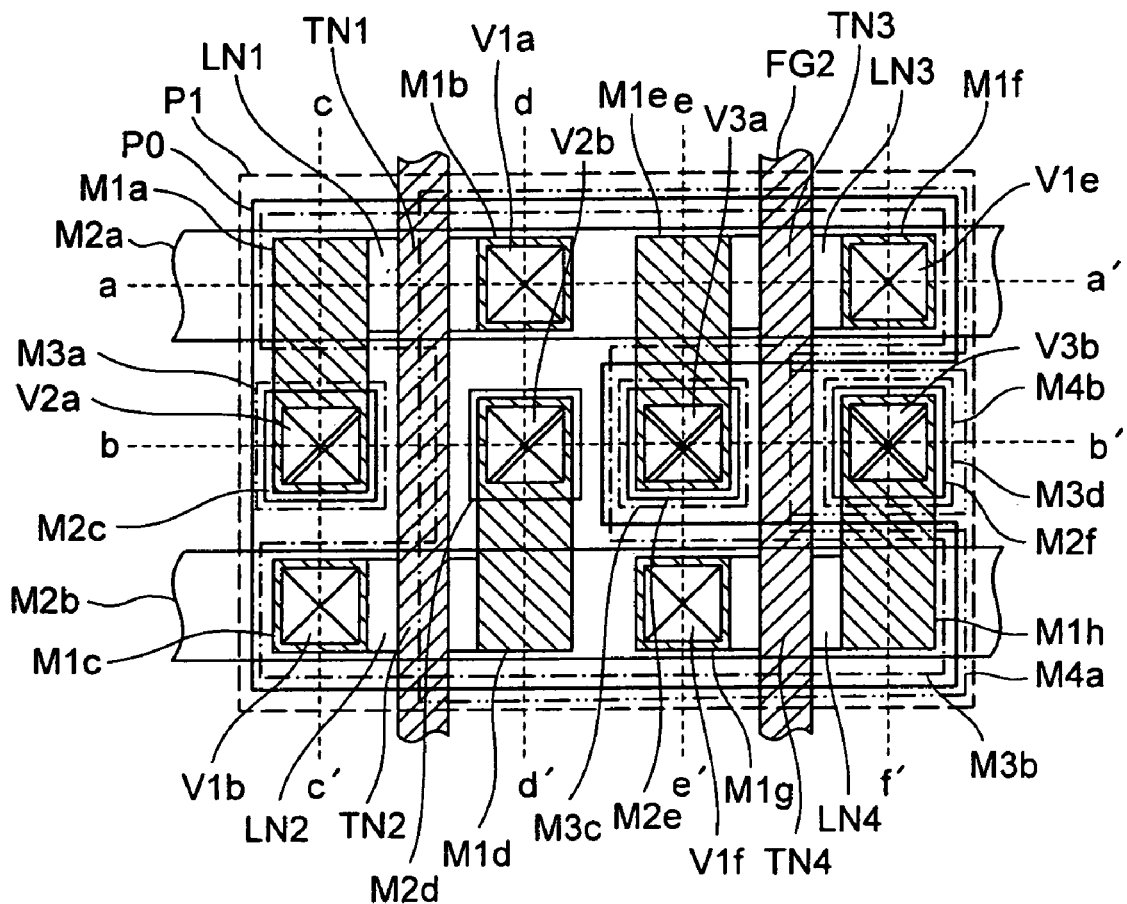
FIG. 29 is a modification showing a layout of the memory cell of FIG. 18.
Figure 29:
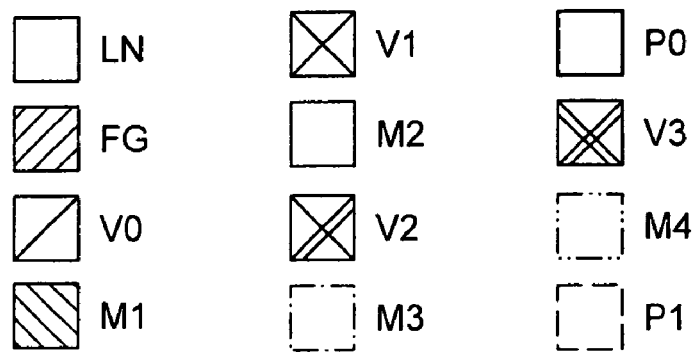

FIG. 29, 30, 31 shows a 2T1C cell layout, and FIGS. 32-33 show a fabrication method. In these drawings, a capacitor C0 is formed by using a wiring layer M3 and a layer of via holes V3; then, another capacitor C1 is formed above the capacitor C0 using a wiring layer M4 and a layer of via holes V4. Furthermore, two capacitors are disposed in the regions overlying two neighboring memory cells MC0-MC1. By forming two multiplexed capacitors by use of two cell regions in this way, it is possible to sufficiently retain the cell capacitance required for low-voltage operations without having to increase the memory cell area.

In FIG. 29, there are shown the memory cell MC1 that is constituted from TN1, TN2 and capacitor C0 and the memory cell MC1 made up of TN3, TN4 and capacitor C1. Note here that the storage node of memory cell MC0 is denoted as SN1, SN2, while that of memory cell MC1 is as SN3, SN4.

In the memory cell MC0, the source of TN1 is connected to the upper electrode P0 of capacitor C0 through a via hole V0a, wiring line M1a, via hole V1c, wiring line M2c, via hole V2a and wiring line M3a so that the storage node SN1 is formed. On the other hand, the source of TN2 is connected to a wiring line M3b that is the lower electrode of capacitor C0 through a via hole V0d, wiring line M1d, via hole V1d, wiring line M2d and via hole V2b, thus forming the storage node SN2. The drain of TN1 is connected to a wiring line M2a that is a bitline BL through a via hole V0b, wiring line M1b and via hole V1a, whereas the drain of TN2 is coupled to a wiring line M2b that is a bitline /BL through via hole V0c, wiring line M1c and via hole V1b.

Similarly in the memory cell MC1, the source of TN3 is connected to a wiring line M4a that is the lower electrode of capacitor C1 through a via hole V0e, wiring line M1e, via hole V1g, wiring line M2e, via hole V2c, wiring line M3c and via hole V3a whereby the storage node SN3 is formed. On the other hand, the source of TN4 is connected to the upper electrode P1 of capacitor C1 through a via hole V0h, wiring line M1h, via hole V1h, wiring line M2f, via hole V2d, wiring line M3d, via hole V3b and wiring line M4b, thus forming the storage node SN4. The drain of TN3 is connected to the wiring line M2a that is a bitline BL through a via hole V0f, wiring line M1f and via hole V1e. The drain of TN4 is coupled to the wiring line M2b that is a bitline /BL through via hole V0g, wiring line M1g and via hole V1f.

Figure 30A:
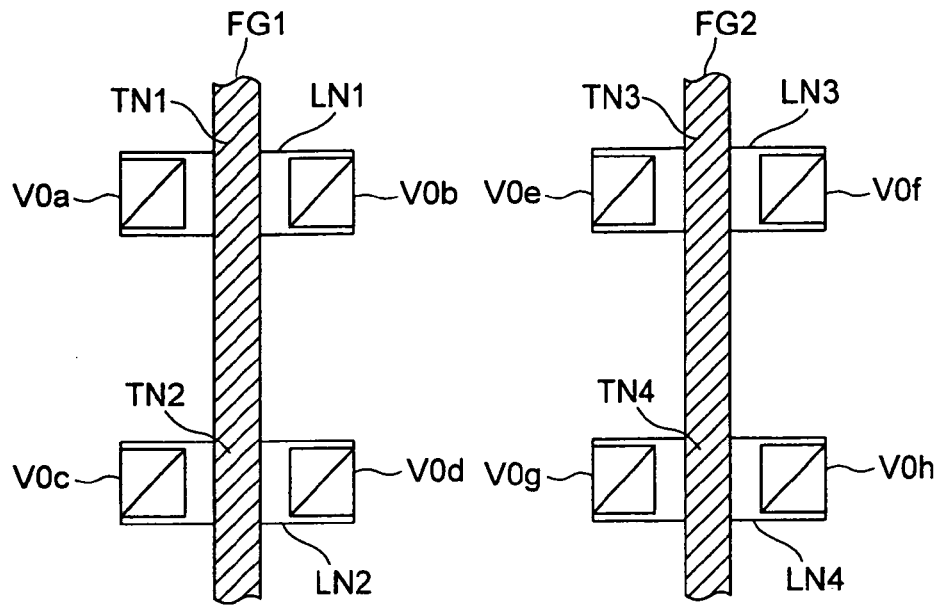
FIG. 30 is a diagram showing the layout drawing in FIG. 29 while classifying it on a per-layer basis.
Figure 30B:
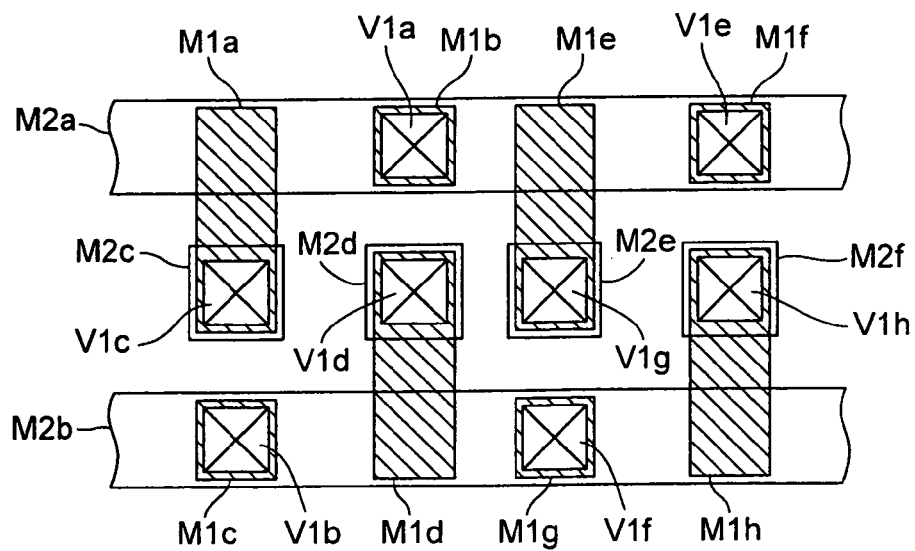
Figure 30B:
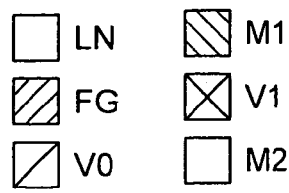
Figure 31A:
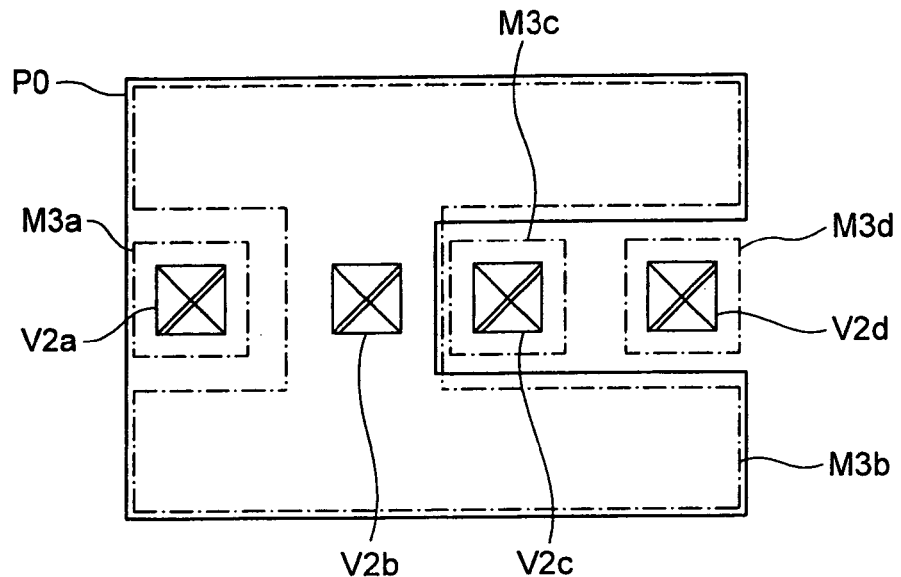
FIG. 31 is a diagram showing the layout drawing in FIG. 29 while classifying it on a per-layer basis.
Figure 31B:
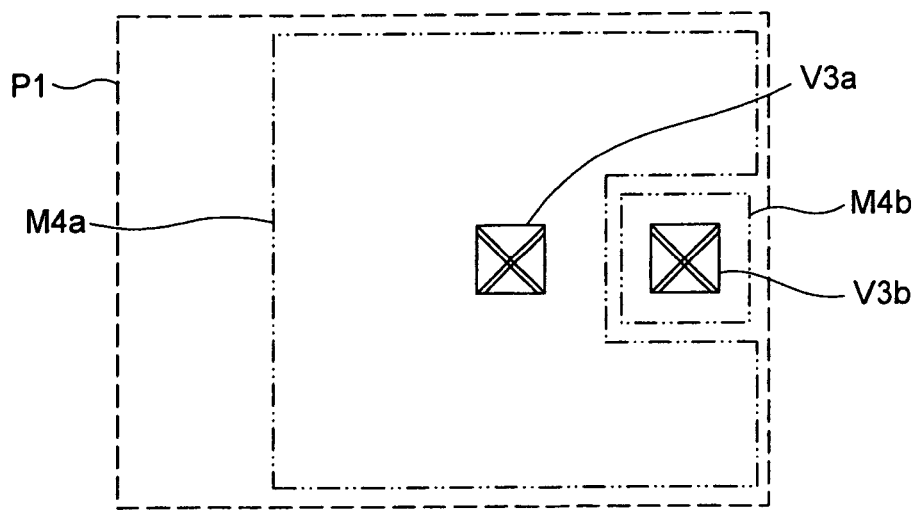
Figure 31B:
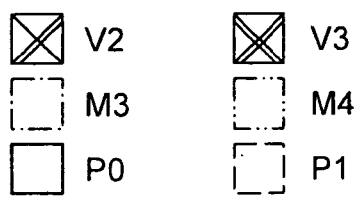

FIG. 30, 31 shows the layout structure of FIG. 29 while dividing it into several layer groups in an easy-to-see way, wherein FIG. 30(a) shows some major layers covering up to the via holes V0, FIG. 30(b) shows main layers covering from the wiring layer M1 to wiring layer M2, FIG. 31(a) shows layers of from the layer of via holes V2 to the upper electrode P0, and FIG. 31(b) shows layers above the layer of via holes V3. Since some layers underlying the via holes V2 are similar in layout and connection relationship to those of FIG. 6(a), (b) which is the above-stated embodiment, an explanation of FIG. 30 is omitted herein.

Next, as shown in FIG. 31(a), the wiring line M2c shown in FIG. 30(b) is connected to the upper electrode P0 of capacitor C0 through a via hole V2a and wiring line M3a. A wiring line M2d is connected through via hole V2b to a wiring line M3b that is the lower electrode of capacitor C0. On the other hand, a wiring line M2e is connected to a wiring line M4a that is the lower electrode of capacitor C1 through a via hole V2c, wiring line M3c and via hole V3a. A wiring line M2f is coupled to the upper electrode P1 of capacitor C1 through a via hole V2d, wiring line M3d, via hole V3b and wiring line M4b. In this way, two capacitors C0-C1 are multiplexed and laid out in this structure. Furthermore, since respective capacitors can occupy the regions of two neighboring memory cells MC0-MC1 with, it is possible to sufficiently retain the effective capacitor area.

Subsequently, in order to make the above-stated connection relationship more understandable, the cross-sectional memory cell structure in FIG. 30, 31 is shown in FIGS. 32-33. FIG. 32 shows sectional structures taken from respective directions a-a' and b-b' in FIG. 29. FIG. 33 shows sectional structures taken from respective directions c-c', d-d', e-e' and f-f' in FIG. 29.

Figure 32A:
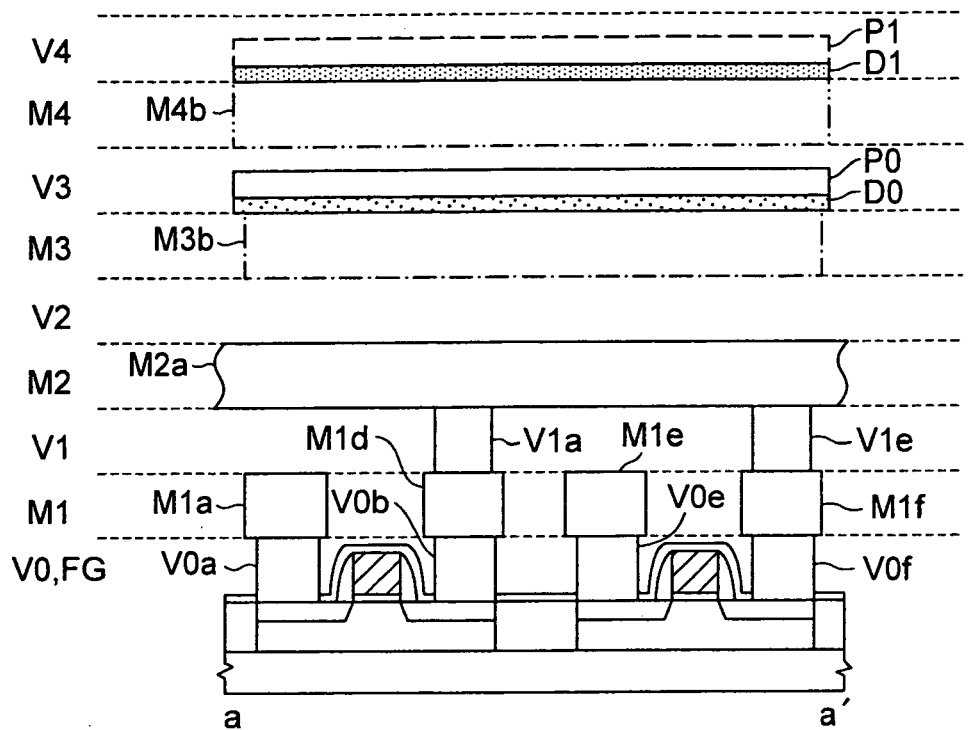
FIG. 32 is a sectional diagram of the memory cell in FIG. 29.
Figure 32B:
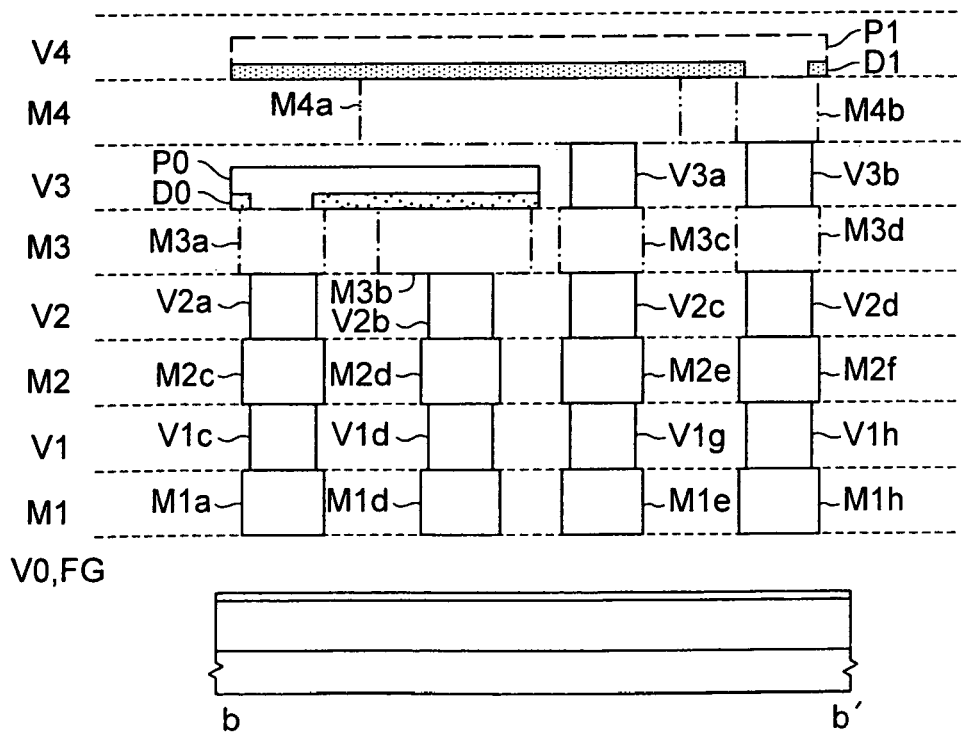

FIG. 32(a) shows a cross-section a-a', wherein the drain of TN1 is connected to the wiring line M2a that is a bitline BL through a via hole V0b, wiring line M1b and via hole V1a. Similarly the drain of TN3 is connected to the wiring line M2a that is a bitline BL through a via hole V0f, wiring line M1f and via hole V1e. Additionally the capacitor C0 and capacitor C1 are formed at mutually different layers over the bitlines. Next, FIG. 32(b) shows a cross-section b-b', wherein a wiring line M1a drawn out of the source side of TN1 is connected to the upper electrode P0 of capacitor C0 through a via hole V1c, wiring line M2c, via hole V2a and wiring line M3a. On the other hand, a wiring line M1d extended from the source side of TN2 is connected to a wiring line M3b that is the lower electrode of capacitor C0 through a via hole V1d, wiring line M2d and via hole V2b.

Figures 33A, 33B:
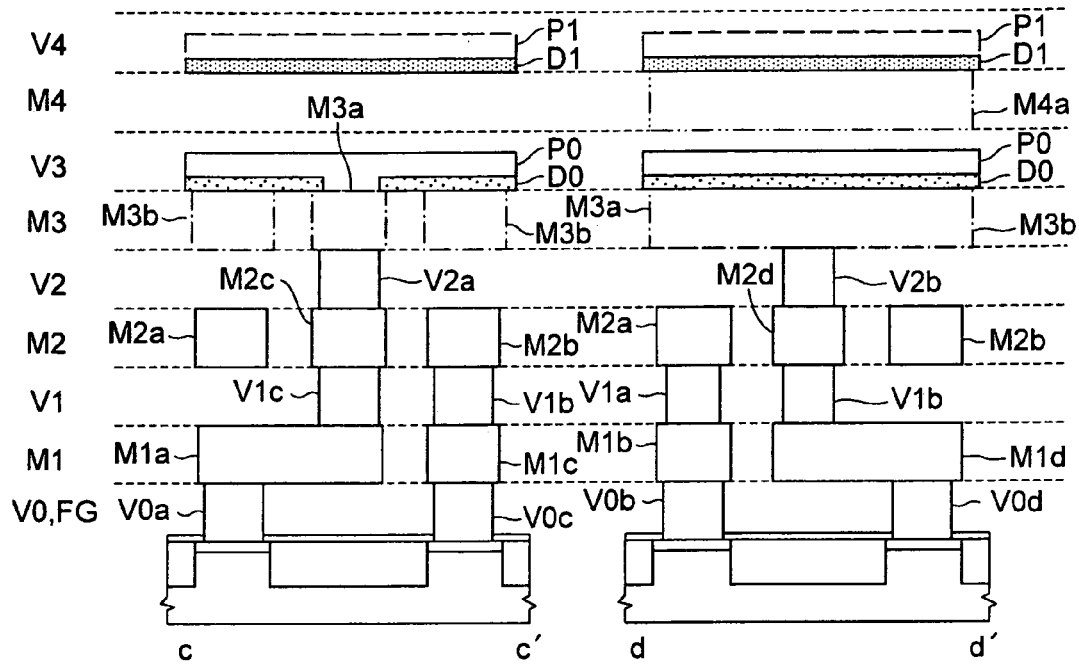
FIG. 33 is a sectional diagram of the memory cell in FIG. 29.

Similarly, a wiring line M1e drawn out of the source side of TN3 is connected to a wiring line M4a that is the lower electrode of capacitor C1 through a via hole V1g, wiring line M2e, via hole V2c, wiring line M3c and via hole V3a. On the other hand, a wiring line M1h extended from the source side of TN4 is connected to the upper electrode P1 of capacitor C1 through a via hole 1h, wiring line M2f, via hole V2d, wiring line M3d, via hole V3b and wiring line M4b. Next, FIG. 33(a) shows a cross-section c-c', wherein the source of TN1 is connected to the upper electrode P0 of capacitor C0 through a wiring line M1a drawn out of the via hole V0a, a via hole V1c, wiring line M2c, via hole V2a and wiring line M3a. The drain side of TN2 is coupled to a wiring line M2b that is a bitline /BL through via hole V0c, wiring line M1c and via hole V1b. Next, FIG. 33(b) shows a cross-section d-d', wherein the source of TN2 is connected to a wiring line M3b that is the lower electrode of capacitor C0 through a wiring line M1d drawn from the via hole V0d, a via hole V1d, wiring line M2d and via hole V2b. The drain of TN1 is coupled to a wiring line M2a that is a bitline BL through via hole V0b, wiring line M1b and via hole V1a.

Figures 33C, 33D:
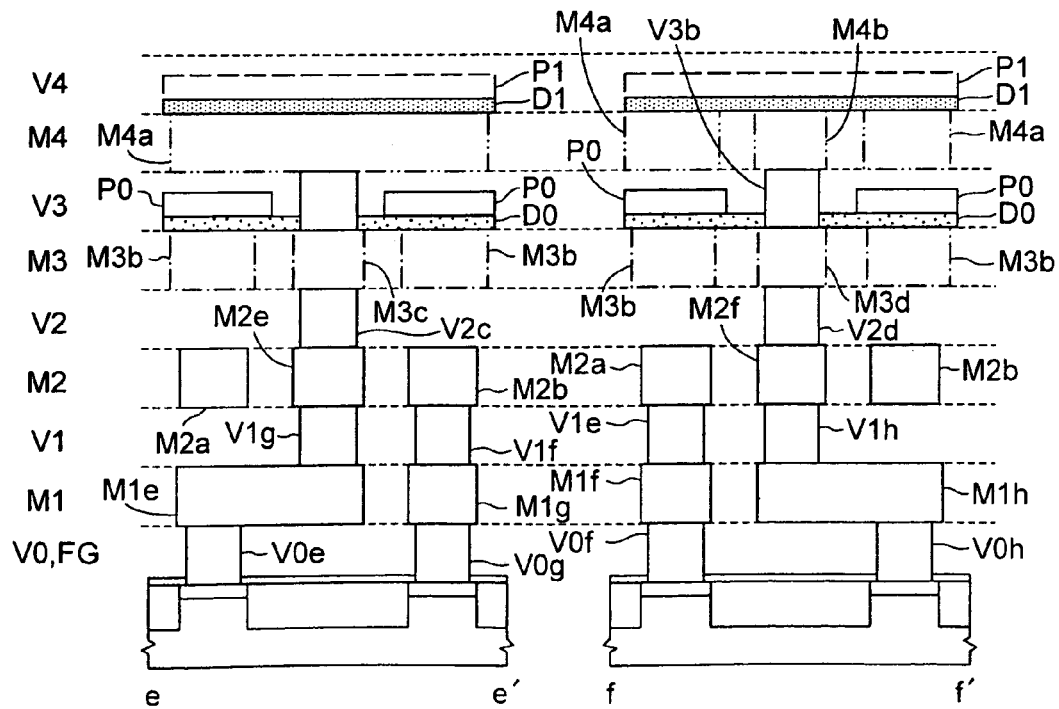

Next, FIG. 33(c) shows a cross-section e-e', wherein the source of TN3 is connected to a wiring line M4a that is the lower electrode of capacitor C1 through a wiring line M1e drawn out of via hole V0e, a via hole V1g, wiring line M2e, via hole V2c, wiring line M3c and via hole V3a. The drain side of TN4 is connected to the wiring line M2b that is a bitline /BL through a via hole V0g, wiring line M1g and via hole V1f. Lastly FIG. 33(d) shows a cross-section f-f, wherein the source of TN4 is connected to the upper electrode P1 of capacitor C1 through a wiring line M1h drawn from via hole V0h, a via hole V1h, wiring line M2f, via hole V2d, wiring line M3d, via hole V3b and wiring line M4b. The drain side of TN3 is coupled to the wiring line M2a that is a bitline BL through via hole V0f, wiring line M1f and via hole V1e.

As apparent from the above explanations of FIGS. 30 to 33, this embodiment is such that at the memory cell MC0, the wiring layer M3 and the layer of via holes V3 are used to form the capacitor C0. In such event, the upper part of its neighboring memory cell MC1 also is used to sufficiently enlarge the effective area of the capacitor C0. Similarly the memory cell MC1 is such that the wiring layer M4 and the layer of via holes V4 are used to form the capacitor C1 while also utilizing the upper part of the neighboring memory cell MC0 to sufficiently enlarge the effective area of capacitor C1. With such an arrangement, it is possible to retain a much larger cell capacitance, thus enabling achievement of low-voltage operations. In addition, by multiplexing the capacitor C0 and capacitor C1 while using the regions of two memory cells, it is possible to achieve a highly integrated memory without increasing the areas of memory cells. Note here that although in this embodiment there was shown the example which utilizes the region of a neighboring memory cell in the bitline direction to form a capacitor, it is obvious that the present invention is not limited thereto. It is self-evident that the regions of neighboring memory cells in the wordline direction may be used to form two capacitors. It is also permissible to combine this example with the example shown in FIG. 22—in such case, a much larger cell capacitance is attainable. As apparent from the foregoing, the memory cell layout method and capacitor fabrication method or the like of this invention are modifiable in various ways without departing from the scope of the invention in a similar way to that of the embodiments stated supra.

Although in FIGS. 30 to 33 the structure is shown which uses the regions of two neighboring memory cells to multiplex the capacitors to thereby form 2T1C cells, this is also applicable to a case which uses 2T2C cells shown in FIGS. 34 to 37.

Figure 34:
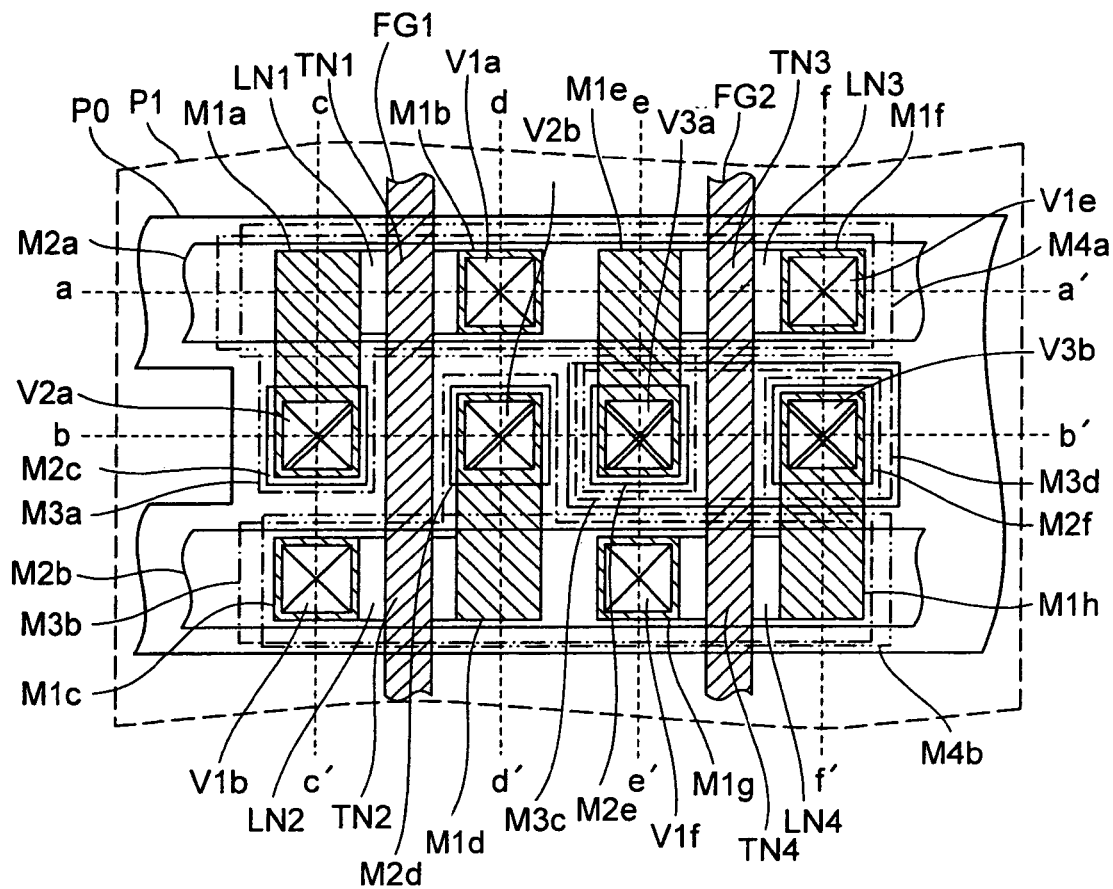
FIG. 34 is a modification showing a layout of the memory cell in FIG. 18.
Figure 34:
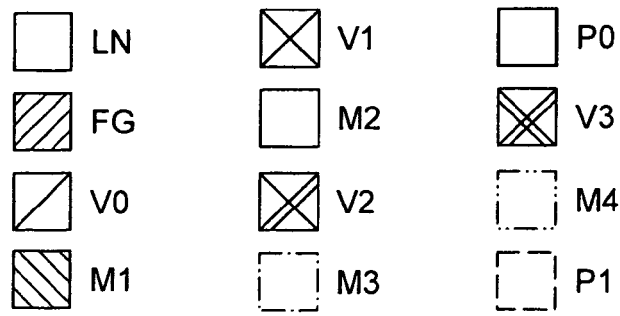

FIG. 34, 35 shows a 2T2C cell layout, and FIGS. 36-37 are sectional diagrams showing a fabrication method. In these drawings, a wiring layer M3 and a layer of via holes V3 are used to form capacitors C0-C1, thereby making up a memory cell MC0. Additionally a wiring layer M4 and a layer of via holes V4 are used to form capacitors C2-C3 to thereby construct a memory cell MC1. Furthermore, four capacitors are disposed in the regions overlying two neighboring memory cells MC0-MC1. When such multiplexed capacitors are formed using the two cell regions, it is possible to sufficiently retain the cell capacitance required for low-voltage operations without increasing the areas of such memory cells.

In FIG. 34, there are shown the memory cell MC0 constituted from TN1, TN2, capacitor C0 and capacitor C1 and the memory cell MC1 made up of TN3, TN4, capacitor C2 and capacitor C3. In the memory cell MC0, the source of TN1 is connected through a via hole V0a, wiring line M1a, via hole V1c, wiring line M2c and via hole V2a to a wiring line M3a that is the lower electrode of capacitor C0 so that a storage node SN1 is formed. On the other hand, the source of TN2 is connected through a via hole V0d, wiring line M1d, via hole V1d, wiring line M2d and via hole V2b to a wiring line M3b that is the lower electrode of capacitor C1, thus forming a storage node SN2. The drain of TN1 is connected through a via hole V0b, wiring line M1b and via hole V1a to a wiring line M2a that is a bitline BL. The drain of TN2 is coupled through a via hole V0c, wiring line M1c and via hole V1b to a wiring line M2b that is a bitline /BL.

Similarly in the memory cell MC1, the source of TN3 is connected to a wiring line M4a that is the lower electrode of capacitor C2 through a via hole V0e, wiring line M1e, via hole V1g, wiring line M2e, via hole V2c, wiring line M3c and via hole V3a so that a storage node SN3 is formed. The source of TN4 is connected to a wiring line M4b that is the lower electrode of capacitor C3 through a via hole V0h, wiring line M1h, via hole V1h, wiring line M2f, via hole V2d, wiring line M3d and via hole V3b, thus forming a storage node SN4. The drain of TN3 is connected through a via hole V0f, wiring line M1f and via hole V1e to a wiring line M2a that is a bitline BL. The drain of TN4 is coupled through a via hole V0g, wiring line M1g and via hole V1f to a wiring line M2b that is a bitline /BL.

Figure 35A:
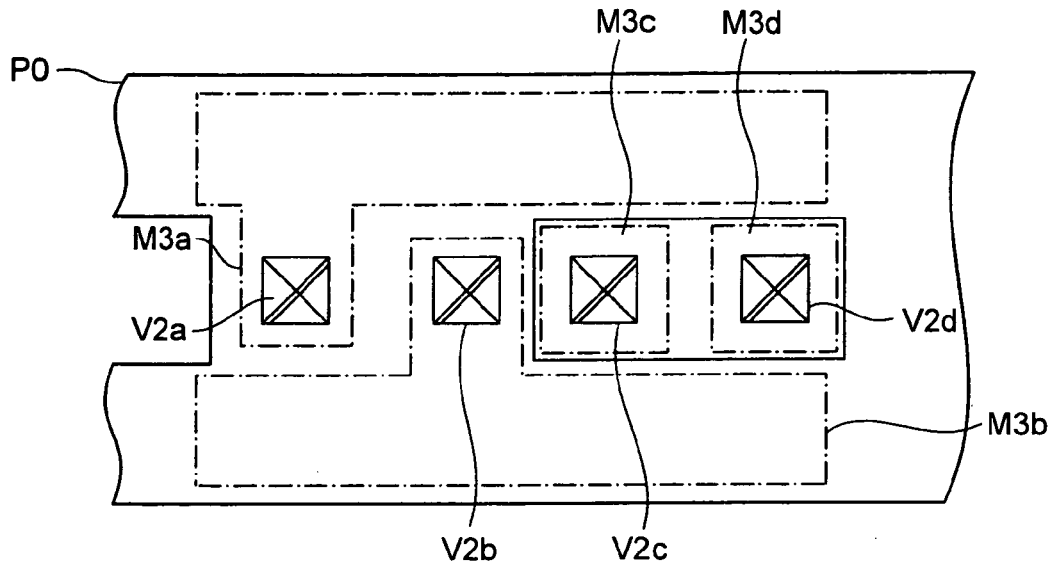
FIG. 35 is a diagram showing the layout drawing in FIG. 34 while classifying it on a per-layer basis.
Figure 35B:
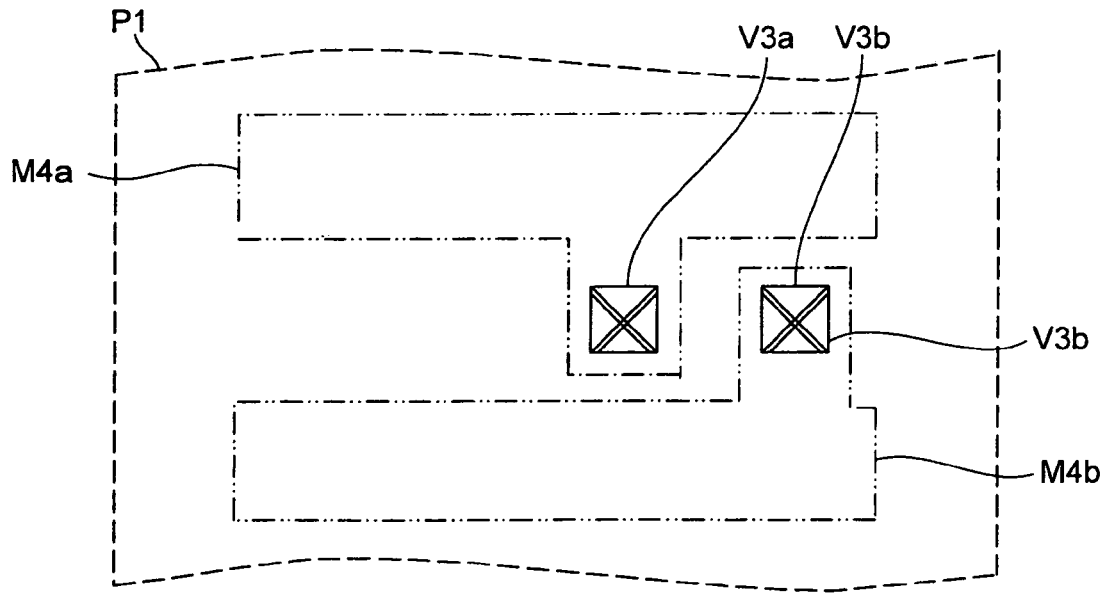
Figure 35B:
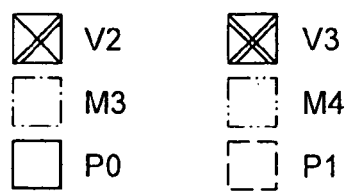

FIG. 35 shows the layout structure of FIG. 34 while dividing it into several layer groups in an easy-to-see way. FIG. 35(a) shows some major layers covering from the via holes V2 to the upper electrodes; FIG. 35(b) shows main layers of from the via holes V3 to the upper electrode P1. The layout of some layers underlying the wiring layer M2 are similar to that of FIG. 30 and thus are omitted herein.

In this structure, as shown in FIG. 35(a), the wiring line M2c thus fabricated is connected through the via hole V2a to the wiring line M3a that is the lower electrode of capacitor C0. Similarly the wiring line M2d is coupled through the via hole V2b to the wiring line M3b that is the lower electrode of capacitor C1. Next, the wiring line M2e is connected through via hole V2c to wiring line M3c. Further, the wiring line M2f is coupled through via hole V2d to wiring line M3d. Next as shown in FIG. 35(b), the wiring line M3c is connected through via hole V3a to the wiring line M4a that is the lower electrode of capacitor C2. Similarly the wiring line M3d is coupled through via hole V3b to the wiring line M4b that is the lower electrode of capacitor C3. In this way this structure is such that the capacitors C0-C1 and capacitors C2-C3 are laid out in a multiplex fashion. Moreover, since a respective one of the capacitor C0, C1 and capacitor C2, C3 can occupy the regions of two neighboring memory cells MC0-MC1, it is possible to reserve sufficiently enlarged effective capacitor areas.

Subsequently, in order to make the above-stated connection relationship more understandable, the cross-sectional structure of the memory cells in FIG. 34, 35 is shown in FIGS. 36-37. FIG. 36 shows sectional structures taken from respective directions a-a' and b-b' in FIG. 34. FIG. 37 shows sectional structures taken from respective directions c-c', d-d', e-e' and f-f' in FIG. 34.

Figure 36A:
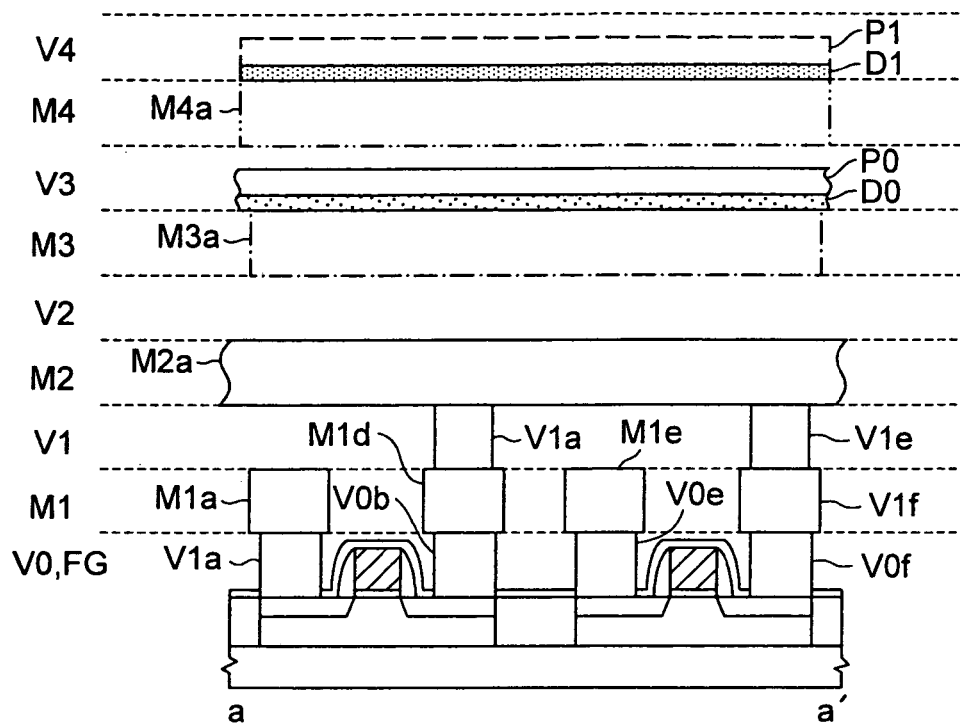
FIG. 36 is a sectional diagram of the memory cell in FIG. 34.
Figure 36B:
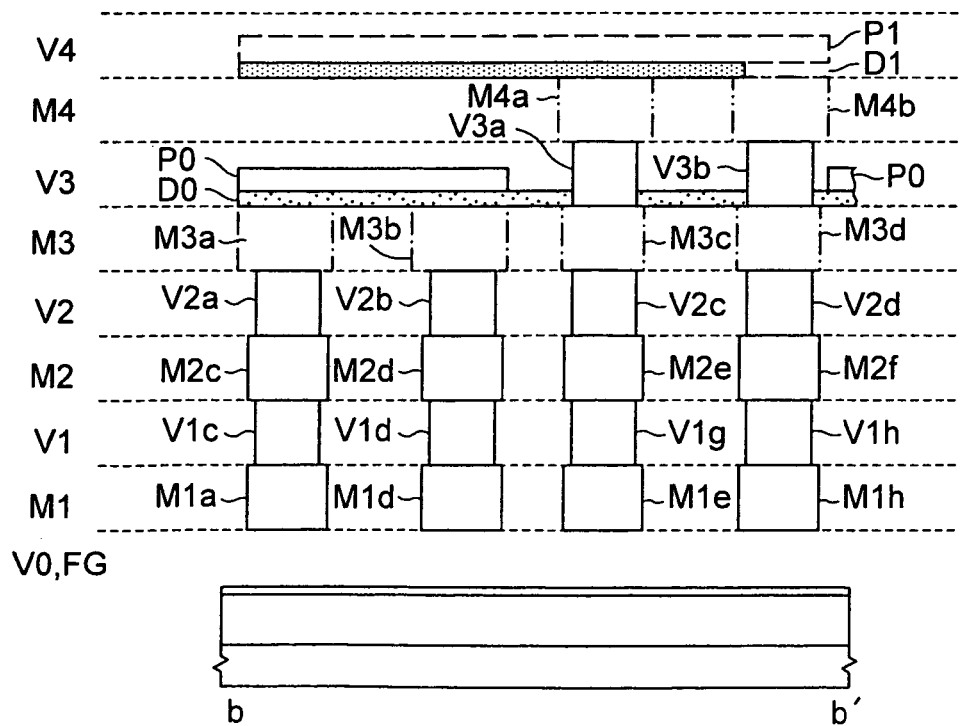

FIG. 36(a) shows a cross-section a-a', wherein the drain of TN1 is connected through a via hole V0b, wiring line M1b and via hole V1a to a wiring line M2a that is a bitline BL. Similarly the drain of TN3 is connected through a via hole V0f, wiring line M1f and via hole V1e to the wiring line M2a that is a bitline BL. The capacitor C0 and capacitor C2 are formed at mutually different layers above the bitline. Next, FIG. 36(b) shows a cross-section b-b', wherein a wiring line M1a drawn out of the source side of TN1 is connected through a via hole V1c, wiring line M2c and via hole V2a to the wiring line M3a that is the lower electrode of capacitor C0. On the other hand, a wiring line M1d extended from the source side of TN2 is coupled through a via hole V1d, wiring line M2d and via hole V2b to the wiring line M3b that is the lower electrode of capacitor C1.

Similarly a wiring line M1e drawn out of the source side of TN3 is connected through a via hole V1g, wiring line M2e, via hole V2c, wiring line M3c and via hole V3a to the wiring line M4a that is the lower electrode of capacitor C2. A wiring line M1h extended from the source side of TN4 is coupled through via hole V1h, wiring line M2f, via hole V2d, wiring line M3d and via hole V3b to the wiring line M4b that is the lower electrode of capacitor C3. Next, FIG. 37(a) shows a cross-section c-c', wherein the source of TN1 is connected to the wiring line M3a that is the lower electrode of capacitor C0 through a wiring line M1a extended from via hole V0a, a via hole V1c, wiring line M2c and via hole V2a. The drain side of TN2 is connected through via hole V0c, wiring line M1c and via hole V1b to the wiring line M2b that is a bitline /BL. Next, FIG. 37(b) shows a cross-section d-d', wherein the source of TN2 is connected to the wiring line M3a that is the lower electrode of capacitor C1 through a wiring line M1d drawn out of via hole V0d, a via hole V1d, wiring line M2d and via hole V2b. The drain side of TN1 is connected through via hole V0b, wiring line M1b and via hole V1a to the wiring line M2a that is a bitline BL. Next FIG. 37(c) shows a cross-section e-e', wherein the source of TN3 is connected to the wiring line M4a that is the lower electrode of capacitor C2 through a wiring line extended from via hole V0e, a via hole V1g, wiring line M2e, via hole V2c, wiring line M3c and via hole V3a. The drain side of TN4 is coupled through via hole V0g, wiring line M1g and via hole V1f to the wiring line M2b that is a bitline /BL. Lastly FIG. 37(d) shows a cross-section f-f', wherein the source of TN4 is connected to the wiring line M4b that is the lower electrode of capacitor C3 through a wiring line M1h drawn out of via hole V0h, a via hole V1h, wiring line M2f, via hole V2d, wiring line M3d and via hole V3b. The drain side of TN3 is coupled through via hole V0f, wiring line M1f and via hole V1e to the wiring line M2a that is a bitline BL.

As apparent from the above explanations of FIGS. 34 to 37, this implementation is such that the wiring layer M3 and the layer of via holes V3 are used to form the capacitors C0, C1 in the memory cell MC0. In this case, the upper part of its neighboring memory cell MC1 also is used to sufficiently enlarge the effective area of the capacitor C0, C1. Similarly the memory cell MC1 is such that the wiring layer M4 and the layer of via holes V4 are used to form the capacitor C2, C3 while utilizing the upper part of the neighboring memory cell MC0 to sufficiently enlarge the effective area of capacitor C2, C3. With such an arrangement, it is possible to retain a further increased cell capacitance, thus enabling achievement of low-voltage operations. It is also possible, by using two memory cell regions to dispose a plurality of capacitors in a multiplex fashion, to achieve a highly integrated memory without increasing the areas of memory cells. Obviously the capacitors may also be formed by using the memory cells neighboring in the bitline direction. Alternatively, it is also permissible to use those memory cells neighboring in the wordline direction to dispose and multiplex the capacitors. Still alternatively, this structure may be combined with the structure shown in FIG. 26 to thereby attain a further increased cell capacitance. From the foregoing, it is apparent that the memory cell layout method and capacitor fabrication method or the like of this invention are alterable in various ways without departing from the scope of the invention in a similar way to that of the embodiments stated supra.

Fifth Embodiment

Figure 38:
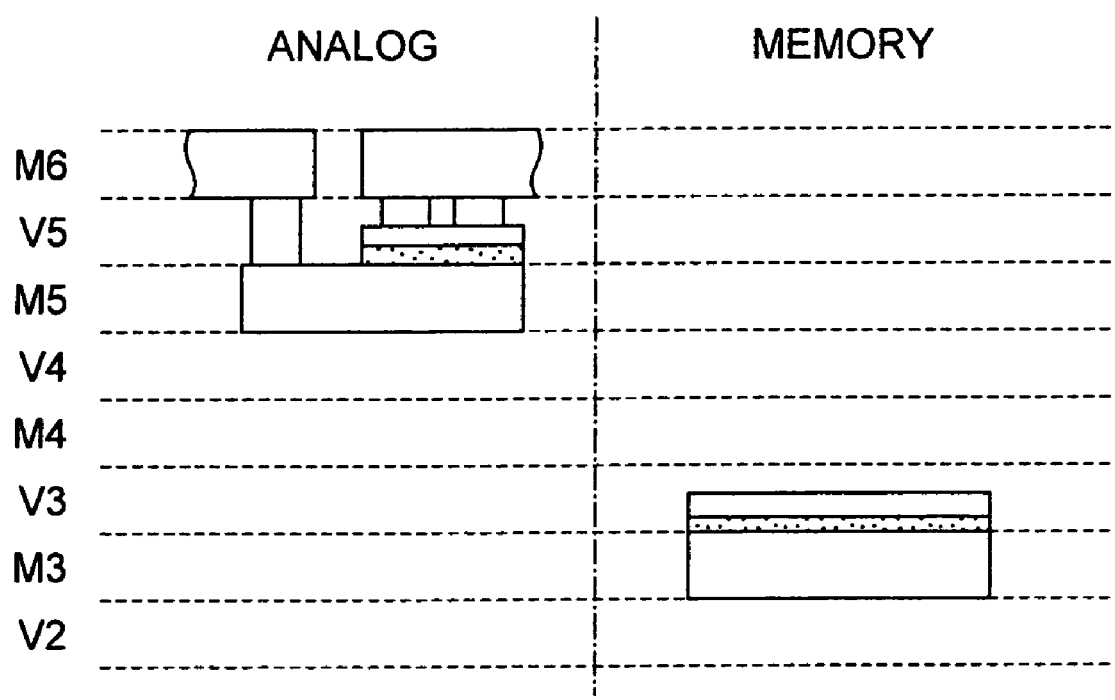
FIG. 38 is a modification of the sectional diagram of capacitors in an analog unit and a memory unit of FIG. 2.

Although in the aforementioned embodiment the explanation was directed to the case where MIM capacitors are formed in the same layer as shown in FIG. 2, the specifications required for the capacitors might become largely different depending upon end-use applications. For instance, a relatively large unit capacitance value is required for memory cells; however, in the analog, there is a case where higher priority is given to being less in voltage dependency rather than the capacitance value. In such case, it is also possible to change the film thickness of a dielectric film of a MIM capacitor in a way as will be explained in FIG. 38, when the need arises. More specifically, one approach is to make thinner the dielectric film of a capacitor for use in the memory unit MEM to thereby enlarge the unit capacitance value while increasing the film thickness of MIM capacitor for the purposes of suppressing the voltage dependency to a low level in the analog unit ANALOG. At this time, if dielectric films different in thickness are formed at the same layer—for example, the layer of via holes V3—then the manufacturing process becomes complicated. This would result in decreases in reliability and in production yield. In such case, MIM capacitors different in film thickness may be formed in different layers as shown in FIG. 38. Using this approach makes it possible to achieve the MIM capacitors that are the same in electrode material and structure but different in film thickness from each other without reducing the reliability and yield. For example, it is also possible to fabricate a capacitor for memory use in such a way as to form a thin dielectric film with a reduced film thickness and an upper electrode at the wiring layer M3 and the layer of via holes V3, and fabricate an analog-use capacitor in such a way as to form its lower electrode in the wiring layer M5 while forming a thick dielectric film with an increased film thickness and an upper electrode in the layer of via holes V5. The wiring layer for formation of the memory cell capacitor electrode is provided between the wiring layer in which the analog-use capacitor electrode is formed and the semiconductor substrate surface because the analog circuit is often required to lessen the capacitor's capacitance relative to the substrate. Although the logic unit is not shown in the drawing, the wiring lines within logic circuits make use of the wiring layer used to form the lower electrodes of those capacitors within at least analog circuitry and memory cells.

Sixth Embodiment

In the embodiments above, certain cases have been explained where 2T1C cells or 2T2C cells are used to realize a memory. As previously stated, according to the present invention, capacitors with the MIM structure are disposed above transistors while specifically designing connection between diffusion layers and the capacitors, thereby enabling shrink of the cell area while using two transistors. However, some applications require an on-chip memory to have a further increased storage capacity. If this is the case, it is also possible to employ the structure of the previous embodiment for 1T1C cells to thereby realize a highly integrated memory. Even in such case, it is possible to reduce process costs since the overhead with respect to a logic process decreases owing to the use of a wiring line of logic part as one electrode while using the MIM structure for a capacitor in a similar way to the embodiments stated supra. It is also possible to use a capacitor of similar structure as that of an analog circuit so that this is also suitable for the case of mounting the analog circuit. Note however that 1T1C cells are inherently less in signal amount than 2T cells as stated previously. Due to this, a need is sometimes felt to set the supply voltage at a higher level. This is undesirable in some cases because an increase in voltage serves as a disadvantage in terms of power consumption. In such case, 2T cells and 1T1C cells are combined together to thereby enable achievement of a highly integrated memory with low power consumption as in an embodiment described below.

A practical embodiment will be explained by using FIGS. 39 to 41. One feature of this embodiment is to add as a cache a memory with small storage capacity made up of 2T1C cells or 2T2C cells. Two types of memories are formed on a single semiconductor chip. Thus it is possible to realize enhanced performance and low power consumption comparable to those of 2T cells operable with lower voltages while at the same time achieving higher integration almost equivalent to 1T1C cells.

Figure 39:
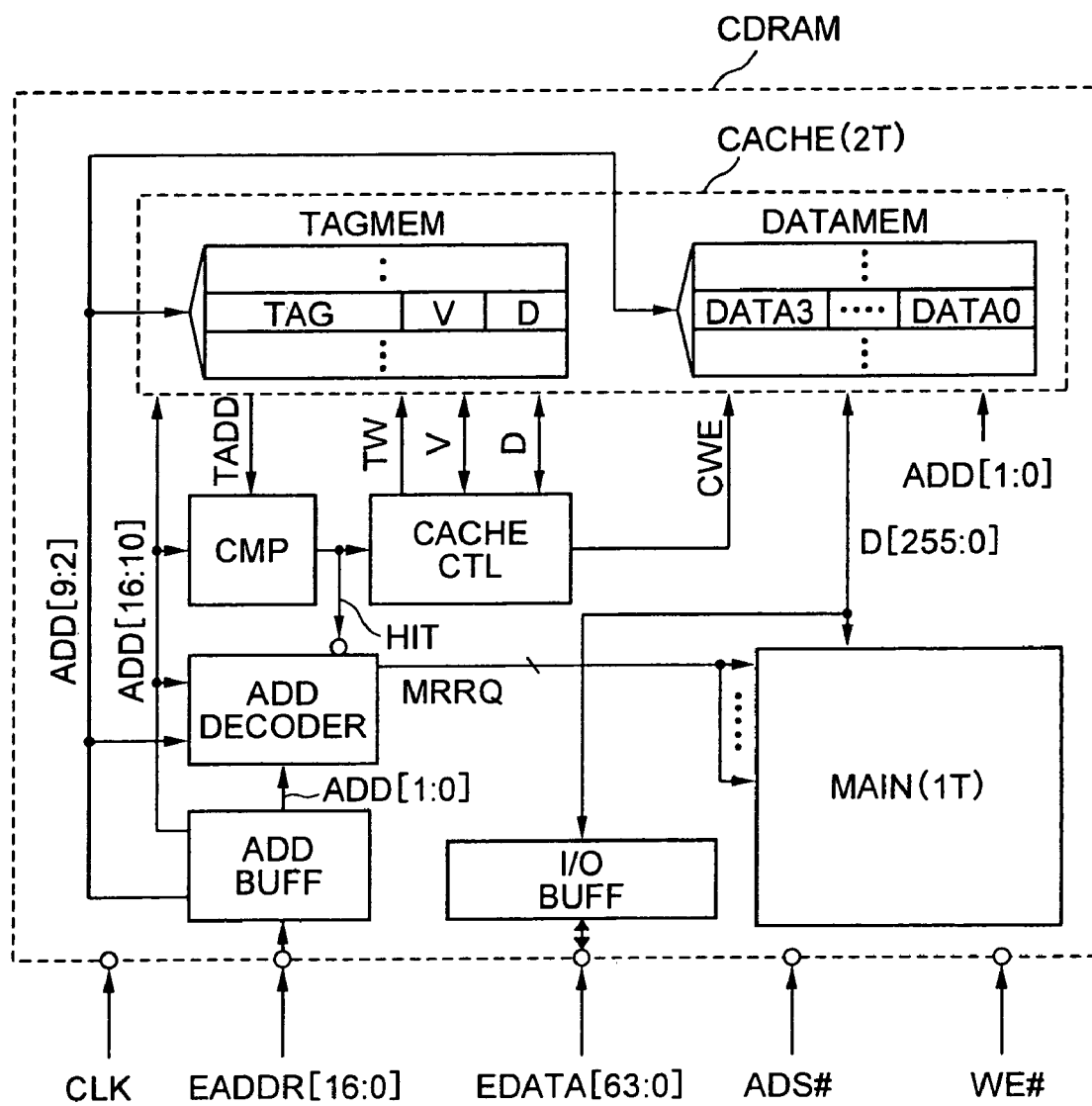
FIG. 39 is a sixth embodiment showing a semiconductor memory device constituted from memory cells different in structure.

In FIG. 39, a cache dynamic memory CDRAM (simply called the CDRAM hereinafter) is arranged so that a cache memory CACHE uses 2T cells and is driven to operate with a low voltage of 0.9V, for example. Additionally 1T1C cells are used for a main memory MAIN. At this time, although higher integration is achievable without a cost increase when designing the capacitors of 1T1C cells by using MIM capacitors in a similar way to 2T cells, it is obvious that if permitted in terms of the cell area then it is permissible to utilize the cells using MOS capacitors, known as planar 1T1C cells; alternatively, 3D cells may be used if allowable in terms of process costs. The main memory MAIN is designed to operate with a voltage required for its operation—for example, 1.5V. While depending upon end-use applications, most cache memories are such that a small storage capacity of several tens of kilobytes is deemed enough to realize the hit rate of about 90%. Due to this, when designing the cache memory CACHE to offer low-voltage operability as in this embodiment, it becomes possible to lower the power consumption of the memory as a whole. Apparently the effect of speed improvements is expectable in this embodiment also in view of the fact that the speed of a small-capacity cache becomes dominant in terms of the speed performance also, in a similar way to general-use caches. In contrast, the main memory which occupies most part of the capacity is comprised of 1T1C cells which are small in area; thus, it is possible to lessen the overall area. In other words, it is possible to mount a memory of the same area with a larger storage capacity. Consequently according to this invention, it is possible to achieve the memory having the features of both types of cells.

A control method of CDRAM will next be explained using an embodiment shown in FIG. 39. The cache memory CACHE is comprised of a tag memory TAGMEM and a data memory DATAMEM. The tag memory TAGMEM is made up of a plurality of tag addresses for storage of upper addresses ADD[16:10], a plurality of valid bits V which indicate whether the data corresponding to a stored tag address TAG is valid or invalid, and a plurality of dirty bits D indicating that the corresponding data was rewritten. The data memory DATAMEM has a plurality of blocks corresponding to the tag addresses TAG, wherein each block has a plurality of line data DATA3 to DATA0.

Externally input to CDRAM are a clock CLK, external address EADDR[16:0], external data EDATA[63:0], address strobe signal ADS# and write enable signal WE#. The external address EADDR[16:0] thus input is then input to an address buffer ADD BUFF. Here, a mid-level address ADD [9:2] is an entry, which is used to select a cache line to be accessed in the cache memory CACHE. An address that was stored at the tag address TAG of the selected cache line is sent through a tag address bus TADD and then input to a comparator CMP. The comparator CMP compares an up-level address ADD[16:10] with the tag address TAG and asserts a hit signal HIT when the both addresses are the same. While valid bit V is valid and when a cache controller CACHECTL detects a cache-hit, it asserts a cache write enable signal CWE and then reads desired data out of the data memory DATAMEM, which data is transferred to a data request master through an input/output buffer I/O BUFF. At the time of writing, write the externally input data into the data memory DATAMEM. Alternatively at the time of a cache failure, negate the hit signal HIT, causing one MRQ of memory request buses to be asserted by an address decoder ADDDEC. This results in desired data being read out of the main memory MAIN during reading or alternatively desired data being written into the main memory MAIN during writing.

The control of CDRAM is done in the way stated above. Note that 2T1C cells and 2T2C cells are dynamic type memories so that the cache memory CACHE is required to perform refresh operations. Accordingly access from the outside is delayed by such refresh operations of the cache memory CACHE, causing the latency of CDRAM to become larger virtually, resulting in the usability becoming worse. In such case, it is also possible to preset the latency of cache memory CACHE at larger values. Additionally in case a failure occurs in access to the cache memory CACHE, an attempt is made to provide access to the main memory MAIN, which sometimes results in the latency being different between hit and failure events. In this case also, it is apparent that CDRAM is controlled so that the latency is kept constant without regard to hit failures in a similar way to the above-noted case.

FIGS. 40 and 41 show the arrangement of a memory cell MC used in the main memory MAIN of FIG. 39. The memory cell is a 1T1C cell using a MIM capacitor. FIG. 40(a) is a circuit diagram, FIG. 40(b), (c), (d), (e) shows a layout, and FIG. 41 is a cross-sectional diagram showing a fabrication method of the 1T1C cell of FIG. 40.

In FIG. 40(a), the 1T1C cell is comprised of a TN1 and a capacitor C0, and connected to a sub-word line SWL and bit lines BL and /BL. SN1 is a storage node; VPLT is a plate electrode. Additionally, operation waveforms are such that well-known ordinary schemes such as VDD/2 scheme or the like are applicable, a detailed explanation of which is omitted herein.

Next, an explanation will be given of a structure which uses a MIM capacitor to realize the memory cell of FIG. 40(a) while increasing the integration density at low costs. In FIG. 40(b), the source of TN1 is connected to a wiring line M3a that is the lower electrode of capacitor C0 through a via hole V0b, wiring line M1b, via hole V1b, wiring line M2c and via hole V2a. Its drain is connected through a via hole V0a, wiring line M1a and via hole V1a to a wiring line M2a that is a bitline BL. An upper electrode corresponding to the plate PLT is formed by a P0 layer as an electrode for common use.

FIGS. 40(c) to (e) show the layout structure of FIG. 40(b) while dividing it into several layer groups in an easy-to-see way, wherein (c) shows some major layers underlying the via holes V0, (d) shows main layers covering from a wiring layer M1 to wiring layer M2, and (e) shows some layers overlying the via holes V2.

As shown in FIG. 40(c), the via hole V0a is formed on the drain side of TN1 while forming the via hole V0b on the source side. In addition, as shown in FIG. 40(b), the wiring line M1b is formed to span from upper part of the via hole V0b to a mid part between the bitlines BL and /BL, and is connected to the wiring line M2c through via hole V1b. On the other hand, the wiring line M1a and via hole V1a are formed on the drain-side via hole V0a and are connected to the wiring line M2a that is a bitline BL. The wiring line M2b indicates a bitline /BL. Furthermore, as shown in FIG. 40(c), the wiring line M2c thus fabricated is connected through the via hole V2a to the wiring line M3a that is the lower electrode of capacitor C0. In this way, this embodiment is arranged to use the MIM capacitor to make up a 1T1C cell. As the capacitor is formed above bitlines and diffusion layers, it is possible to lessen the memory cell area. In addition, since the capacitor is of a planar structure and uses a wiring layer as its one electrode, it is possible to reduce process costs. Additionally the upper electrode P0 is sharable with another memory cell(s) whereby the memory cell becomes simplified in structure so that there is a merit of easy-to-make.

Subsequently, in order to make the above-stated connection relationship more understandable, the cross-sectional structure of the memory cell in FIG. 40 is shown in FIG. 41. FIG. 41 shows sectional structures taken from respective directions a-a', b-b' and c-c' in FIG. 40(b).

FIG. 41(a) shows a cross-section a-a', wherein a wiring line M1b which was drawn out of the source side of TN1 is connected through via hole V1b, wiring line M2c and via hole V2a to the M3a that is the lower electrode of capacitor C0. FIG. 41(b) shows a cross-section b-b', wherein the drain of TN1 is connected through via hole V0a, wiring line M1a and via hole V1a to the wiring line M2a that is a bitline BL. Lastly FIG. 41(c) shows a cross-section c-c', wherein the source of TN1 is coupled to the wiring line M3a that is the lower electrode of capacitor C0 through the wiring line M1b extended from via hole V0b, via hole V1b, wiring line M2c and via hole V2a.

According to the above-stated embodiment of FIGS. 39 to 41, a MIM capacitor is used to form the 1T1C cell. Using the 1T1C cell for the main memory MAIN makes it possible to highly integrate the CDRAM. It is also possible to lower the power consumption of CDRAM by using 2T cells to make up the cache memory CACHE and driving it to perform a low-voltage operation. In short, combining 1T cells and 2T cells makes it possible to achieve a memory having low power consumption and high integration features.

Although in this embodiment a direct mapping technique was explained as the cache memory CACHE control method, this invention is not limited thereto and is modifiable in various ways without departing from the scope and spirit thereof. For example, the cache memory CACHE control method is alterable to use other techniques including, but not limited to, a set associative scheme and full associative scheme. The write method may be designed to use any one of a write-back scheme, write-through schemes, write-allocate scheme, and no-write allocate scheme. For data replacement of the cache memory CACHE, this is achievable by using currently available LRU (Least Recently Used) algorithms. Obviously, the capacity and way number of the cache memory CACHE and the capacity of main memory MAIN are also modifiable in a variety of ways. Additionally as stated previously, it is possible to reduce process costs since the MIM capacitor for use in a 1T1C cell is formable by the same layer as that of the capacitor of a 2T cell while enabling commonization of the step of forming the wiring lines of the analog unit ANALOG and logic unit LOGIC and the step of forming capacitors in a similar way to the embodiment of 2T cells. It is also obvious that various alterations are possible as in the embodiments stated supra, concerning the techniques for taking contacts out of capacitor electrodes, multiplexing MIM capacitors, changing the film thickness of dielectric films, and forming MIM capacitors for the analog unit ANALOG and those for the memory unit MEM in different layers.

As apparent from the foregoing, main effects of this invention are as follows. First, it is possible to realize a memory utilizing capacitors at low costs, by forming memory cells using MIM capacitors with one electrode structured from a wiring layer. Second, by forming capacitors by use of high-dielectric-constant material to provide a COB structure with the capacitors disposed above bitlines, it is possible to reduce the cell area to thereby enable achievement of a high integrated memory. Third, since the use of 2T1C or 2T2C cells makes it possible to retain a large amount of read signal, it is possible to achieve a memory with low-voltage operability. Fourth, using 2T cells and 1T cells in combination makes it possible to achieve a highly integrated memory of low power consumption. Fifth, commonizing the process steps of forming MIM capacitors in the logic, analog, memory and others makes it possible to realize a semiconductor integrated circuit with high reliability at low costs.

INDUSTRIAL APPLICABILITY

The present invention is applicable to an information processing apparatus, in particular, to computer equipment typically including personal computer devices. This information processing apparatus may be the one having the general-purpose usability or alternatively the one as built therein as part of a control device.

What is claimed is:

1. A semiconductor integrated circuit device comprising:
a semiconductor substrate having a main surface;
a memory cell of a random access memory (DRAM) arranged at a first region on the main surface and including a first MISFET and a first capacitor element such that the first capacitor element is electrically connected to a source-drain path of the first MISFET,
wherein the first MISFET includes a source region and a drain region each formed in the semiconductor substrate, a gate electrode, a gate insulating film formed on the semiconductor substrate and silicide layers formed on the source region, the drain region and the gate electrode;
a logic circuit arranged at a second region of the main surface including a second MISFET,
wherein the second MISFET includes a source region and a drain region each formed in the semiconductor substrate, a gate electrode, a gate insulating film formed on the semiconductor substrate and silicide layers formed on the source region, the drain region and the gate electrode;
a first insulating film formed over the first MISFET and the second MISFET,
a lower electrode of the first capacitor element formed on the first insulating,
a dielectric insulating film of the first capacitor element formed on the lower electrode of the first capacitor element,
a higher electrode of the first capacitor element formed on the dielectric insulating file of the first capacitor element;
a second insulating film formed over the first capacitor element and the first insulating film; and
a second capacitor element formed over the second insulating film,
a lower electrode of the second capacitor element formed on the same level layer a wiring layer,
a dielectric insulating film of the second capacitor element formed on the lower electrode of the second capacitor element,
a higher electrode of the second capacitor element formed on the dielectric insulating film of the second capacitor element, and
a third insulating film formed over the second capacitor element and the second insulating film,
wherein the third insulating film having a via hole for connecting the wiring layer.

2. A semiconductor integrated circuit device according to claim 1, wherein a thickness of the dielectric insulating film of the second capacitor element is greater than a thickness of the dielectric insulating film of a third capacitor element.

3. A semiconductor integrated circuit device according to claim 1, wherein the wiring layer is comprised of a copper wiring layer.

4. A semiconductor integrated circuit device according to claim 1, wherein the second capacitor element is comprised of a MIS capacitor.

5. A semiconductor integrated circuit device according to claim 1, wherein the first capacitor element is comprised of a MIS capacitor.

6. A semiconductor integrated circuit device according to claim 1, wherein the logic circuit constitutes a processor.

7. A semiconductor integrated circuit device according to claim 1, wherein an analog circuit includes the second capacitor element.

* * * * *